US012740335B2

(12) United States Patent
Hsieh et al.

(10) Patent No.: US 12,740,335 B2
(45) Date of Patent: Sep. 15, 2026

(54) PHASE CHANGE MATERIAL SWITCH WITH REDUCED INSERTION LOSS AND METHODS FOR FORMING THE SAME

(71) Applicant: Taiwan Semiconductor Manufacturing Company Limited, Hsinchu (TW)

(72) Inventors: Wei Ting Hsieh, Hsinchu (TW); Kuo-Ching Huang, Hsinchu City (TW); Yu-Wei Ting, Taipei City (TW); Chien Hung Liu, Hsinchu (TW); Kuo-Pin Chang, Zhubei city (TW); Hung-Ju Li, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 635 days.

(21) Appl. No.: 18/321,081

(22) Filed: May 22, 2023

(65) Prior Publication Data

US 2024/0397837 A1 Nov. 28, 2024

(51) Int. Cl.

| | |
|---|---|
| ***H10N 70/20*** | (2023.01) |
| ***H03K 17/51*** | (2006.01) |
| ***H10N 70/00*** | (2023.01) |
| ***H10N 79/00*** | (2026.01) |

(52) U.S. Cl.

CPC ........... *H10N 70/235* (2023.02); *H03K 17/51* (2013.01); *H10N 70/063* (2023.02); *H10N 70/823* (2023.02); *H10N 70/861* (2023.02); *H10N 79/00* (2023.02)

(58) Field of Classification Search

CPC ............... H10N 70/235; H10N 70/063; H10N 70/8413; H10N 70/8613

See application file for complete search history.

(56) References Cited

U.S. PATENT DOCUMENTS

| | | | | |
|---|---|---|---|---|
| 9,368,720 | B1 * | 6/2016 | Moon | H10N 70/8828 |
| 2016/0079019 | A1 * | 3/2016 | Borodulin | H10N 70/231<br>337/396 |
| 2020/0058848 | A1 * | 2/2020 | El-Hinnawy | H10N 70/8613 |
| 2020/0058854 | A1 * | 2/2020 | Rose | H10N 70/231 |
| 2021/0135100 | A1 * | 5/2021 | Slovin | H10N 70/861 |

* cited by examiner

*Primary Examiner* — Mounir S Amer

(74) *Attorney, Agent, or Firm* — The Marbury Law Group, PLLC

(57) ABSTRACT

An embodiment phase change material switch may include a first phase change material element, a second phase change material element, a first conductor electrically connected to a first end of each of the first phase change material element and the second phase change material element such that the first conductor is configured as a first terminal of an electrical circuit having a parallel configuration, a second conductor electrically connected to a second end of each of the first phase change material element and the second phase change material element such that the second conductor is configured as a second terminal of the electrical circuit having the parallel configuration, and a heating device coupled to the first phase change material element and to the second phase change material element and configured to supply a heat pulse to the first phase change material element and to the second phase change material element.

20 Claims, 44 Drawing Sheets

400c
318
304b
320
320
310
314
316
306
320
320
312
304a

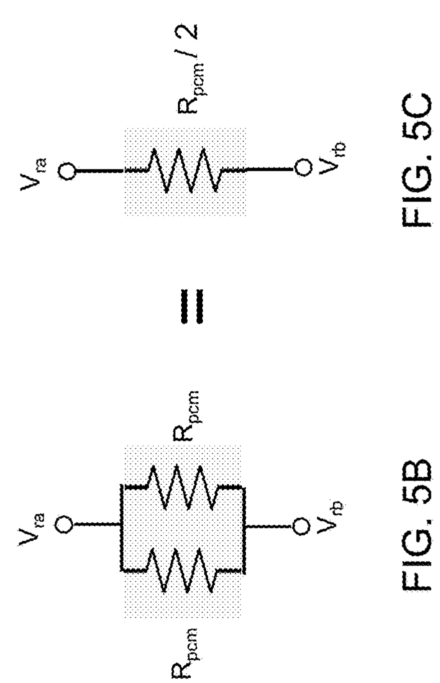
FIG. 5B
FIG. 5C
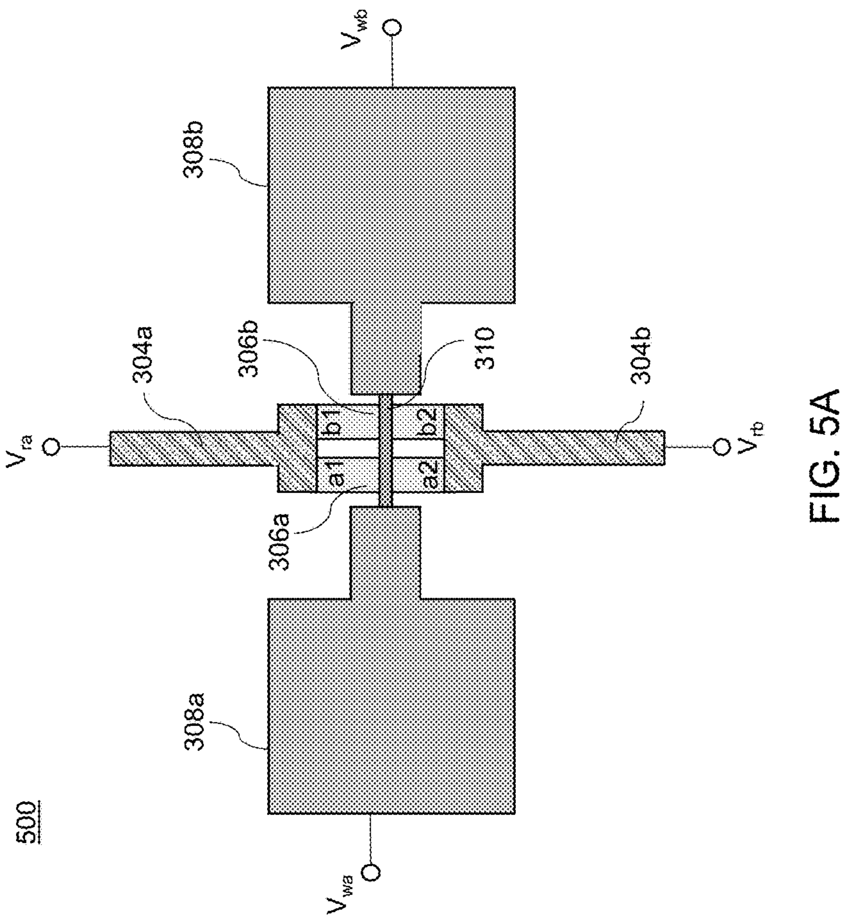
FIG. 5A

=

=

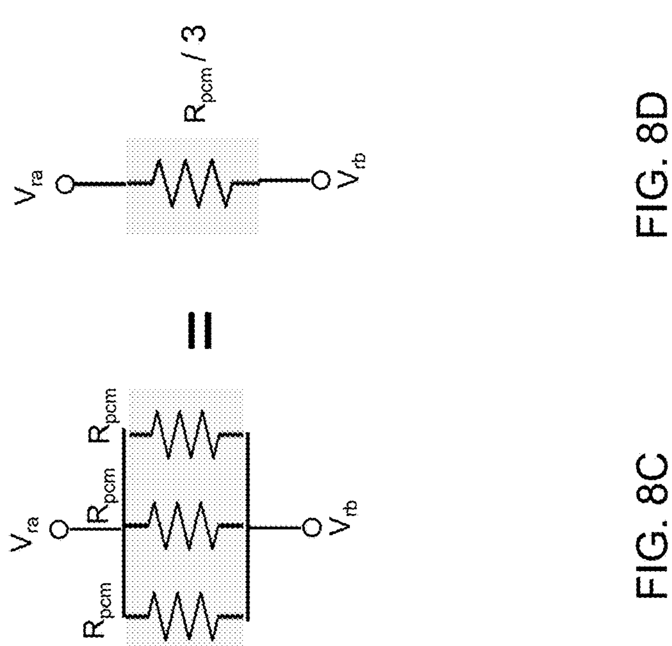
FIG. 8D
FIG. 8C
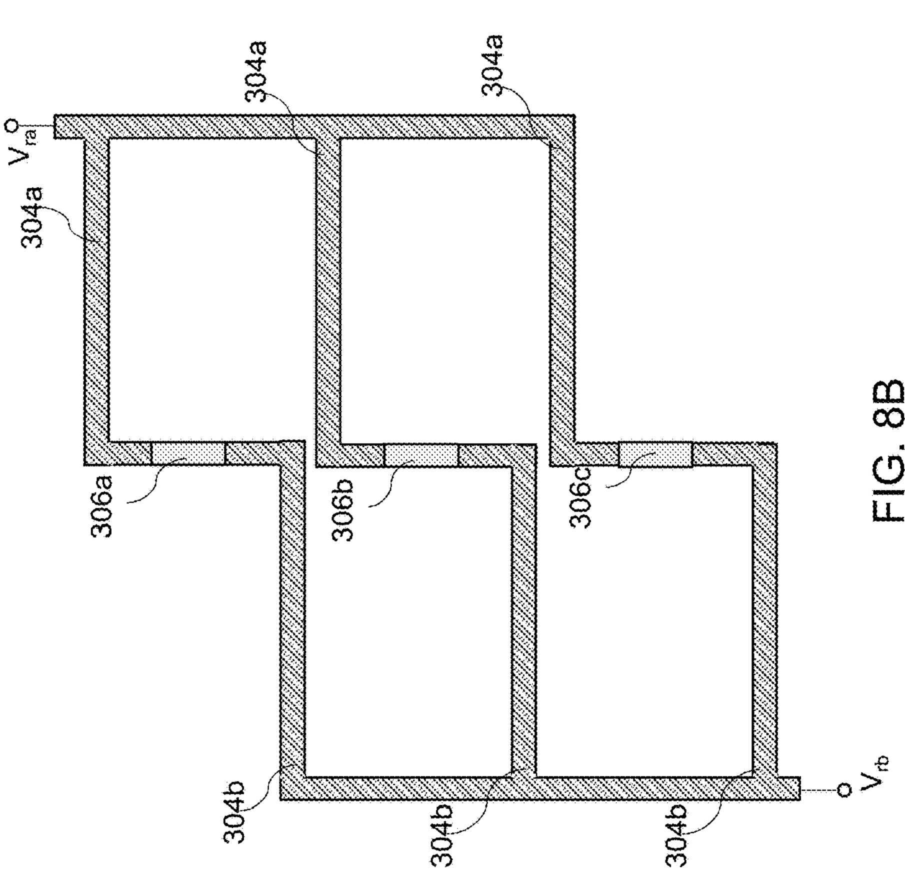
FIG. 8B

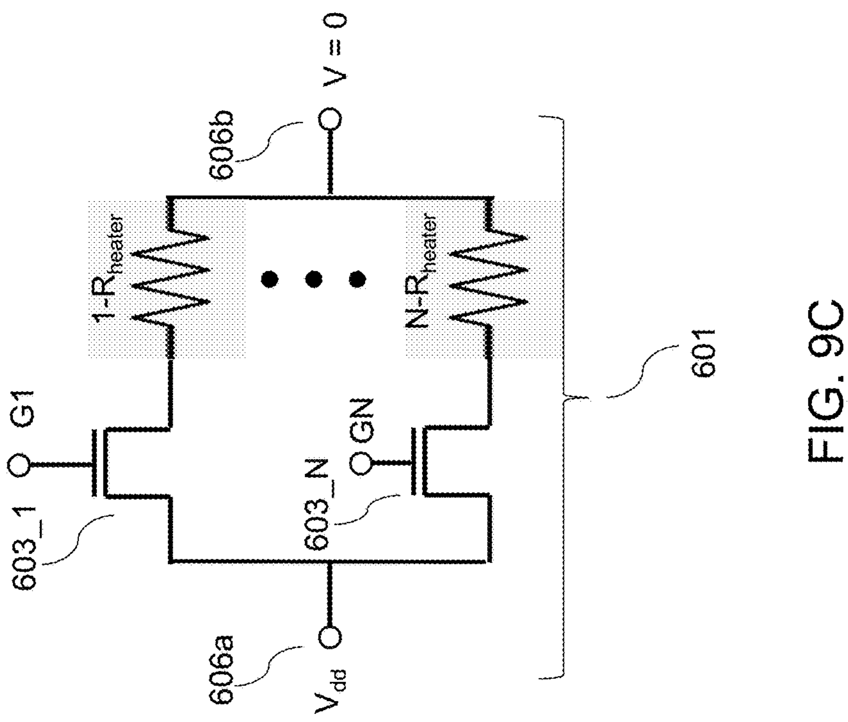
FIG. 9C
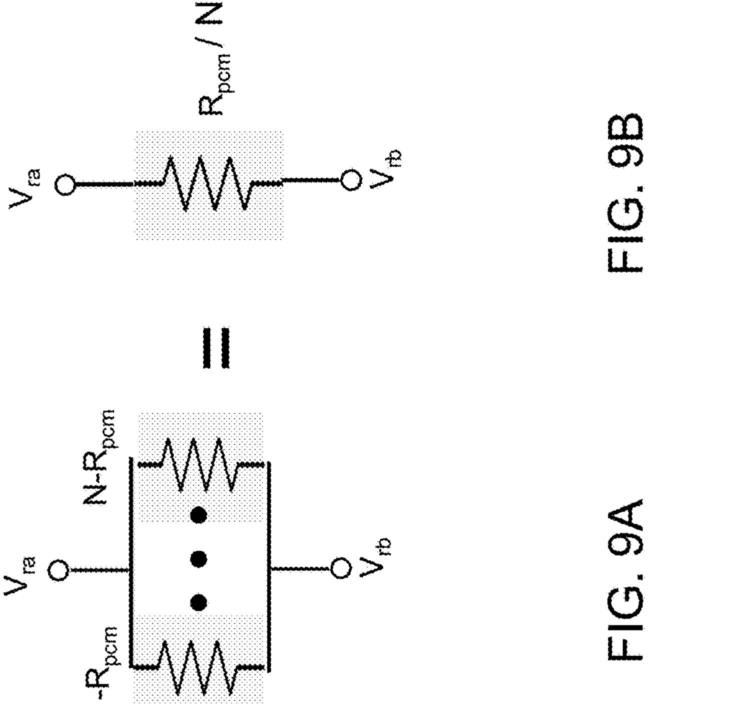
FIG. 9A
FIG. 9B

L2
L1
L0
8
50
52
75
12
10
18
15
14
32
31B
31A
26
28
24
22
20
42L
42V
41L
41V

L3
95
33

602
604
312
hd1 hd2
hd1
604
312

1700
1202a
1202b
602
1102
310
306
316
314
312
hd1

1700
1202a
1202b
hd2
hd1

602
314L
312
hd1

2600

2700

PHASE CHANGE MATERIAL SWITCH WITH REDUCED INSERTION LOSS AND METHODS FOR FORMING THE SAME

BACKGROUND

Electronic devices may utilize switches to route a signal along a transmission path. For example, a communication device (e.g., cell phone) may include many antenna elements and multiple radio streams to ensure high data rate wireless communications, whether through cellular or mobile connectivity networks and peripheral devices. The communication device may utilize radio frequency (RF) switches to route an RF signal along a transmission path that may include multiple RF components such as amplifiers, filters, etc. Phase change material (PCM) switches may be used for various applications such as radio-frequency (RF) applications. Advantages of PCM switches include their immunity to interference by electromagnetic radiation, relatively fast switching times, and ability to maintain their switching state (i.e., "On" or "Off") without consuming electrical power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a top view of a PCM switch having a parallel circuit configuration, according to various embodiments.

FIG. 5B is a schematic circuit diagram illustrating the parallel circuit configuration of the PCM switch of FIG. 5A, according to various embodiments.

FIG. 5C is a schematic circuit diagram illustrating an equivalent circuit for the PCM switch of FIG. 5A, according to various embodiments.

FIG. 8B is a top view of the parallel circuit portion of the PCM switch of FIG. 8A, according to various embodiments.

FIG. 8C is a schematic circuit diagram illustrating the parallel circuit configuration of the PCM switch of FIG. 8A, according to various embodiments.

FIG. 8D is a schematic circuit diagram illustrating an equivalent circuit for the PCM switch of FIG. 8A, according to various embodiments.

FIG. 9A is a schematic circuit diagram illustrating a parallel circuit configuration of a further PCM switch, according to various embodiments.

FIG. 9B is a schematic circuit diagram illustrating an equivalent circuit for the PCM switch of FIG. 9A, according to various embodiments.

FIG. 9C is a schematic circuit diagram for a heater device portion of the PCM switch of FIG. 8A, according to various embodiments.

DETAILED DESCRIPTION

Figure 1:
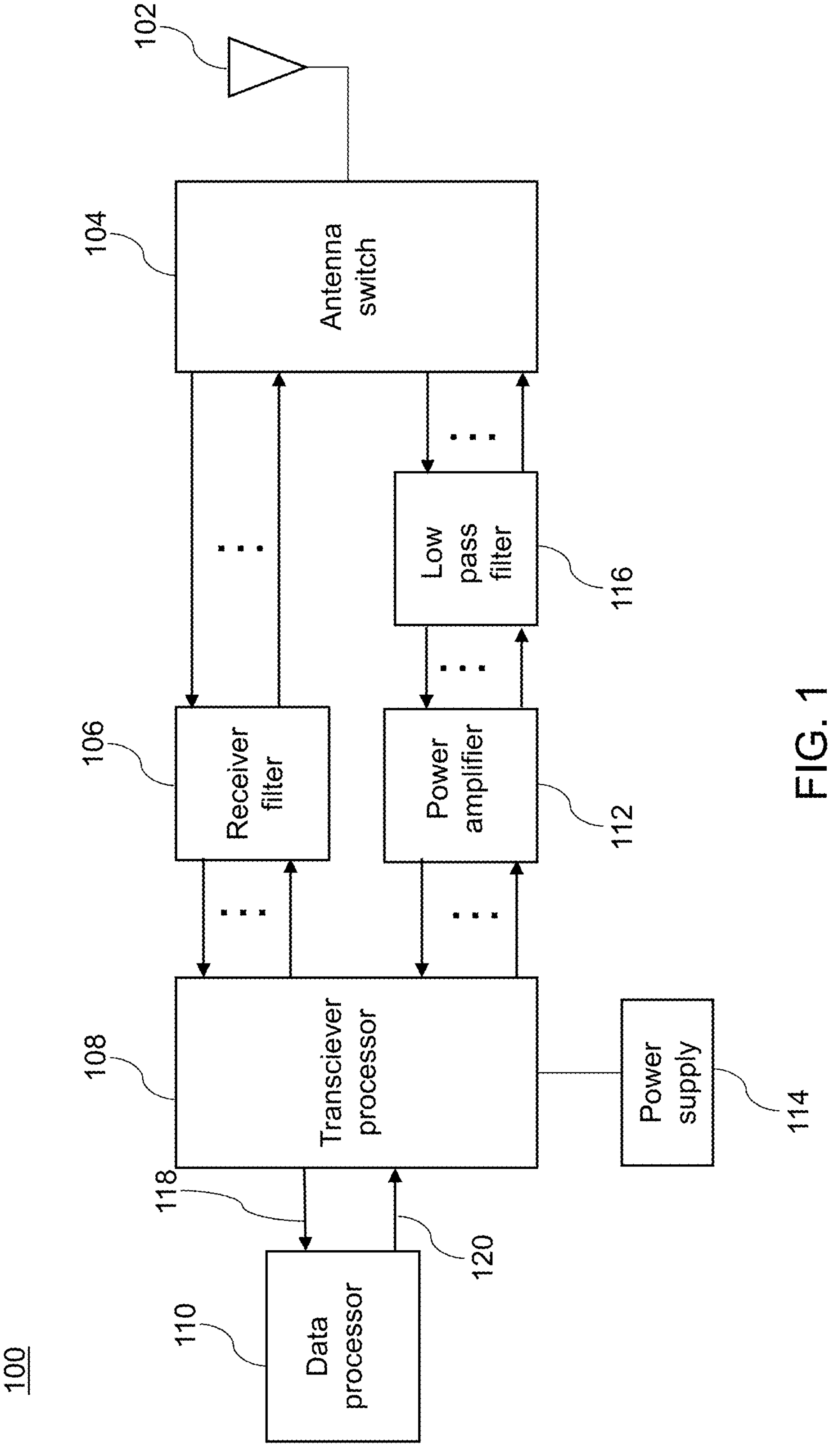
FIG. 1 is a block diagram of an RF transceiver system, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element and are presumed to have the same material composition and the same thickness range unless expressly indicated otherwise.

Various embodiment structures and methods are disclosed herein that may be used to form a phase change material (PCM) switch. Various embodiment PCM switches may be used to provide a switching function for various semiconductor devices such as radio-frequency semiconductor devices, varactors (e.g., variable capacitance capacitors), inductors, or other semiconductor devices. As used herein, a "phase change material" refers to a material having at least two distinct phases providing different resistivity. The distinct phases may include an amorphous state having relatively high resistivity and a crystalline state having relatively low resistivity (i.e., a lower resistivity than in the amorphous state). The transition between the amorphous state and the crystalline state may be induced by controlling a time-versus-temperature thermal profile within the phase change material. For example, a PCM switch may include a resistive heating element thermally coupled to the phase change material and configured to selectively heat the phase change material via the application of current pulses through the resistive heating element.

To induce a transition of the phase change material from a low-resistivity crystalline state to a high-resistivity amorphous state, the current pulse through the resistive heating element may have a relatively short pulse width with a short falling time that is configured to quickly heat the phase change material to a temperature above its melting temperature ($T_{melt}$), causing the material to transition from an ordered crystalline low-resistivity phase to a disordered amorphous high-resistivity phase. The short falling time of the pulse may promote rapid quenching and may inhibit recrystallization of the material as it cools.

To induce a transition of the phase change material from a high-resistivity amorphous state to a low-resistivity crystalline state, the current pulse through the resistive heating element may have a relatively longer pulse width with a longer pulse falling time that is configured to heat the phase change material to a temperature above its crystallization temperature ($T_{crys}$), but below its melting temperature ($T_{melt}$), over a time period sufficient to induce crystal nucleation in the material. The comparatively longer falling time of the current pulse may promote crystal growth as the phase change material cools at a relatively slower rate.

A PCM switch may include a phase change material disposed within a signal transmission pathway between a pair of electrodes. The resistive heating element may extend across the phase change material in a direction transverse to the signal transmission pathway, and a layer of electrically-insulating and thermally-conductive material may be disposed between the resistive heating element and the phase change material. While the phase change material is in a low-resistivity crystalline state, the PCM switch may be in an "On" state (i.e., the switch is closed) such that signals may be transmitted across the phase change material between the pair of electrodes. However, when a portion of the phase change material along the signal transmission pathway is in a high-resistivity amorphous state, the PCM switch may be in an "Off" state (i.e., the switch is open) such that signal transmission between the pair of electrodes is blocked. The PCM switch may be switched (i.e., programmed) between the "On" state and the "Off" state by the selective application of current pulses to the resistive heating element having different pulse widths and falling times as described above. The portion of the phase change material that is switched between a low-resistivity crystalline state and a high-resistivity amorphous state may be referred to as the active region of the phase change material.

Radio-frequency switches are commonly found in, among other things, wireless communication devices. Such switches may be configured to facilitate coupling various circuits of a wireless communication device to an antenna. For example, it may be desirable to couple a first set of circuits to the antenna when receiving information through the antenna and to couple a second set of circuits to the antenna when transmitting information. As another example, it may be desirable to couple a first set of circuits to the antenna when communicating via a first communication scheme and to couple a second set of circuits to the antenna when communicating via a second communication scheme.

For a switch used in radio-frequency (RF) applications, relevant factors for evaluating switch performance may include insertion loss, isolation, and power handling. In general, low insertion loss and high isolation are desirable characteristics for RF switches. For PCM switches, insertion loss may be related to the resistivity $R_{ON}$ across the phase change material when the switch is in the "On" state, while high isolation is inversely related to the capacitance $C_{OFF}$ of the switch while in the "Off" state. A figure of merit (FOM) that may be used to characterize performance of a PCM switch may be chosen to have a value that is inversely proportional to the product $R_{ON}*C_{OFF}$. For example, one FOM that may be used to characterize switch performance may be taken to be $\sim 1/(2\pi R_{ON}*C_{OFF})$. This FOM has frequency units and may be related to a maximum frequency at which the PCM material may be switched from an "On" state to an "Off" state. In general, increasing the value the FOM may be associated with improved switch performance. Thus, switch performance may be improved by reducing the $R_{ON}$ characteristics, reducing the $C_{OFF}$ characteristics, or both, in a PCM switch. The switching time of a PCM switch may also depend on a rate at which thermal energy may be diffused away from the PCM switch.

Various disclosed embodiments include PCM switches that may provide improved thermal confinement within the phase change material layer and improved thermal diffusion. In various embodiments, a thermally-conductive dielectric capping layer (e.g., including a high-k dielectric material) located between a heater pad and the phase change material layer of the PCM switch may be laterally-confined such that opposing sides of the dielectric capping layer and opposing sides of the underlying heater pad may form continuous surfaces extending transversely to the signal transmission pathway across the phase change material between the pair of electrodes.

The heat transfer from the heater pad through the dielectric capping layer to the phase change material layer may be predominantly along a vertically upwards direction, such that heating of the phase change material layer may be nearly exclusively confined to a region of the phase change material layer located directly above the heater pad, with minimal thermal dissipation along a lateral direction. This localized heating of the phase change material may improve the efficiency of the PCM switch by enabling the use of lower bias voltages across the heater pad and may minimize the occurrence of unwanted intermediate resistivity states within the phase change material layer.

The presence of a thermal spreader structure may improve removal of thermal energy after switching events. These structural features may, in turn, improve the $R_{ON}$ characteristics of the PCM switch. Further, because the laterally-confined dielectric capping layer is laterally offset from the electrodes contacting the phase change material layer, the relatively high-k dielectric capping layer may not significantly contribute to the $C_{OFF}$ characteristics of the switch. Accordingly, a high-performance PCM switch with an increased figure of merit (FOM) may be provided. In this regard, in some embodiments, the PCM switches may be formed in a BEOL process using logic-compatible processes in which the PCM switch is formed in proximity to interconnect structures.

Various disclosed embodiments may provide advantages by providing PCM switches that may include two or more phase change material elements formed in a parallel circuit configuration. The parallel configuration provides a reduced resistance that gives rise to a reduced insertion loss and increased figure of merit relative to PCM switches having only a single phase change material element. Embodiment PCM switches may further include a heating device that may include separate heating elements for respective separate phase change material elements. The separate heating elements may be individually and independently switched. In certain switching operations, it may be advantageous to perform sequential switching operations to reduce a peak switching power provided by the heating device.

An embodiment phase change material switch may include a first phase change material element, a second phase change material element, a first conductor electrically connected to a first end of each of the first phase change material element and the second phase change material element such that the first conductor is configured as a first terminal of an electrical circuit comprising a parallel configuration, a second conductor electrically connected to a second end of each of the first phase change material element and the second phase change material element such that the second conductor is configured as a second terminal of the electrical circuit comprising the parallel configuration, and a heating device coupled to the first phase change material element and to the second phase change material element and configured to supply a heat pulse to the first phase change material element and to the second phase change material element.

An embodiment method of forming a phase change material switch may include forming a first phase change material element and forming a second phase change material element; forming a first conductor electrically connected to a first end of each of the first phase change material element and the second phase change material element; forming a second conductor electrically connected to a second end of each of the first phase change material element and the second phase change material element; forming a heating device coupled to the first phase change material element and to the second phase change material element such that the heating device is configured to supply a heat pulse to the first phase change material element and to the second phase change material element; and configuring the first conductor, the second conductor, the first phase change material element, and the second phase change material element as an electrical circuit comprising a parallel configuration.

An embodiment method of controlling a phase change material (PCM) switch may include providing a PCM switch comprising a first phase change material element, a second phase change material element, a first heating element in contact with the first phase change material element, and a second heating element in contact with the second phase change material element; simultaneously controlling the first heating element and the second heating element to provide a set heat pulse to both the first phase change material element and the second phase change material element to change each of the first phase change material element and the second phase change material element from a high resistivity state to a low resistivity state; and sequentially controlling the first heating element and the second heating element to provide a first reset heat pulse to the first phase change material element followed by providing a second reset heat pulse to the second phase change material element to change the each of the first phase change material element and the second phase change material element from the low resistivity state to the high resistivity state.

FIG. 1 is an exemplary block diagram of an RF transceiver system 100, according to various embodiments. The RF transceiver system 100 may include at least one antenna 102, an antenna switch 104, a receiver filter 106, a transceiver processor 108, a data processor 110, a power amplifier 112, a power supply 114, and a low-pass filter 116. In some embodiments, the antenna switch 104 may be used to direct a signal from the antenna 102 to the receiver filter 106 or from the low pass filter 116 output to the antenna 102. The antenna switch may have low loss (e.g., <0.1 dB) to avoid adding to system noise or attenuating the transmit signal.

In some embodiments, the receiver filter 106 may be configured to filter signals to eliminate out-of-band signals so that such out-of-band signals may not be amplified or impact the linearity of the transceiver processor 108. In some embodiments, the transceiver processor 108 may further include at least one of a low noise amplifier, an RF filter, a mixer, a demodulator, a digital-to-analog converter, an analog-to-digital converter, and a modulator. First data 118, which may be received from the receiver filter 106 may be provided to a data processor 110. Similarly, second data 120, which is to be provided to the antenna 102 for transmission by the antenna 102, may be provided from the data processor 110 to the transceiver processor 108.

After being processed by the transceiver processor 108, the second data 120 may be amplified by the power amplifier 112 and may be filtered by the low pass filter 116 before being provided to the antenna switch 104. In turn, the antenna switch 104 may provide the second data 120, received from the low pass filter 116, to the antenna 102 for transmission. In the illustrated embodiment RF transceiver system 100, the antenna switch 104 may share one antenna 102 in transmission and reception and may be configured and controlled to switch the signal path. In some embodiments, the antenna switch 104 may be configured to exhibit low loss and low power consumption.

Figures 2A, 2B:
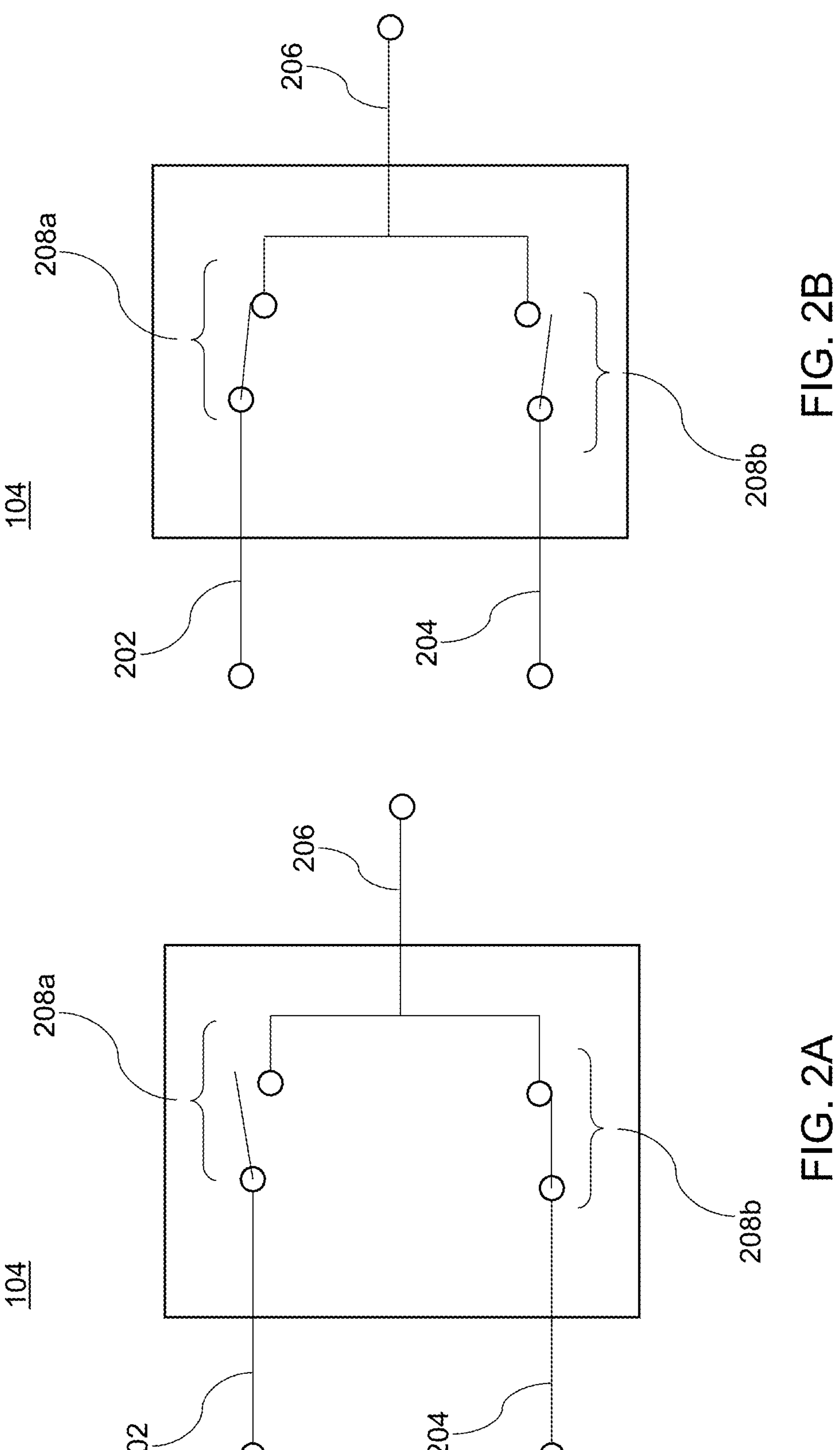
FIG. 2A is a schematic illustration of an antenna switch in a first configuration, according to various embodiments.
FIG. 2B is a schematic illustration of the antenna switch in a second configuration, according to various embodiments.

FIG. 2A is a schematic illustration of the antenna switch 104 in a first configuration, and FIG. 2B is a schematic illustration of the antenna switch 104 in a second configuration. The antenna switch 104 may include a receive node 202, a transmit node 204, and an antenna node 206. The antenna switch 104 may include a first RF switch **208*a* and a second RF switch 208*b*. As shown in FIG. 2A, in a first configuration, the first RF switch 208*a* may be open and the second RF switch 208*b* may be closed. As such, the antenna node 206 may be electrically connected to the transmit node 204. Alternatively, as shown in FIG. 2B, the first RF switch 208*a* may be closed and the second RF switch 208*b* may be open. As such, the antenna node 206 may be electrically connected to the receive node 202**.

FIGS. 2A and 2B, suggest that the antenna switch 104 may be implemented using two RF switches (208*a*, 208*b*). Such RF switches (208*a*, 208*b*) may each be implemented using one or more transistors, resistors, inductors, capacitors, diodes, etc. For example, the antenna switch 104 may include various other circuit components such as a voltage controller. In various embodiments, various circuit components may include switching elements including one or more suitable electronic switches, such as insulated gate bipolar transistors (IGBTs), bipolar junction transistors (BJTs), field-effect transistors (FETs), metal-oxide semiconductor field-effect transistors (MOSFETs), gate turnoff thyristors (GTOs), integrated gate-commutated thyristors (IGCTs), bidirectional triode thyristors (TRIACs), etc. Various other embodiments may be implemented using high-performance PCM switch elements, as described in greater detail below.

Figure 3A:
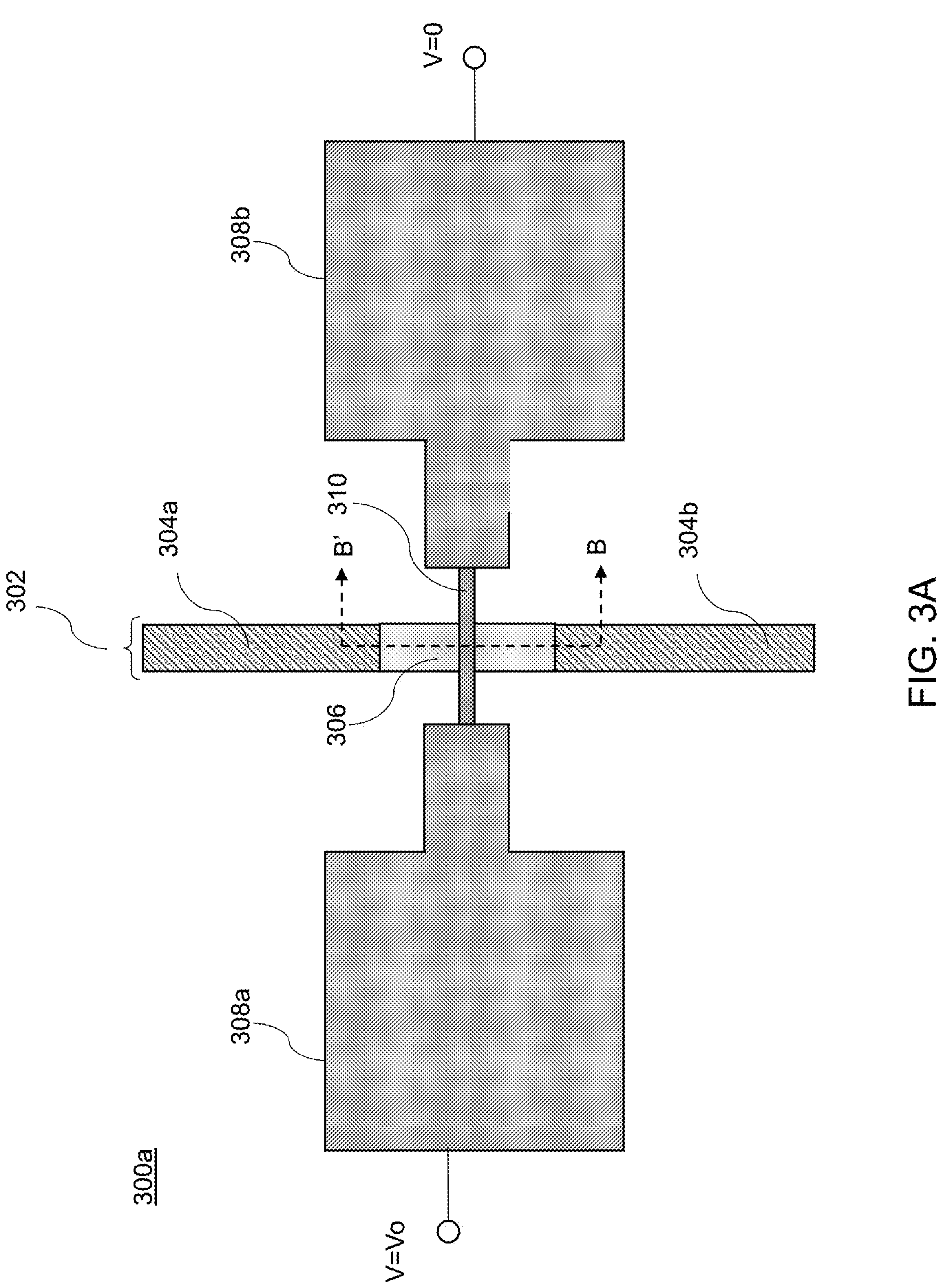
FIG. 3A is a top view of a PCM switch, according to various embodiments.
Figure 3B:
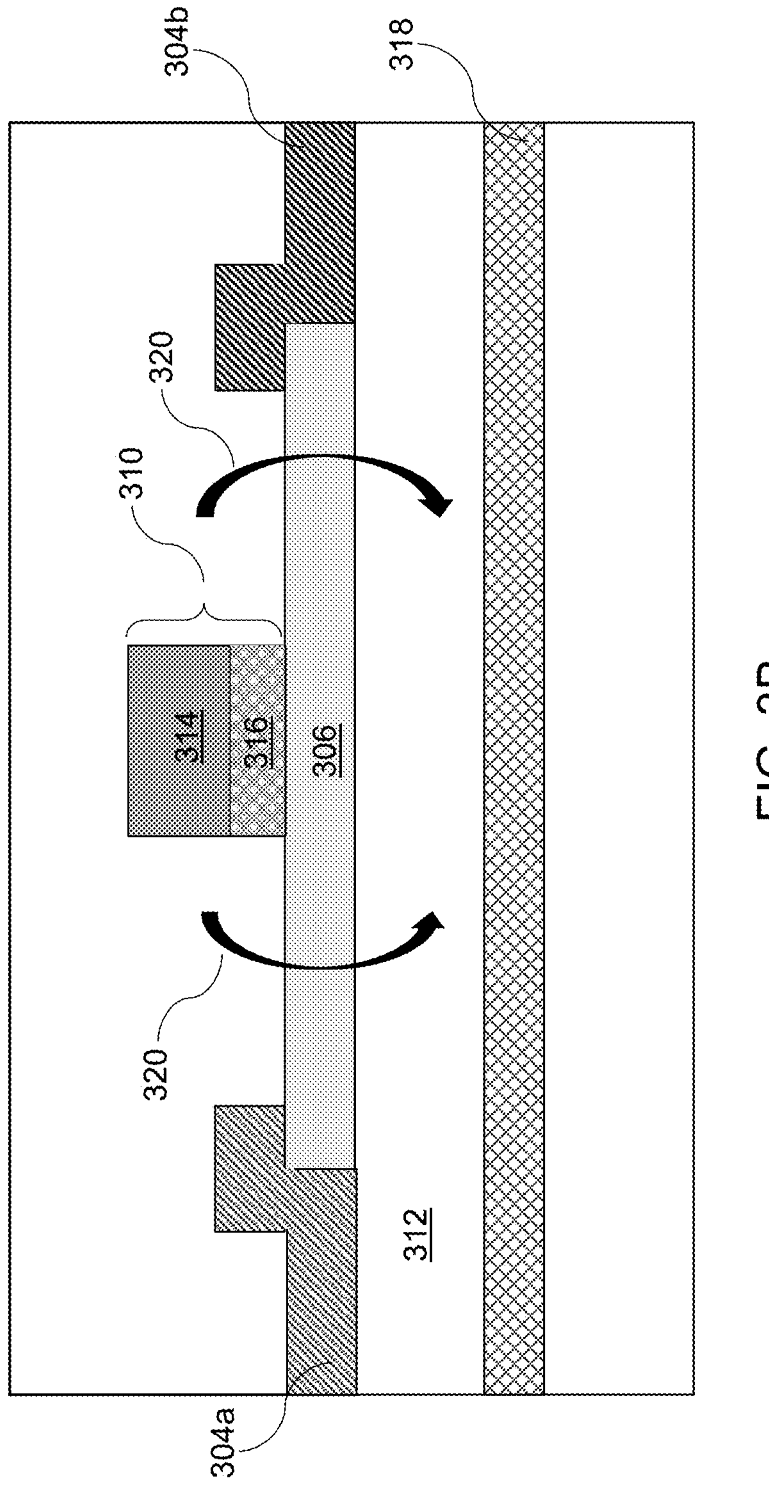
FIG. 3B is a vertical cross-sectional view of a portion of the PCM switch of FIG. 3A, according to various embodiments.

FIG. 3A is a top view of a PCM switch 300*a*, and FIG. 3B is a vertical cross-sectional view of a portion of the PCM switch 300*a* of FIG. 3A, according to various embodiments. The vertical cross-sectional plane that defines the view of FIG. 3B is indicated by the cross-section B-B' in FIG. 3A. The PCM switch 300*a* may include an RF signal line 302 having a first RF conductor 304*a* and a second RF conductor 304*b*. The PCM switch 300*a* may further include a phase change material element 306 that may be in contact with the first RF conductor 304*a* and the second RF conductor 304*b*. As described above, the phase change material element 306 may be in a conducting state or in an insulating state. In instances in which the phase change material element 306 is in a conducting state, the PCM switch is closed (i.e., the switch is in an "On" state) and RF signals may propagate along the RF signal line 302 from the first RF conductor 304*a* to the second RF conductor 304*b* or from the second RF conductor 304*b* to the first RF conductor 304*a*. In instances in which the phase change material element 306 is in an insulating state, the PCM switch 300*a* is open (i.e., the switch is in an "Off state) and propagation of RF signals along the RF signal line 302 is prevented.

The PCM switch 300*a* may further include a first heater pad 308*a* and a second heater pad 308*b*. The first heater pad 308*a* and the second heater pad 308*b* may each be electrically connected to a heating element 310. The first heater pad 308*a*, the second heater pad 308*b*, and the heating element 310 may each be formed of a conducting material. In some embodiments, each of the first heater pad 308*a*, the second heater pad 308*b*, and the heating element 310, may be formed of the same conducting material. Alternatively, two or more different electrically conducting materials may be used for the first heater pad 308*a*, the second heater pad 308*b*, and the heating element 310.

Application of voltage difference between the first heater pad 308*a* (e.g., held at $V=V_o$) and the second heater pad 308*b* (e.g., held at V=0) may generate an electrical current that may flow from the first heater pad 308*a*, through the heating element 310, and to the second heater pad 308*b*, or from the second heater pad 308*b*, through the heating element 310, and to the first heater pad 308*a*, depending on the sign of the applied voltage $V_o$. The resistance of a given electrical circuit element (e.g., each of the first heater pad 308*a*, the second heater pad 308*b*, and the heating element 310) is proportional to a length along the direction of current flow and inversely proportional to a cross-sectional area perpendicular to current flow. As such, the first heater pad 308*a* and the second heater pad 308*b* may be configured to have a considerably larger width than that of the heating element 310. Therefore, for a given applied voltage difference, the current density may be considerably larger in the heating element 310 relative to that in either of the first heater pad 308*a* and the second heater pad 308*b*. As such, heat generated due to Ohmic loss will be produced at a greater rate (i.e., have a greater value of $I^2R$ power) in the heating element 310 in comparison with heat generated in the first heater pad 308*a* and the second heater pad 308*b*. As such, heat may be preferentially generated by the heating element 310 and may be delivered to the phase change material element 306.

As shown in FIG. 3B, the PCM switch 300*a* may include a phase change material element 306 electrically connected to the first RF conductor 304*a* and to the second RF conductor 304*b*. Each of the first RF conductor 304*a*, the second RF conductor 304*b*, and the phase change material element 306 may be formed over a first switch dielectric material layer 312. As described in greater detail below, the heating element 310 may be formed above the phase change material element 306 such as to be in contact with a portion of the phase change material element 306. In this example embodiment, the heating element 310 may include a conductive heater pad 314 and a capping layer 316. Further, the capping layer 316 may be an electrically insulating material while being a heat conductor.

As shown in FIG. 3B, the PCM switch 300*a* may further include a heat spreader 318 formed below the phase change material element 306 on an opposite side of the phase change material element 306 from the heating element 310. The heat spreader 318 may be formed of a material having a high thermal conductivity. For example, the heat spreader 318 may have a planar slab geometry and may be a metal or a compound semiconductor (e.g., SiC) having a high thermal conductivity (e.g., >100 W/mK). The heat spreader 318 may be configured to remove heat from the phase change material element 306 during a cool-down phase after a switching event (e.g., switching from insulating to conducting or from conducting to insulating). As shown, the heat spreader 318 may be configured to cause heat to flow preferentially from the heating element 310, through the phase change material element 306, and toward the heat spreader 318, as indicated by the arrows 320 shown in FIG. 3B. Thus, the heating element 310 may be coupled to a first side (e.g., the top side) of the phase change material element 306 and the heat spreader 318 may be formed on a second side (e.g., the bottom side) of the phase change material element 306 opposite to the heating element 310. In other embodiments, however, the heat spreader 318 and the heating element 310 may be formed on the same side of the phase change material element 306 as described with reference to FIG. 3C, below.

Figure 3C:
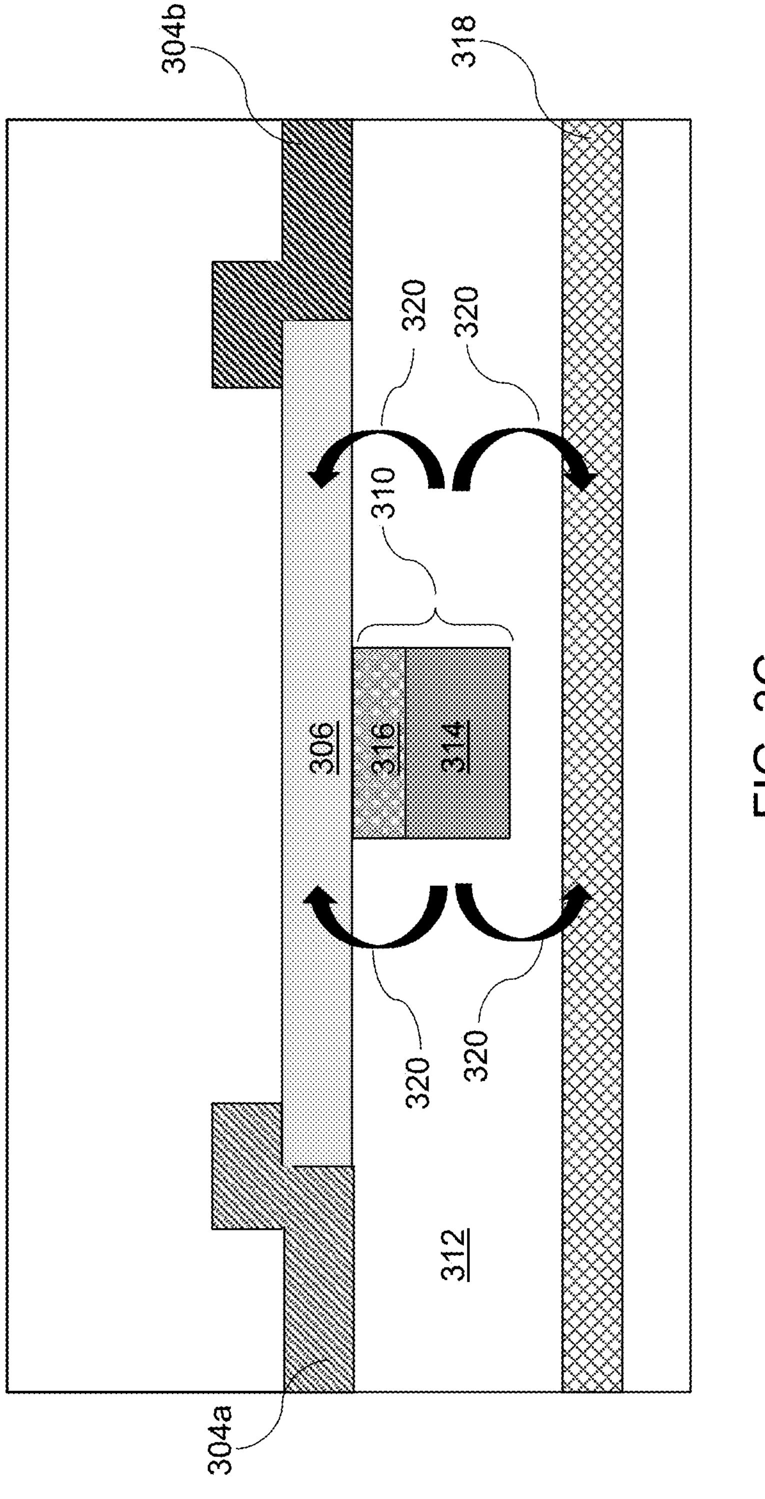
FIG. 3C is a vertical cross-sectional view of a further PCM switch, according to various embodiments.

FIG. 3C is a vertical cross-sectional view of a further PCM switch 300*c*, according to various embodiments. In this example embodiment, the PCM switch 300*c* is configured to have the heating element 310 and the heat spreader 318 on the same side (i.e., the lower side) of the phase change material element 306. Thus, as shown by the arrows 320, heat may flow from the heating element 310 both toward the phase change material element 306 and toward the heat spreader 318. The PCM switch 300*c* may have different performance characteristics relative to the PCM switch 300*a* depending on the relative heat capacities of the heating element 310 and the phase change material element 306.

For example, the PCM switch 300*c* of FIG. 3C may perform differently than the PCM switch 300*a* of FIGS. 3A and 3B in that heat may be drawn away from the heating element 310 and the phase change material element 306 (e.g., downward in FIG. 3C) leading to an inefficiency of heating the phase change material element 306. The embodiment of FIG. 3B may perform such that the phase change material element 306 may be directly quenched (i.e., heat removed) after a switching event leading to a faster switching time and more efficient heating of the phase change material element 306 (relative to embodiments in which the heat spreader 318 may be placed on the same side as the heating element 310). However, in embodiments in which the heat capacity of the heating element 310 is greater than that of the phase change material element 306, the heat spreader 318 may be placed next to the heating element 310, as shown in FIG. 3C, so that heat may be rapidly drawn away from the heating element 310 after a switching event.

Figures 3D, 3E:
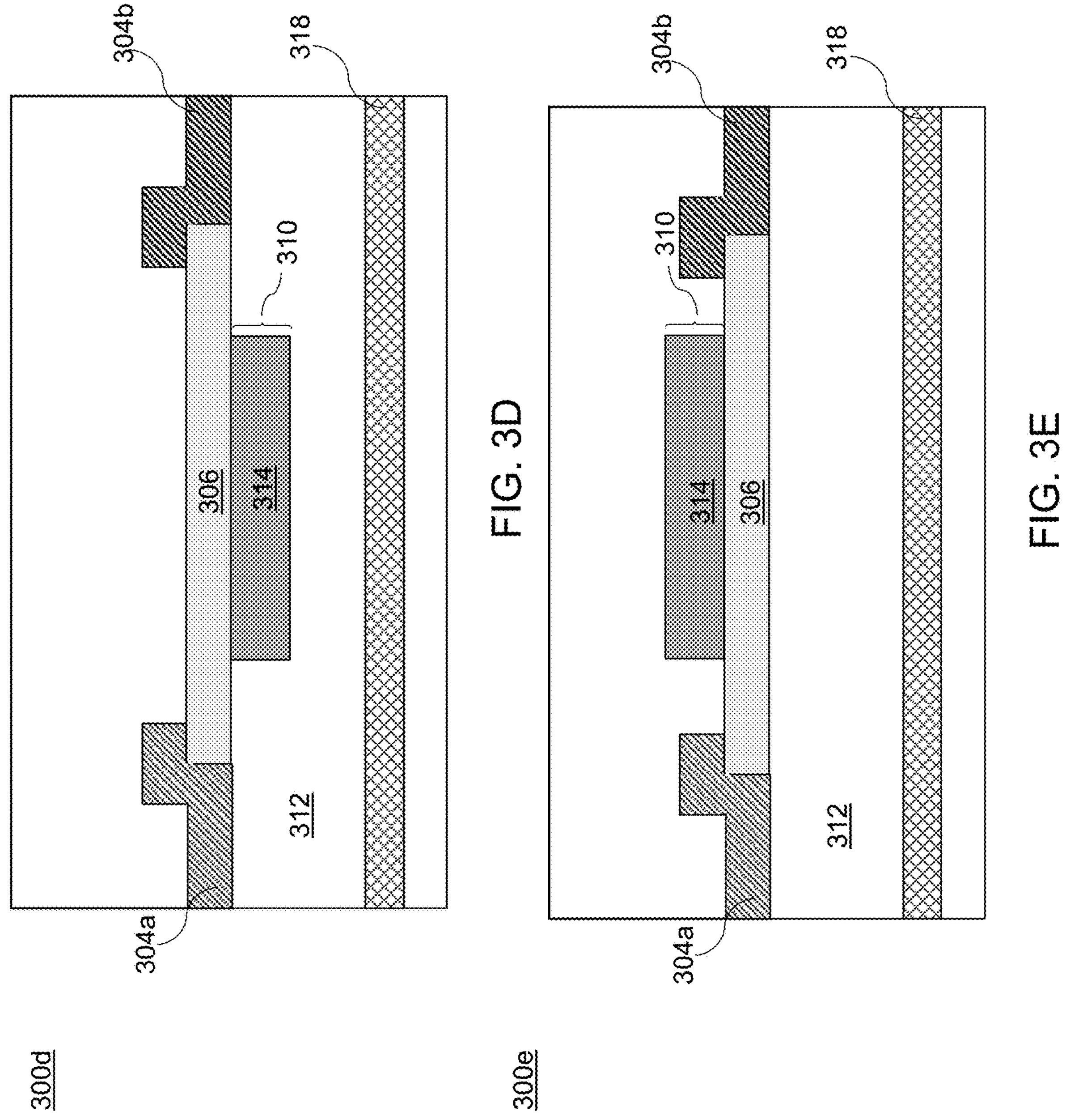
FIG. 3D is a vertical cross-sectional view of a further PCM switch, according to various embodiments.
FIG. 3E is a vertical cross-sectional view of a further PCM switch, according to various embodiments.

FIGS. 3D and 3E are vertical cross-sectional views further PCM switches (300*d*, 300*e*), according to various embodiments. In contrast to the embodiments of FIGS. 3A to 3C, the heating element 310 may include the heater pad 314 formed directly in contact with the phase change material element 306 (i.e., without the capping layer 316). Further, as shown respectively in FIGS. 3D and 3E, the heating element 310 may be formed on the same side or on the opposite side of the phase change material element 306 as the heat spreader 318. As described with reference to FIG. 3C, above, one or the other of the PCM switches (300*d*, 300*e*) may exhibit better performance depending on the relative heat capacities of the various components of the PCM switches (300*d*, 300*e*).

Figure 4A:
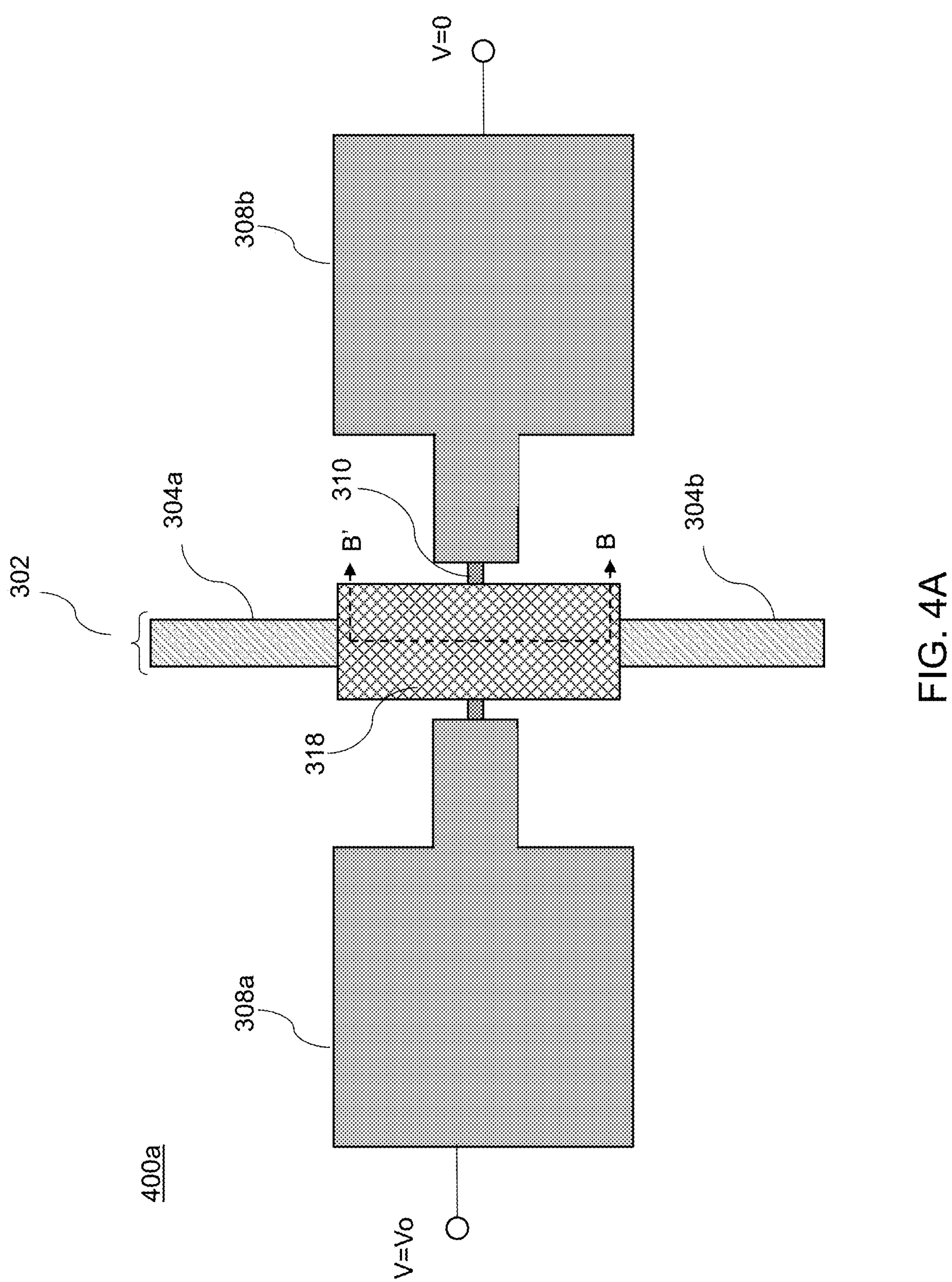
FIG. 4A is a top view of a further PCM switch, according to various embodiments.
Figure 4B:
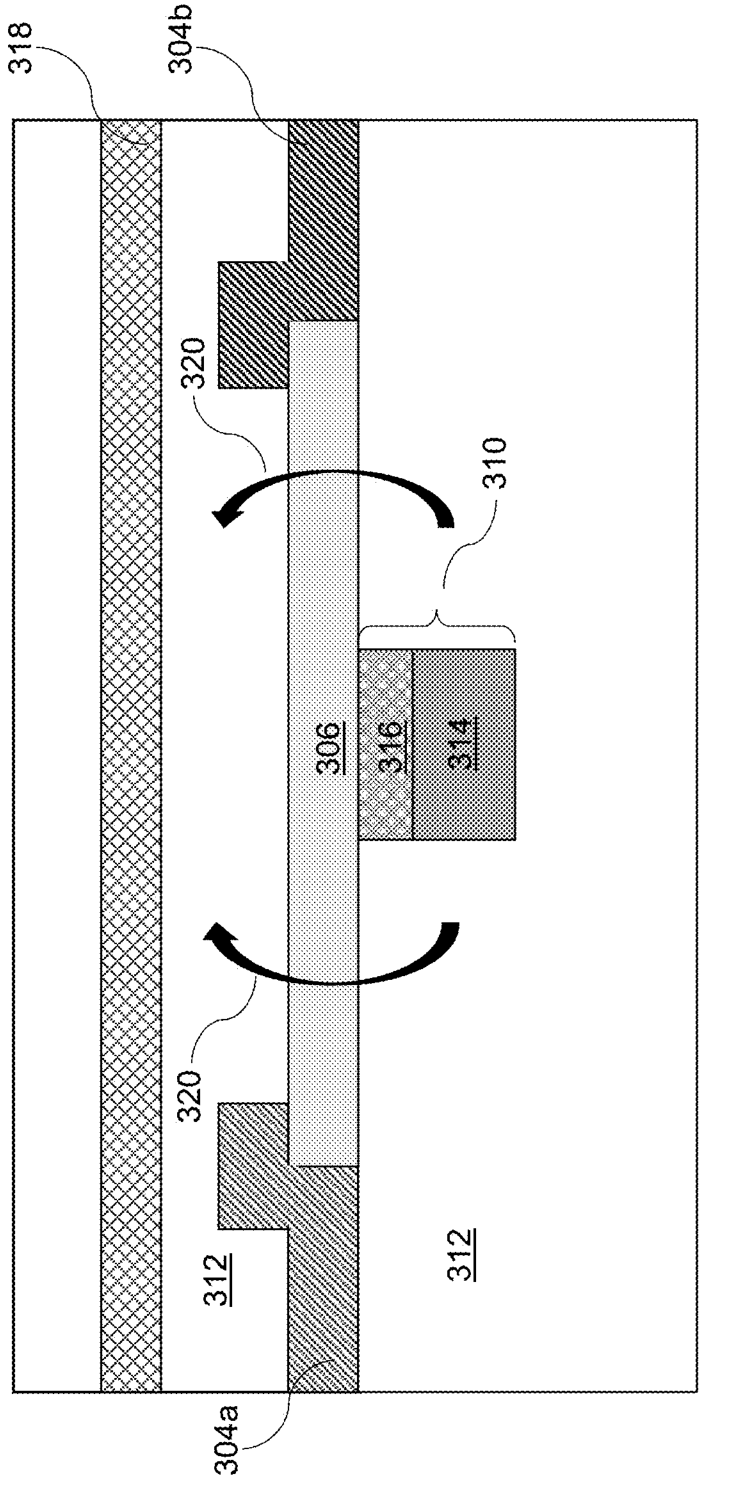
FIG. 4B is a vertical cross-sectional view of the PCM switch of FIG. 4A, according to various embodiments.

FIG. 4A is a top view of a further PCM switch 400*a*, and FIG. 4B is a vertical cross-sectional view of a portion of the PCM switch 400*a* of FIG. 4A, according to various embodiments. The vertical cross-sectional plane that defines the view of FIG. 4B is indicated by the cross-section B-B' in FIG. 4A. The PCM switch 400*a* may have many of the same or similar components as those of the PCM switch 300*a*. In contrast to the embodiment PCM switch 300*a* of FIGS. 3A and 3B, however, the PCM switch 400*a* of FIG. 4A may include a configuration in which the position of the heating element 310 and the heat spreader 318 are swapped (e.g., heat spreader 318 above and heating element 310 below the phase change material element 306). As such, heat may preferentially flow from the heating element 310, through the phase change material element 306, and toward the heat spreader 318 in the opposite direction (e.g., up) from that of the embodiment of FIG. 3B, as shown by the arrows 320 in FIG. 4B. Thus, the heating element 310 may be coupled to a first side (e.g., the bottom side) of the phase change material element 306 and the heat spreader 318 may be formed on a second side (e.g., the top side) of the phase change material element 306 opposite to the heating element 310.

As shown in FIGS. 3B and 4B, the heating element 310 may have a localized spatial extent relative to the phase change material element 306. As such, heat may be applied to the phase change material element 306 in a localized distribution. The localized spatial distribution of heat provided to the phase change material element 306 may reduce a power required to switch the phase change material. Further, the presence of the heat spreader 318 may provide more efficient removal of heat following switching events, which may increase a switching speed of the PCM switch.

In some embodiments, the heat spreader 318 may include a metal or a compound semiconductor having a thermal conductivity greater than 100 W/mK. The heat spreader 318 may also include Cu or SiC. The heat spreader 318 may further be electrically isolated from the heating element 310 and the phase change material element 306 (e.g., see FIG. 4B). The heat spreader 318 may further be separated from the phase change material element 306 by an electrically insulating material (e.g., first switch dielectric material layer 312) having a thermal conductivity in a range from approximately 0.1 W/mK to approximately 50 W/mK.

Further, the phase change material element 306 may include a material having a thermal conductivity in a range from approximately 2.5 W/mK to approximately 10 W/mK. The phase change material element 306 may include at least one of a germanium telluride compound, an antimony telluride compound, a germanium antimony telluride compound, a germanium antimony compound, an indium germanium telluride compound, an aluminum selenium telluride compound, an indium selenium telluride compound, and an aluminum indium selenium telluride compound. Other suitable phase change materials are within the contemplated scope of disclosure.

The heating element 310 may include a heater pad 314 that generates heat when an applied voltage generates a current through the heater pad 314. The heater pad 314 may further include a material that is at least one of tungsten, tungsten nitride, titanium nitride, and a nickel silicide. Other suitable materials are within the contemplated scope of disclosure. Further, the heater pad 314 may include a material having a thermal conductivity greater than 175 W/mK.

The PCM switches (300*a*, 300*c*, 400*a*, 400*c*) may further include a dielectric capping layer 316 that is in contact with the phase change material element 306 and that separates the heater pad 314 from the phase change material element 306. The dielectric capping layer 316 may include an electrical insulator having a thermal conductivity greater than 100 W/mK. The dielectric capping layer 316 may include at least one of silicon nitride, silicon carbide, silicon carbide nitride, and aluminum nitride. Other suitable materials are within the contemplated scope of disclosure. In some embodiments, the phase change material element 306 may be configured to switch from the conducting phase to the insulating phase within a time that is approximately $5.0\times10^{-7}$ sec or less.

The first RF conductor 304*a*, the second RF conductor 304*b*, and the phase change material element 306 may be configured to form an RF switch (300*a*, 300*c*, 400*a*, 400*c*) that may block RF signals when the phase change material element 306 is the electrically insulating phase and may conduct RF signals when the when the phase change material element 306 is in the electrically conducting phase. The heat spreader 318 may be formed on a second side of the phase change material element 306 opposite to the heating element 310 (e.g., see FIG. 4B). In certain embodiments, the heat spreader 318 may include a metal or a compound semiconductor having a thermal conductivity greater than 100 W/mK. Further, heat spreader 318 may be electrically isolated from the heating element 310 and the phase change material element 306.

Figure 4C:
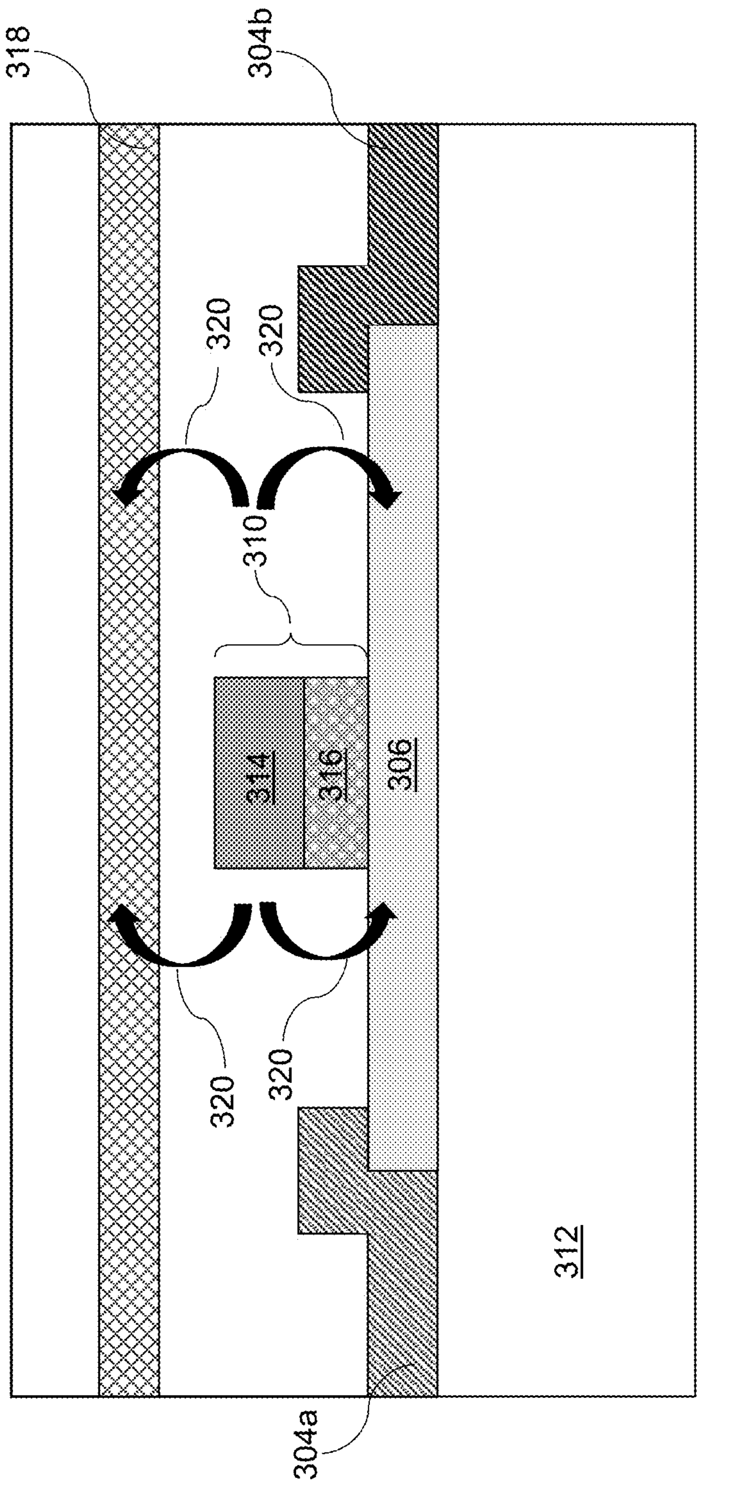
FIG. 4C is a vertical cross-sectional view of a further PCM switch, according to various embodiments.

FIG. 4C is a vertical cross sectional view of a further PCM switch 400*c*, according to various embodiments. In this example embodiment, the PCM switch 400*c* may be configured to have the heating element 310 and the heat spreader 318 on the same side (i.e., the upper side) of the phase change material element 306. Thus, as shown by the arrows 320, heat may flow from the heating element 310 both toward the phase change material element 306 and toward the heat spreader 318. The PCM switch 400*c* may have different performance characteristics relative to the PCM switch 400*a* depending on the relative heat capacities of the heating element 310 and the phase change material element 306.

For example, the PCM switch 400$c$ may exhibit different performance characteristics relative to the PCM switch 400$a$ of FIGS. 4A and 4B in that heat may be drawn away from the heating element 310 and the phase change material element 306 (e.g., upward in FIG. 4C) leading to an inefficiency of heating the phase change material element 306. The embodiment of FIG. 4B may perform such that that the phase change material element 306 may be directly quenched (i.e., heat removed) after a switching event leading to a faster switching time and more efficient heating of the phase change material element 306 (relative to embodiments in which the heat spreader 318 may be placed on the same side as the heating element 310). However, in embodiments in which the heat capacity of the heating element 310 is significantly greater than that of the phase change material element 306, the heat spreader 318 may be placed next to the heating element 310, as shown in FIG. 4C, so that heat may be rapidly drawn away from the heating element 310 after a switching event.

Figures 4D, 4E:
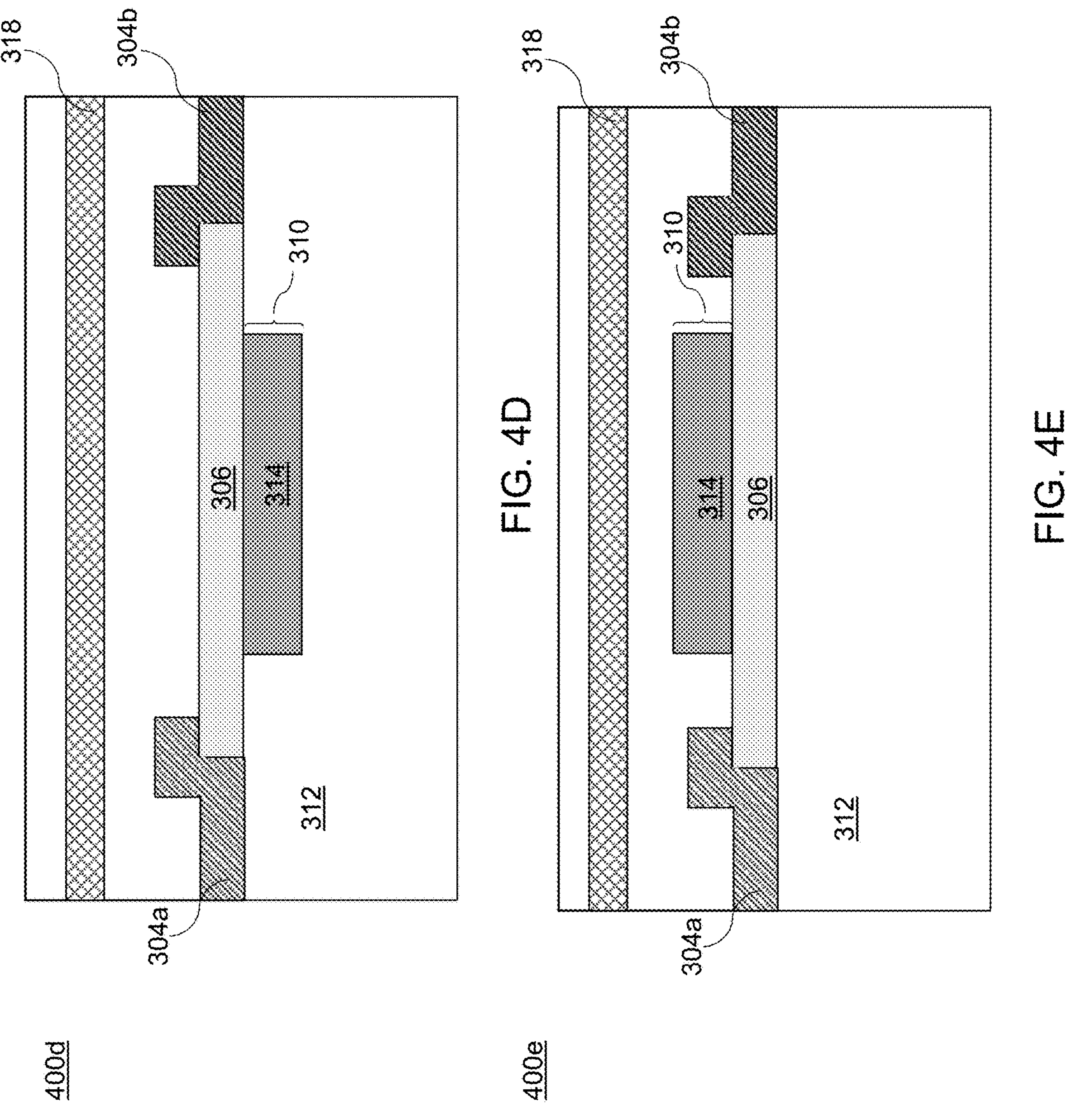
FIG. 4D is a vertical cross-sectional view of a further PCM switch, according to various embodiments.
FIG. 4E is a vertical cross-sectional view of a further PCM switch, according to various embodiments.

FIGS. 4D and 4E are vertical cross-sectional views further PCM switches (400$d$, 400$e$), according to various embodiments. In contrast to the embodiments of FIGS. 4A to 4C, the heating element 310 may include the heater pad 314 formed directly in contact with the phase change material element 306 (i.e., without the capping layer 316). Further, as shown respectively in FIGS. 4D and 4E, the heating element 310 may be formed on the same side or on the opposite side of the phase change material element 306 as the heat spreader 318. As described with reference to FIG. 4C, above, one or the other of the PCM switches (400$d$, 400$e$) may exhibit better performance depending on the relative heat capacities of the various components of the PCM switches (400$d$, 400$e$).

FIG. 5A is a top view of a PCM switch 500 having a parallel circuit configuration, and FIGS. 5B and 5C respectively illustrate schematic circuit diagrams for the parallel circuit of FIG. 5A and an equivalent schematic circuit for the parallel circuit of FIG. 5A, according to various embodiments. As shown in FIG. 5A, the PCM switch 500 may include a first phase change material element 306$a$ and a second phase change material element 306$b$. The PCM switch 500 may further include a first RF conductor 304$a$ and a second RF conductor 304$b$. The first RF conductor 304$a$ and the second RF conductor 304$b$ may be electrically connected to the first phase change material element 306$a$ and the second phase change material element 306$b$ to thereby form the parallel circuit configuration. In this regard, the first RF conductor 304$a$ may be electrically connected to a first end (a1, b1) of each of the first phase change material element 306$a$ and the second phase change material element 306$b$, respectively, and the second RF conductor 304$b$ may be electrically connected to a second end (a2, b2) of each of the first phase change material element 306$a$ and the second phase change material element 306$b$, respectively, as shown in FIG. 5A. In this way, the first RF conductor 304$a$ may be configured as a first terminal, and the second RF conductor 304$b$ may be configured as a second terminal, of the electrical circuit having a parallel configuration.

FIG. 5B illustrates the parallel schematic circuit configuration of the PCM switch 500 of FIG. 5A, according to various embodiments. As shown, an RF signal propagating from the first RF conductor 304$a$ to the second RF conductor 304$b$ or from the second RF conductor 304$b$ to the first RF conductor may propagate along the parallel circuit paths through the first phase change material element 306$a$ and the second phase change material element 306$b$. Each of the first phase change material element 306$a$ and the second phase change material element 306$b$ may have a certain resistance $R_{pcm}$ in a conducting state. As shown in FIG. 5C, the circuit may have an equivalent resistance that is half the value of $R_{pcm}$. As such, the PCM switch 500 of FIG. 5A may have a resistivity $R_{ON}$ in the "On" state that is approximately $R_{ON}=R_{pcm}/2$. Thus, in response to a voltage difference $V=V_{ra}-V_{rb}$ between a first read voltage $V_{ra}$ applied to the first RF conductor 304$a$ and a second read voltage $V_{rb}$ applied to the second RF conductor 304$b$, a current $I=V/R_{ON}$ may be generated. Further, since the effective resistance $R_{ON}$ of the parallel circuit configuration is half the resistance $R_{pcm}$ of a single one of the first phase change material element 306$a$ and the second phase change material element 306$b$, the current $I=2V/R_{pcm}$ is twice the current flowing through each of the first phase change material element 306$a$ and the second phase change material element 306$b$. The fact that the current $I=2\ I_{pcm}$ is twice that of either the current flowing through first phase change material element 306$a$ and the current flowing through the second phase change material element 306$b$ is a consequence of the fact that current is conserved so that the total current $I=I_1+I_2$ is the sum of the current going through the first phase change material element 306$a$ and the current going through the second phase change material element 306$b$.

As described above, the reduction of the resistivity $R_{ON}$ may reduce the insertion loss of the PCM switch 500 and may increase the value of the figure of merit $1/(2\pi R_{ON}{*}C_{OFF})$. In this regard, since the figure of merit is inversely proportional to resistivity $R_{ON}$, by reducing the resistivity $R_{ON}$, the figure of merit may be increased. Thus, in certain embodiments having a parallel circuit configuration such as the PCM switch 500 of FIG. 5A, the figure of merit may be doubled. To understand the overall performance of the PCM switch 500, however, it is instructional to further consider the other circuit elements including the heating element 310, as described below.

As shown in FIG. 5A, the PCM switch 500 may further include a heating device (310, 308$a$, 308$b$) thermally coupled to the first phase change material element 306$a$ and to the second phase change material element 306$b$. The heating device (310, 308$a$, 308$b$) may be configured to supply a heat pulse to the first phase change material element 306$a$ and to the second phase change material element 306$b$ simultaneously. In this regard, the heating device may include a heating element 310 electrically connected to a first heater pad 308$a$ and a second heater pad 308$b$. The heating element 310 must deliver a certain amount of heat to each of the first phase change material element 306$a$ and the second phase change material element 306$b$ to switch the first phase change material element 306$a$ and the second phase change material element 306$b$ from the high-resistivity amorphous state to the low resistivity crystalline state (having the resistivity $R_{pcm}$) or from the low resistivity crystalline state to the high-resistivity amorphous state. Due to the presence of the first phase change material element 306$a$ and the second phase change material element 306$b$, the PCM switch 500 includes approximately twice the amount of phase change material as that of the PCM switches (300$a$, 300$c$, 400$a$, 400$c$) described above with reference to FIGS. 3A to 3C and 4A to 4C. As such, to switch both the first phase change material element 306$a$ and the second phase change material element 306$b$ from one state to another may require approximately twice the heat (i.e., twice the energy) provided by the heating element 310 as that required for the PCM switches (300$a$, 300$c$, 400$a$, 400$c$).

As described above, the heat provided by the heating element 310 is generated in the heating element 310 due to Ohmic loss with a power given by the formula $P=V^2/R_{heater}$, where $R_{heater}$ is the resistance of the heating element 310, and $V=V_{wa}-V_{wb}$ is a voltage difference between a first write voltage $V_{wa}$, applied to the first heater pad 308*a*, and a second write voltage $V_{wb}$, applied to the second heater pad 308*b*. The total amount of heat H=PT supplied by the heating element 310 is given by the power P multiplied by a time duration T of the heat pulse. Thus, to switch first phase change material element 306*a* and the second phase change material element 306*b* from one state to another without increasing the switching time T requires the voltage V applied to the heating element 310 to be increased by approximately a factor of $\sqrt{2}$ (i.e., by a factor of roughly 1.4). The need to increase the peak voltage V, and consequently the peak power P, may be accomplished by including separate heating elements 310 for the first phase change material element 306*a* and the second phase change material element 306*b*, as described in further detail with reference to FIGS. 6A to 9B, below.

Figure 6A:
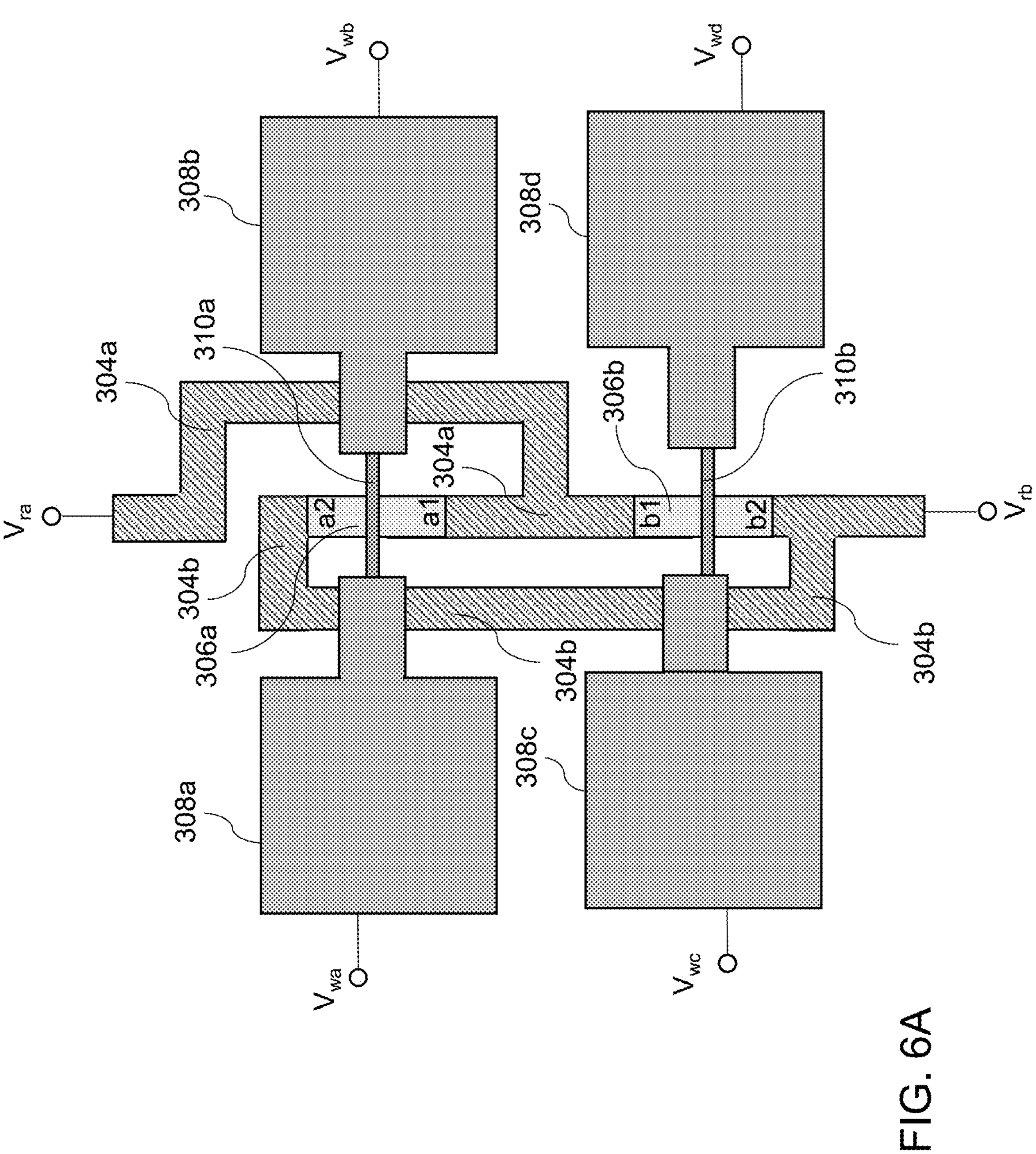
FIG. 6A is a top view of a further PCM switch having a parallel circuit configuration, according to various embodiments.

FIG. 6A is a top view of a further PCM switch 600 having a parallel circuit configuration, according to various embodiments. As with the PCM switch 500 of FIG. 5A, the PCM switch 600 may include a first phase change material element 306*a* and a second phase change material element 306*b*. The PCM switch 600 may further include a first RF conductor 304*a* and a second RF conductor 304*b*. The first RF conductor 304*a* and the second RF conductor 304*b* may be electrically connected to the first phase change material element 306*a* and the second phase change material element 306*b* to thereby form the parallel circuit configuration. In this regard, the first RF conductor 304*a* may be electrically connected to a first end (a1, b1) of each of the first phase change material element 306*a* and the second phase change material element 306*b*, respectively, and the second RF conductor 304*b* may be electrically connected to a second end (a2, b2) of each of the first phase change material element 306*a* and the second phase change material element 306*b*, respectively, as shown in FIG. 6A. In this way, the first RF conductor 304*a* may be configured as a first terminal, and the second RF conductor 304*b* may be configured as a second terminal, of the electrical circuit having a parallel configuration.

The PCM switch 600 of FIG. 6A may further include a heating device (310*a*, 310*b*, 308*a*, 308*b*, 308*c*, 308*d*) coupled to the first phase change material element 306*a* and to the second phase change material element 306*b* and configured to supply a heat pulse to the first phase change material element 306*a* and to the second phase change material element 306*b*. As shown, the heating device (310*a*, 310*b*, 308*a*, 308*b*, 308*c*, 308*d*) may include a first heating element 310*a* in contact with the first phase change material element 306*a* and a second heating element 310*b* in contact with the second phase change material element 306*b*. The first heating element 310*a* may be electrically connected to a first heater pad 308*a* and a second heater pad 308*b*, and the second heating element 310*b* may be electrically connected to a third heater pad 308*c* and a fourth heater pad 308*d*.

A first electrical current $I_1$ may be generated in the first heating element 310*a* by applying a first voltage difference $V_1=V_{wa}-V_{wb}$ between a first write voltage $V_{wa}$ applied to the first heater pad 308*a*, and a second write voltage $V_{wb}$ applied to the second heater pad 308*b*. Similarly, a second electrical current $I_2$ may be generated in the second heating element 310*b* by applying a second voltage difference $V_2=V_{wc}-V_{wd}$ between a third write voltage $V_{wc}$ applied to the third heater pad 308*c*, and a fourth write voltage $V_{wd}$ applied to the fourth heater pad 308*d*. The first electrical current $I_1$ and the second electrical current $I_2$ may then generate heat within the first heating element 310*a* and the second heating element 310*b*, respectively, according to Ohmic loss.

Assuming that each of the first phase change material element 306*a* and the second phase change material element 306*b* has a resistance $R_{pcm}$, the first heating element 310*a* may generate heat at a rate (i.e., electrical power) of $P_1=I_1^2 R_{pcm}=V_1^2/R_{pcm}$, and the second heating element 310*b* may generate heat at a rate (i.e., electrical power) of $P_2=I_2^2 R_{pcm}=V_2^2/R_{pcm}$. The presence of first heating element 310*a* and the second heating element 310*b* allows each of the first phase change material element 306*a* and the second phase change material element 306*b* to be heated separately and independently without the need for an increased voltage as was the case with the PCM switch 500 of FIG. 5A (e.g., the PCM switch 500 required a voltage that was larger by a factor of factor of $\sqrt{2}$). As such, each of the first phase change material element 306*a* and the second phase change material element 306*b* may be switched from the high-resistivity amorphous state to the low resistivity crystalline state (having the resistivity $R_{pcm}$) or from the low resistivity crystalline state to the high-resistivity amorphous state during a same switching time T as that for a switch such as the PCM switches (300*a*, 300*c*, 400*a*, 400*c*) (having a single phase change material element 306) without the need for a circuit having increased peak voltage or power. Further, as described above with reference to FIGS. 6B to 6D, the parallel circuit configuration of the PCM switch 600 may have a reduced resistivity giving rise to reduced insertion loss and increased figure of merit relative to PCM switches (300*a*, 300*c*, 400*a*, 400*c*).

Figure 6D:
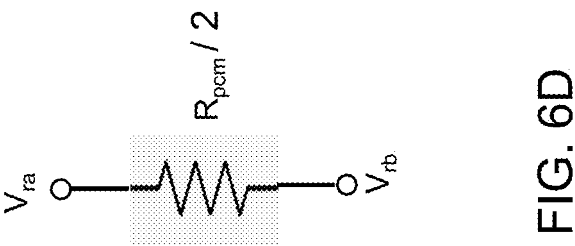
FIG. 6D is a schematic circuit diagram illustrating an equivalent circuit for the PCM switch of FIG. 6A, according to various embodiments.
Figure 6C:
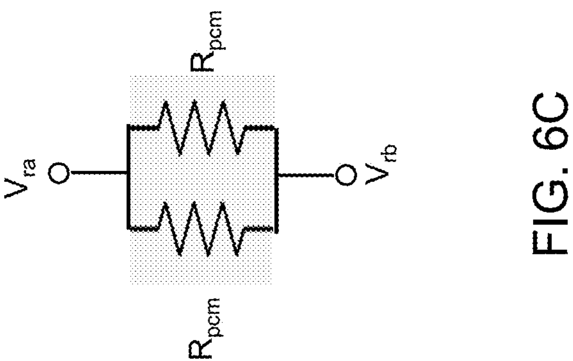
FIG. 6C is a schematic circuit diagram illustrating the parallel circuit configuration of the PCM switch of FIG. 6A, according to various embodiments.
Figure 6B:
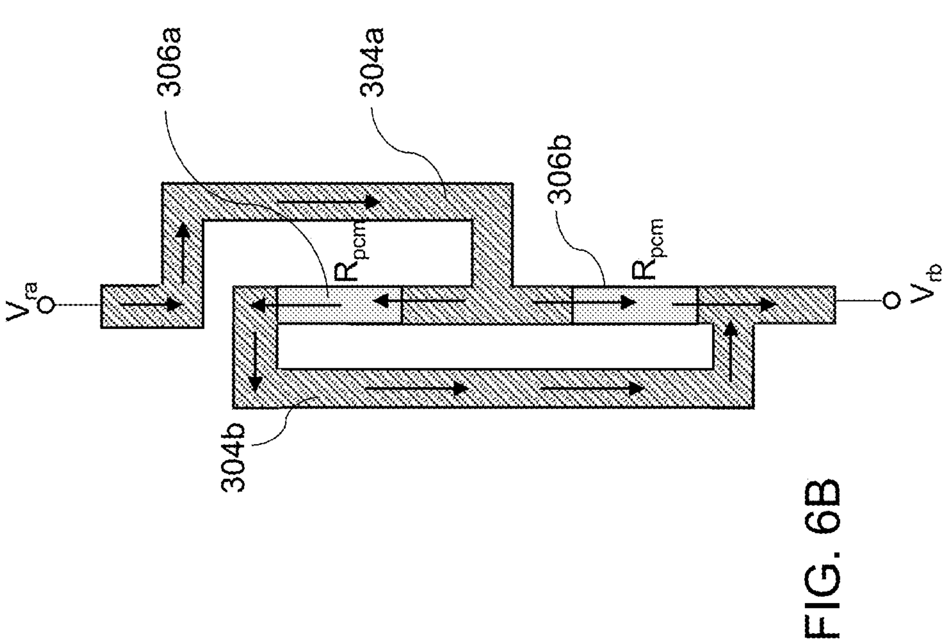
FIG. 6B is a top view of the parallel circuit portion of the PCM switch of FIG. 6A, according to various embodiments.

FIG. 6B is a top view of the parallel circuit portion of the PCM switch of FIG. 6A, FIG. 6C is a circuit diagram illustrating the parallel circuit configuration of the PCM switch of FIG. 6A, and FIG. 6D is a circuit diagram illustrating an equivalent circuit for the PCM switch of FIG. 6A, according to various embodiments. As shown in FIG. 6B, application of a voltage difference $V=V_{ra}-V_{rb}$ between a first read voltage $V_{ra}$ applied to the first RF conductor 304*a*, and a second read voltage $V_{rb}$ applied to the second RF conductor 304*b*, may generate a current I that may flow through two parallel circuit paths from the first RF conductor 304*a* to the second RF conductor 304*b*, as indicated by the arrows in FIG. 6B. The direction of current flow in the parallel circuit portion illustrated in FIG. 6B is provided as an example that depends on the sign of the applied voltage V. In embodiments in which a voltage V with the opposite sign is applied, the current will flow in the opposite direction to that indicated by the arrows in FIG. 6B. In general, an RF voltage has an oscillating time dependence having a voltage that periodically oscillates from positive to negative with a predetermined amplitude. As such, the currents induced in the PCM switch of FIG. 6A will generally also have an alternating current (AC) flow pattern through the circuit.

FIG. 6C illustrates the parallel circuit configuration of the PCM switch 600 of FIG. 6A, according to various embodiments. As shown, an RF signal propagating from the first RF conductor 304*a* to the second RF conductor 304*b* or from the second RF conductor 304*b* to the first RF conductor may propagate along the parallel circuit paths through the first phase change material element 306*a* and the second phase change material element 306*b*. Each of the first phase change material element 306*a* and the second phase change material element 306*b* may have a certain resistance $R_{pcm}$ in a conducting state. As shown in FIG. 6D, the circuit may have an equivalent resistance that is approximately half the value of $R_{pcm}$, as was the case with the parallel circuit configuration of the PCM switch 500 of FIG. 5C. As such, the PCM switch 600 of FIG. 6A may have a resistivity $R_{ON}$ in the "On" state that is approximately $R_{ON}=R_{pcm}/2$. Thus, in response to a voltage difference $V=V_{ra}-V_{rb}$ a current $I=V/R_{ON}$ may be generated. In addition to the reduced insertion loss and increased figure of merit (described above), the PCM switch 600 of FIG. 6A may have the further advantage on not requiring an increased voltage to switch the first phase change material element 306*a* and the second phase change material element 306*b*, in contrast to the PCM switch 500 of FIG. 5A, as described in greater detail, above.

Figure 6F:
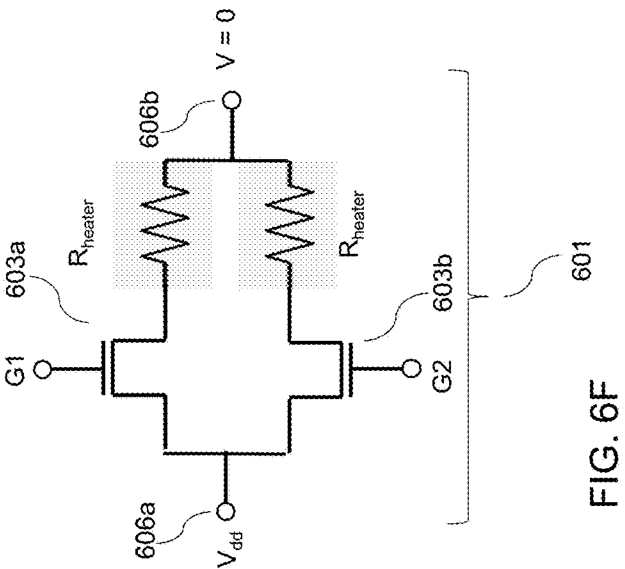
FIG. 6F is a schematic circuit diagram for the heater device portion of the PCM switch of FIG. 6A, according to various embodiments.
Figure 6E:
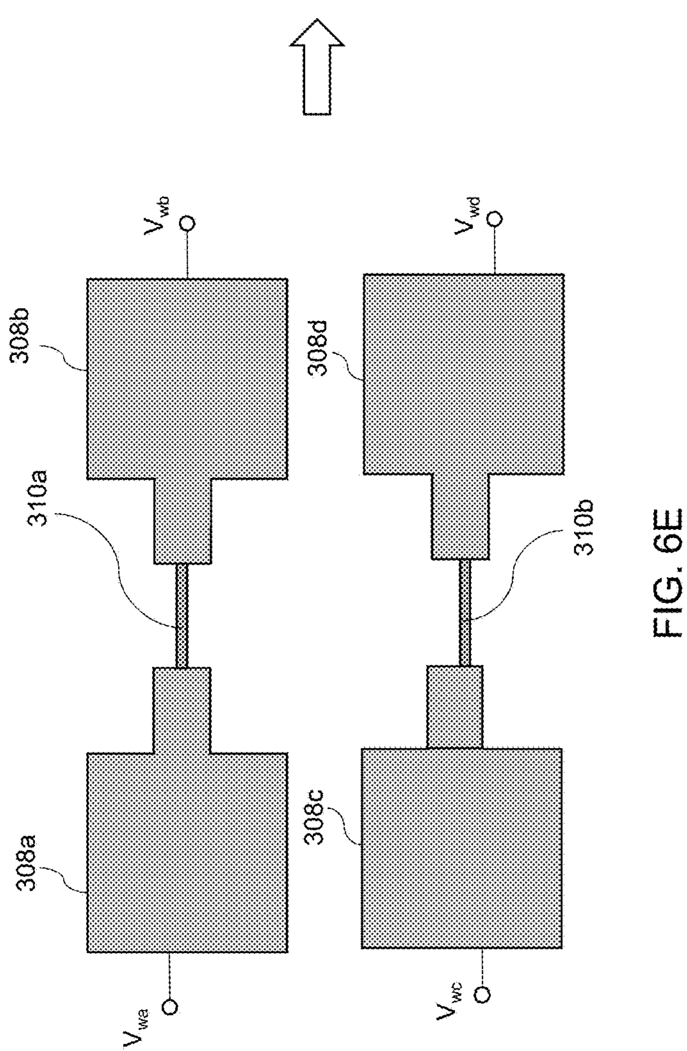
FIG. 6E is a top view of the heater device portion of the PCM switch of FIG. 6A, according to various embodiments.

FIG. 6E is a top view of the heater device portion of the PCM switch of FIG. 6A, and FIG. 6F is a schematic circuit diagram for the heater device portion of the PCM switch of FIG. 6A, according to various embodiments. As described above, the heater device may include a first heating element 310*a*, electrically connected to a first heater pad 308*a* and a second heater pad 308*b*, and a second heating element 310*b* electrically connected to a third heater pad 308*c* and a fourth heater pad 308*d*. As shown in FIG. 6F, a control circuit 601 may include a first transistor 603*a* in series with the first heating element 310*a* (which may have a resistance $R_{heater}$) and a second transistor 603*b* in series with the second heating element 310*b* (which also may have a resistance $R_{heater}$). One terminal 606*a* of the control circuit 601 may be held at a first voltage (e.g., a source potential $V_{dd}$) and another terminal 606*b* of the circuit may be held at a second voltage (e.g., V=0). Currents within the first heating element 310*a* and the second heating element 310*b* may then be separately and independently controlled by application of control voltages to the first gate G1 and the second gate G2 of the first transistor 603*a* and the second transistor 603*b*, respectively.

Figure 7B:
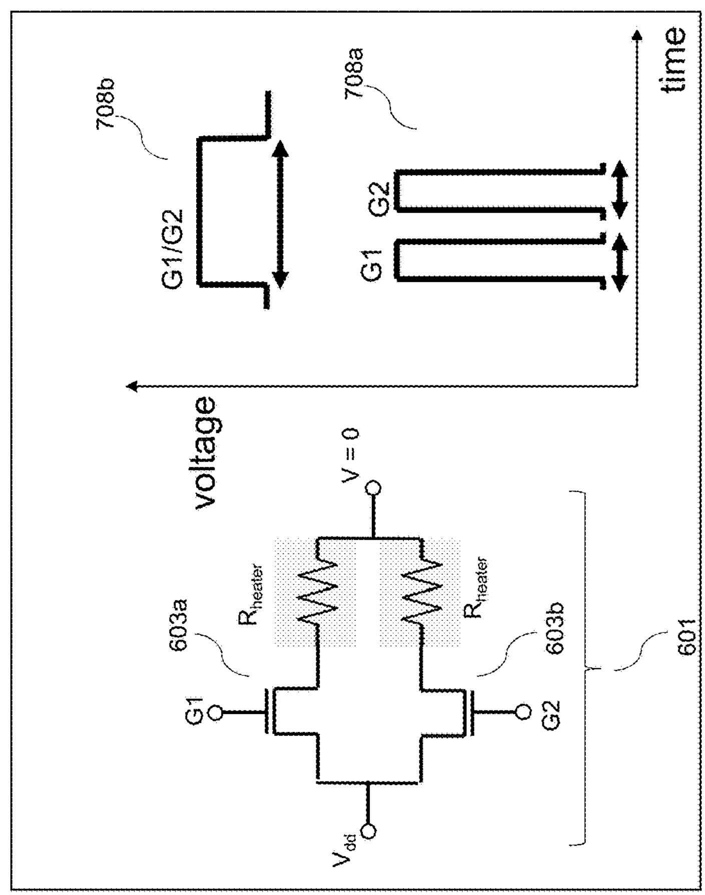
FIG. 7B schematically illustrates voltage vs. time characteristics for switching a state of a PCM switch having a first heater element and a second heater element, according to various embodiments.
Figure 7A:
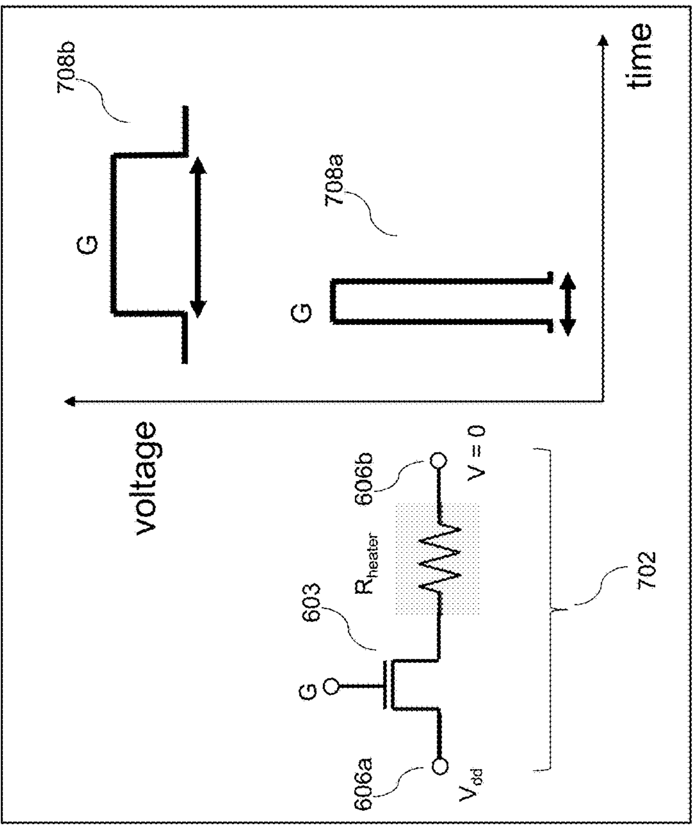
FIG. 7A schematically illustrates voltage vs. time characteristics for switching a state of a PCM switch having a single heater element, according to various embodiments.

FIG. 7A schematically illustrates voltage vs. time characteristics for switching a state of a PCM switch having a single heating element 310, such as the PCM switch 500 of FIG. 5A, or the PCM switches (300*a*, 300*c*, 400*a*, 400*c*) of FIGS. 3A to 3C and 4A to 4C, according to various embodiments. In this regard, a control circuit 702 may include a transistor 603 in series with the heating element 310, which may have a resistance $R_{heater}$. One terminal 606*a* of the control circuit 702 may be held at a first voltage (e.g., a source potential $V_{dd}$) and another terminal 606*b* of the circuit may be held at a second voltage (e.g., V=0). The voltage vs. time plot schematically shows two voltage vs. time curves (708*a*, 708*b*) representing voltage pulses that may be applied to a gate G of the transistor 603. The lower curve 708*a* illustrates a short pulse (i.e., a reset pulse) having a large amplitude and the upper curve 708*b* illustrates a longer pulse (i.e., a set pulse) having a smaller amplitude. Each of the voltage pulses may be applied to the gate G of the transistor 603 to thereby induce a corresponding current in the heating element 310. In an example embodiment, the lower curve 708*a* may correspond to a pulse having a time duration that is less than or equal to approximately 0.1 microsecond and the upper curve 708*b* may correspond to a pulse having a time duration that is less than or equal to 1 microsecond.

Within the linear switching regime of the transistor 603, a greater amplitude voltage applied to the gate G may induce a proportionally greater current through the heating element 310. As such, the lower curve 708*a* may induce a large current in the heating element 310 having a short time duration, and the upper curve 708*b* may induce a lesser current in the heating element 310 having a longer time duration. Heat generated within the heating element 310 may cause the switching events within the phase change material element 306 (e.g., see FIGS. 3A to 3C and 4A to 4C). In this regard, the lower curve 708*a* (i.e., a reset pulse) may cause the phase change material element 306 to be heated to a temperature above the melting temperature for a short time duration, which upon cooling, may cause the phase change material element 306 to have the high-resistivity amorphous phase. Similarly, the upper curve 708*b* (i.e., a set pulse) may cause the phase change material element 306 to be heated to a temperature above crystallization temperature but below the melting temperature for a longer time duration, which upon cooling, may cause the phase change material element 306 to recrystallize into the low-resistance crystalline phase (e.g., having resistance $R_{pcm}$).

FIG. 7B schematically illustrates voltage vs. time characteristics for switching a state of a PCM switch having a first heating element 310*a* and a second heating element 310*b*, such as the PCM switch 600 of FIG. 6A, according to various embodiments. As described above with reference to FIG. 6F, the control circuit 601 may include a first transistor 603*a* and a second transistor 603*b* that may allow currents through the first heating element 310*a* and the second heater element (e.g., see FIGS. 6A and 6E) to be separately and individually controlled. As shown in the lower curve 708*a*, a first short pulse (a reset pulse) may be applied to the first gate G1 of the first transistor 603*a* followed by a second short pulse (a reset pulse) applied to the second gate G2 of the second transistor 603*b*. In this way, the first heating element 310*a* may be switched (from the low-resistivity crystalline phase to the high-resistivity amorphous phase) before the second heating element 310*b* is switched.

A peak power delivered by the control circuit 601 may be reduced (e.g., reduced by approximately half) relative to an operation in which both the first heating element 310*a* and the second heating element 310*b* are switched simultaneously. Since this operation (i.e., switching the low-resistivity crystalline phase to the high-resistivity amorphous phase) requires a relatively higher voltage, and consequently higher peak power, it may be advantageous to perform these operations in sequence rather than simultaneously.

As shown in upper curve 708*b* (e.g., see FIGS. 7A and 7B) the operation of switching from the high-resistivity amorphous state to the low-resistivity crystalline state requires a considerably longer time duration than that of the operation of switching from the low-resistivity crystalline state to the high-resistivity amorphous state. As such, a switching time of the PCM switch 600 of FIG. 600 may be dominated by the operation of switching from the high-resistivity amorphous state to the low-resistivity crystalline state (i.e., indicated by the upper curve 708*b*). Thus, to avoid increasing overall switching time, it may be advantageous to simultaneously apply voltages to the first gate G1 of the first transistor 603*a* and to the second gate G2 of the second transistor 603*b* to simultaneously switch both the first phase change material element 306*a* and the second phase change material element 306*b* from the high-resistivity amorphous state to the low-resistivity crystalline. However, as described above, since the inverse operation (i.e., switching from the low-resistivity crystalline state to the high-resistivity amorphous state) requires significantly less time, it may be advantageous to switch the first phase change material element 306*a* and the second phase change material element 306*b* sequentially, as indicated by the two sequential pulses in the lower curve 708*a* of FIG. 7B. In this way, a peak switching power provided by the control circuit 601 (see FIGS. 6F and 7B) may be reduced (e.g., reduced by approximately one half) for half of the switching operations (i.e., for the reset operations of the lower curve 708*a*).

Figure 8A:
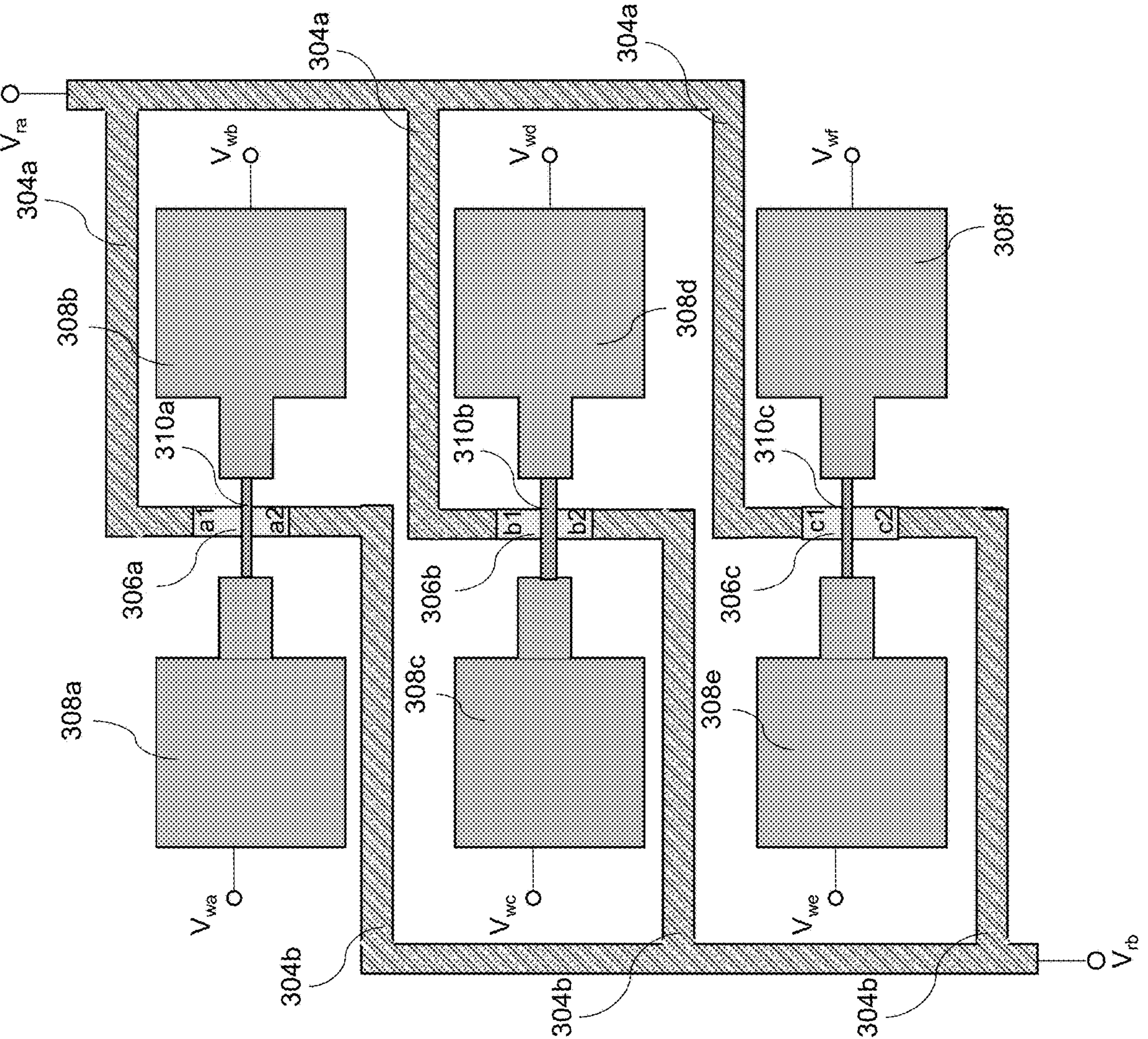
FIG. 8A is a top view of a further PCM switch having a parallel circuit configuration, according to various embodiments.

FIG. 8A is a top view of a PCM switch 800 having a parallel circuit configuration, according to various embodiments. As shown in FIG. 8A, the PCM switch 800 may include a first phase change material element 306*a*, a second phase change material element 306*b*, and a third phase change material element 306*c*. The PCM switch 800 may further include a first RF conductor 304*a* and a second RF conductor 304*b*. The first RF conductor 304*a* and the second RF conductor 304*b* may be electrically connected to the first phase change material element 306*a*, the second phase change material element 306*b*, and the third phase change material element 306*c* to thereby form the parallel circuit configuration. In this regard, the first RF conductor 304*a* may be electrically connected to a first end (a1, b1, c1) of each of the first phase change material element 306*a*, the second phase change material element 306*b*, and the third phase change material element 306*c*, respectively, as shown in FIG. 8A. Similarly, the second RF conductor 304*b* may be electrically connected to a second end (a2, b2, c2) of each of the first phase change material element 306*a*, the second phase change material element 306*b*, and the third phase change material element 306*c*, respectively. In this way, the first RF conductor 304*a* may be configured as a first terminal, and the second RF conductor 304*b* may be configured as a second terminal, of the electrical circuit having a parallel configuration.

The PCM switch 800 of FIG. 8A may further include a heating device (310*a*, 310*b*, 310*c*, 308*a*, 308*b*, 308*c*, 308*d*, 308*e*, 308*f*) coupled to the first phase change material element 306*a*, to the second phase change material element 306*b*, and to the third phase change material element 306*c*. The heating device may be and configured to supply a heat pulse to the first phase change material element 306*a*, to the second phase change material element 306*b*, and to the third phase change material element 306*c*. As shown, the heating device may include a first heating element 310*a* in contact with the first phase change material element 306*a*, a second heating element 310*b* in contact with the second phase change material element 306*b*, and a third heating element 310*c* in contact with the third phase change material element 306*c*. The first heating element 310*a* may be electrically connected to a first heater pad 308*a* and a second heater pad 308*b*, the second heating element 310*b* may be electrically connected to a third heater pad 308*c* and a fourth heater pad 308*d*, and the third heating element 310*c* may be electrically connected to a fifth heater pad 308*e* and a sixth heater pad 308*f*.

Respective electrical currents $I_1$, $I_2$, and $I_3$ may be generated in the first heating element 310*a*, the second heating element 310*b*, and the third heating element 310*c* by application of respective first voltages $V_1=V_{wa}-V_{wb}$, $V_2=V_{wc}-V_{wd}$, and $V_3=V_{wc}-V_{wf}$ to the respective heater pads (308*a*, 308*b*, 308*c*, 308*d*, 308*e*, 308*f*). The respective electrical currents $I_1$, $I_2$, and $I_3$ may then generate heat within the first heating element 310*a*, the second heating element 310*b*, and the third phase change material element 306*c*, respectively, according to Ohmic loss, as described in greater detail above.

FIG. 8B is a top view of the parallel circuit portion of the PCM switch of FIG. 8A, FIG. 8C is a circuit diagram illustrating the parallel circuit configuration of the PCM switch of FIG. 8A, and FIG. 8D is a circuit diagram illustrating an equivalent circuit for the PCM switch of FIG. 8A, according to various embodiments. A current I induced by application of a voltage difference $V=V_{ra}-V_{rb}$ between a first read voltage $V_{ra}$ and a second read voltage $V_{rb}$ may flow through three parallel circuit paths from the first RF conductor 304*a* to the second RF conductor 304*b* (e.g., see similar description with reference to FIG. 6B, above). FIG. 8C illustrates the parallel circuit configuration of the PCM switch 800 of FIG. 8A, according to various embodiments. As shown, an RF signal propagating from the first RF conductor 304*a* to the second RF conductor 304*b* or from the second RF conductor 304*b* to the first RF conductor may propagate along the parallel circuit paths through the first phase change material element 306*a*, through the second phase change material element 306*b*, and through the third phase change material element 306*c*.

Each of the first phase change material element 306*a*, the second phase change material element 306*b*, and the third phase change material element 306*c*, may have a certain resistance $R_{pcm}$ in a conducting state. As shown in FIG. 8D, the circuit may have an equivalent resistance that is approximately one third the value of Rpm. As such, the PCM switch 800 of FIG. 8A may have a resistivity $R_{ON}$ in the "On" state that is approximately $R_{ON}=R_{pcm}/3$. As described above, the reduced value of the resistance $R_{ON}$ may lead to a reduced insertion loss (e.g., by approximately a factor of one third) and increased figure of merit (e.g., by approximately a factor of three).

Figure 8F:
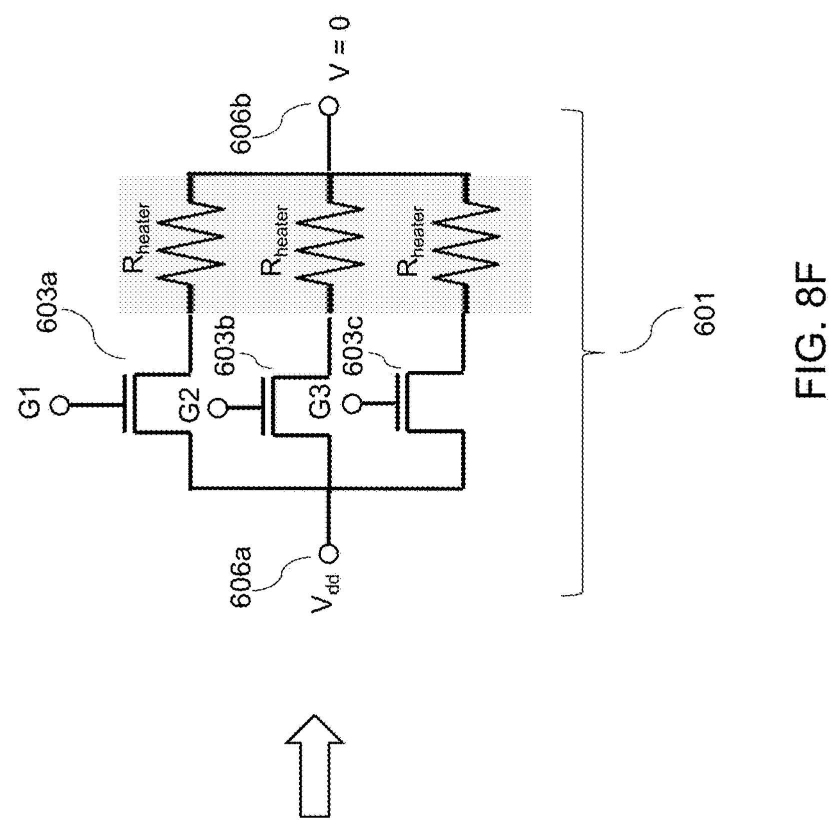
FIG. 8F is a schematic circuit diagram for the heater device portion of the PCM switch of FIG. 8A, according to various embodiments.
Figure 8E:
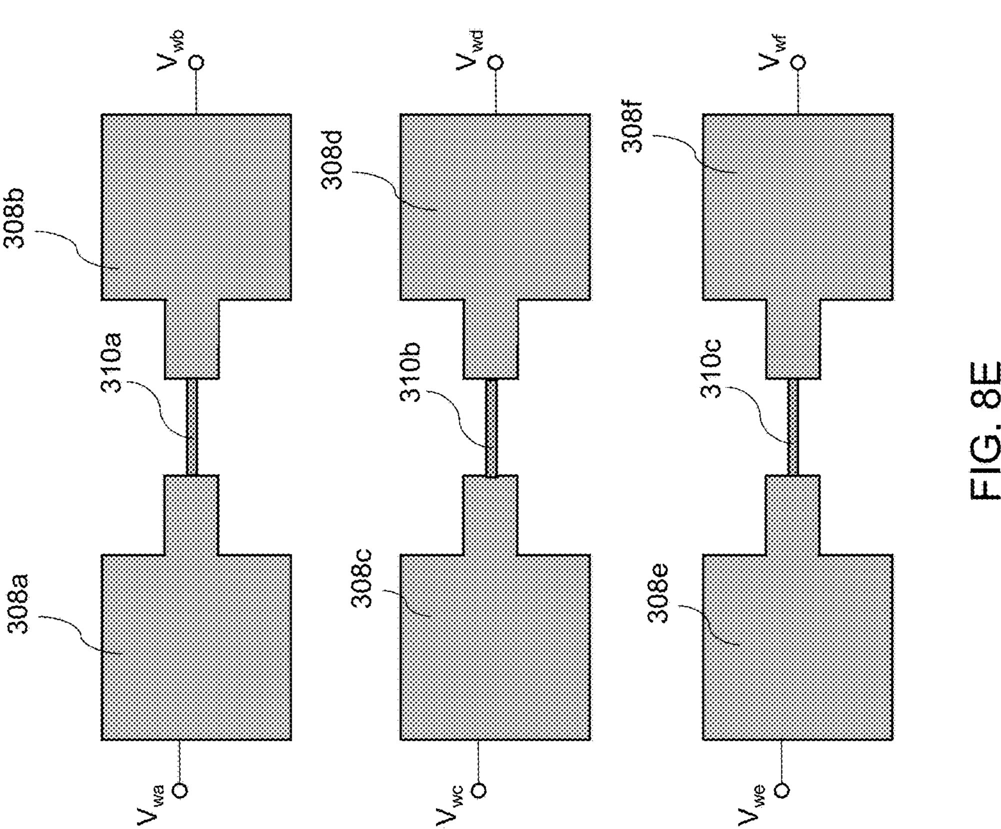
FIG. 8E is a top view of the heater device portion of the PCM switch of FIG. 8A, according to various embodiments.

FIG. 8E is a top view of the heater device portion of the PCM switch of FIG. 8A, and FIG. 8F is a circuit diagram for the heater device (310*a*, 310*b*, 310*c*, 308*a*, 308*b*, 308*c*, 308*d*, 308*e*, 308*f*) portion of the PCM switch of FIG. 8A, according to various embodiments. As described above, the heater device may include a first heating element 310*a*, electrically connected to a first heater pad 308*a* and a second heater pad 308*b*, a second heating element 310*b* electrically connected to a third heater pad 308*c* and a fourth heater pad 308*d*, and a third heating element 310*c* electrically connected to a fifth heater pad 308*e* and a sixth heater pad 308*f*. As shown in FIG. 8F, a control circuit 601 may include a first transistor 603*a* in series with the first heating element 310*a* (which may have a resistance $R_{heater}$), a second transistor 603*b* in series with the second heating element 310*b* (which also may have a resistance $R_{heater}$), and a third transistor 603*c* in series with the third heating element 310*c* (which also may have a resistance $R_{heater}$).

One terminal 606*a* of the control circuit 601 may be held at a first voltage (e.g., a source potential $V_{dd}$) and another terminal 606*b* of the circuit may be held at a second voltage (e.g., V=0). Currents within the first heating element 310*a*, the second heating element 310*b*, and the third heating element 310*c*, may then be separately and independently controlled by application of control voltages to the first gate G1 of the first transistor 603*a*, the second gate G2 of the second transistor 603*b*, and the third gate G3 of the third transistor 603*c*. As such, switching operations applied to the first phase change material element 306*a*, the second phase change material element 306*b*, and the third phase change material element 306*c* may be performed sequentially or simultaneously. For example, when performing a longer operation of switching from the high-resistivity amorphous state to the low-resistivity crystalline state (e.g., see the upper curve 708*b* of FIG. 7B) it may be advantageous to perform switching operations to all three phase change material elements (306*a*, 306*b*, 306*c*) simultaneously, while for the shorter operation of switching from the low-resistivity crystalline state to the high-resistivity amorphous state, it may be advantageous to perform the switching operations sequentially (e.g., see the lower curve 708*a* of FIG. 7B) to thereby reduce a peak power delivered by the control circuit 601.

FIG. 9A is a circuit diagram illustrating a parallel circuit configuration of a further PCM switch, FIG. 9B is a circuit diagram illustrating an equivalent circuit for the PCM switch of FIG. 9A, and FIG. 9C is a circuit diagram for a heater device portion of the PCM switch of FIG. 8A, according to various embodiments. The circuit diagram of FIG. 9A shows a generalization of the PCM switches 600 of FIG. 6A and 800 of FIG. 8A. In this regard, the PCM switch of FIG. 9A may have a parallel configuration including a number N of phase change material elements such that an effective resistance of the circuit is given by $R_{ON}=R_{pcm}/N$, where N can be any integer greater than or equal to 2. The PCM switch of FIG. 9A may further include a number N of heating elements (each having resistance $R_{heater}$) directly contacting respective ones of the phase change material elements. As shown in FIG. 9B, a control circuit 601 may include a number N of transistors (603_1 . . . 603_N) and may be configured to allow selective and independent control of electrical currents supplied to the N heating elements. Increasing the number of phase change material elements effectively reduces the resistance due to the phase change material elements. However, increasing the number of phase change material elements adds complexity to the overall circuit design and introduces additional resistance associated with the RF conductors and the heating elements. Thus, there may be a number N* of phase change material elements and heating elements that may optimize performance of the PCM switch. The optimal number N* of phase change material elements and heating elements may be determined through design considerations, numerical simulation, and testing.

Figures 10A, 10B:
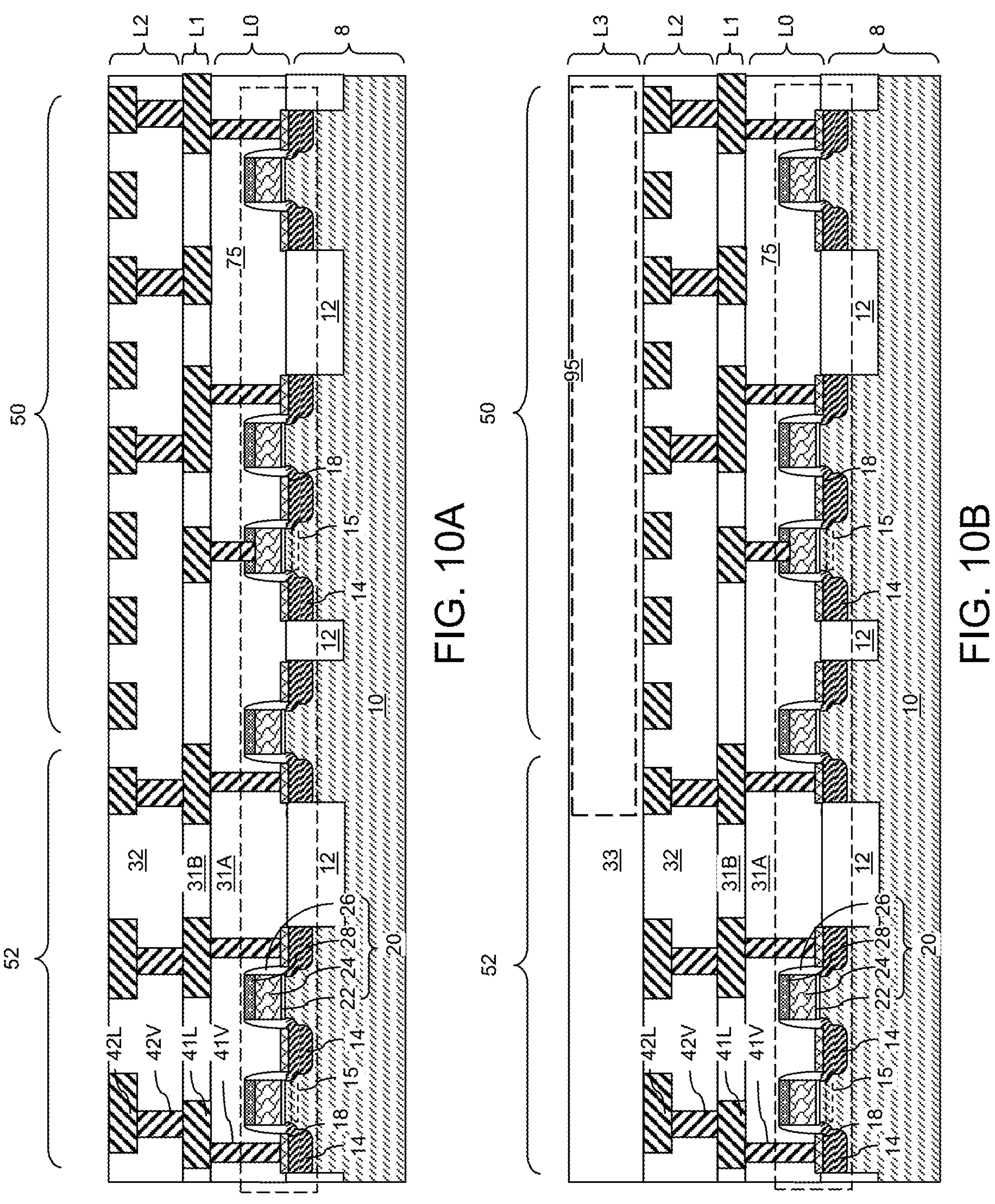
FIG. 10A is a vertical cross-sectional view of a structure after formation of complementary metal-oxide-semiconductor (CMOS) transistors, metal interconnect structures, and dielectric material layers, according to various embodiments.
FIG. 10B is a vertical cross-sectional view of a further structure during formation of a phase-change material switch, according to various embodiments.

FIG. 10A is a vertical cross-sectional view of a structure after formation of complementary metal-oxide-semiconductor (CMOS) transistors, metal interconnect structures, and dielectric material layers, according to various embodiments. The first structure may include a substrate 8, which may be a semiconductor substrate such as a commercially available silicon substrate. The substrate 8 may include a semiconductor material layer 10 at least at an upper portion thereof. The substrate 8 may include a bulk semiconductor substrate such as a silicon substrate in which the semiconductor material layer continuously extends from a top surface of the substrate 8 to a bottom surface of the substrate 8, or a semiconductor-on-insulator (SOI) layer including the semiconductor material layer 10 as a top semiconductor layer overlying a buried insulator layer (such as a silicon oxide layer). The structure may include various devices regions, which may include a switching region 50 in which at least one or more PCM switches may be subsequently formed.

The structure may also include a peripheral logic region 52 in which electrical connections between PCM switches and various peripheral circuits including field effect transistors may be subsequently formed. Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 may constitute a gate structure 20. Additional ion implantation processes may be performed that use the gate structures 20 as self-aligned implantation masks to form deep active regions.

Such deep active regions may include deep source regions and deep drain regions. Upper portions of the deep active regions may overlap with portions of the extension implantation regions. Each combination of an extension implantation region and a deep active region may constitute a source/drain region 14 depending on electrical biasing. A semiconductor channel 15 may be formed underneath each gate stack (22, 24, 28) between a neighboring pair of source/drain regions 14. Metal-semiconductor alloy regions 18 may be formed on the top surface of each source/drain region 14.

Field effect transistors may be formed on the semiconductor material layer 10. Each field effect transistor may include a gate structure 20, a semiconductor channel 15, a pair of source/drain regions 14 (one of which functions as a source region and another of which functions as a drain region), and optional metal-semiconductor alloy regions 18. CMOS circuits 75 may be provided on the semiconductor material layer 10, which may include a periphery circuit for the array(s) of transistors, such as thin film transistors (TFTs), and PCM switches to be subsequently formed.

In one embodiment, the substrate 8 may include a single crystalline silicon substrate, and the CMOS circuits 75 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein and is capable of producing a doped material having electrical conductivity in a range from 1.0 S/cm to $1.0\times10^{5}$ S/cm upon suitable doping with an electrical dopant.

Various interconnect-level structures may be subsequently formed, which are formed prior to formation additional memory devices and are herein referred to as lower interconnect-level structures (L0, L1, L2). In some embodiments, one or more additional devices may be formed over one or more levels of interconnect-level metal lines. For example, the one or more additional devices may include TFTs, memory devices, or PCM switches.

The lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the source/ drain regions 14 or the gate electrodes 24 and formed within the planarization dielectric layer 31A.

The first interconnect-level structure L1 may include a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 may include a second ILD layer 32 and a stack of a first via-level dielectric material layer and a second line-level dielectric material layer or a line-and-via-level dielectric material layer. The second ILD layer 32 may include second interconnect-level metal interconnect structures (42V, 42L) there within, which includes first metal via structures 42V and second metal lines 42L. Top surfaces of the second metal lines 42L may be coplanar with the top surface of the second ILD layer 32.

FIG. 10B is a vertical cross-sectional view of a further structure during formation of a phase-change material switch, according to various embodiments. One or more PCM switches 95 (e.g., PCM switches 300*a*, 300*c*, 400*a*, 400*c*) may be formed in the switching region 50 over the second interconnect-level structure L2. A third ILD layer 33 may be formed during formation of one or more PCM switches 95. The set of all structures formed at the level of the one or more PCM switches 95 may be referred to as a third interconnect-level structure L3.

Figure 10C:
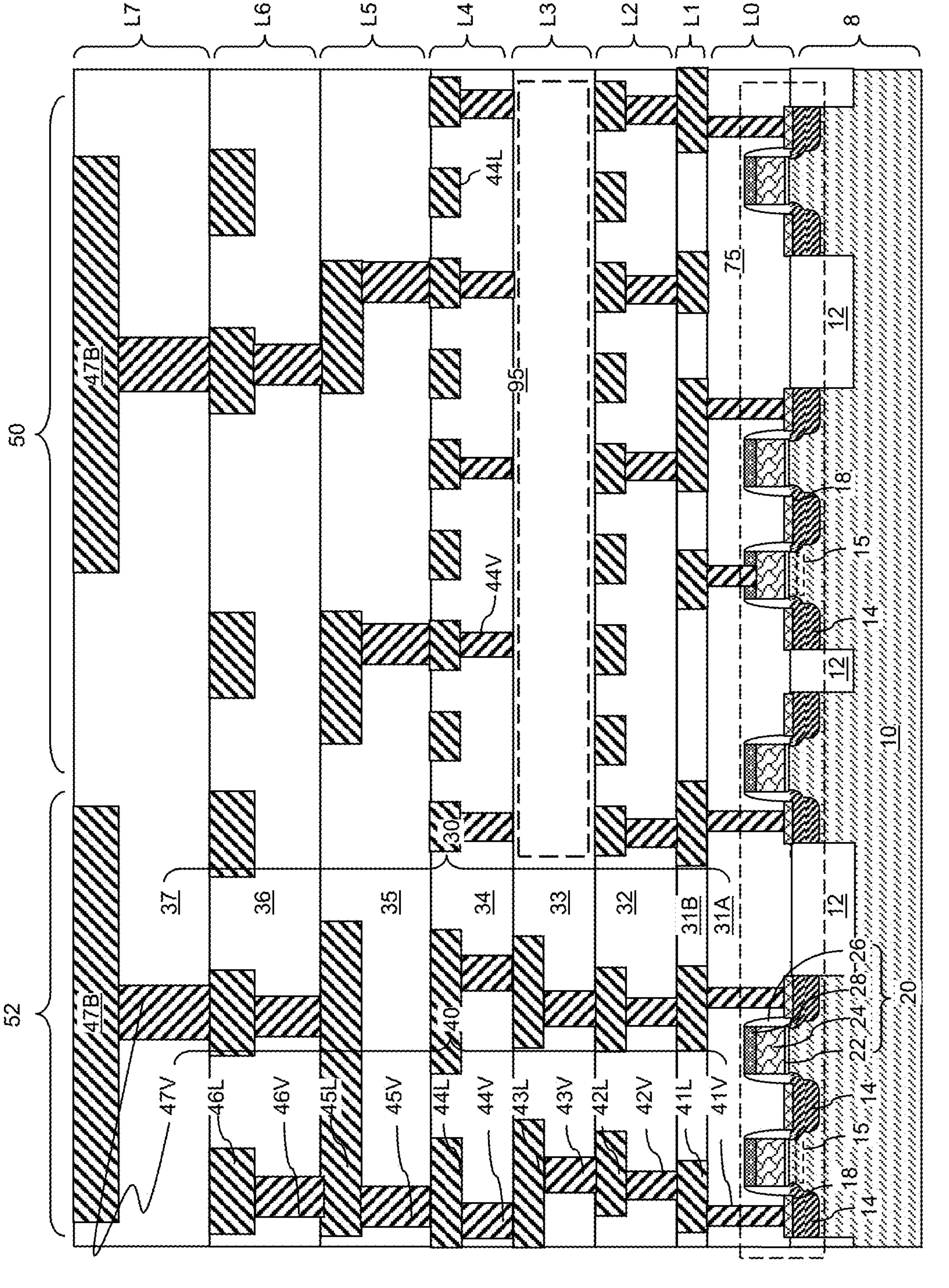
FIG. 10C is a vertical cross-sectional view of a further structure after formation of upper-level metal interconnect structures, according to various embodiments.

FIG. 10C is a vertical cross-sectional view of a further structure after formation of upper-level metal interconnect structures, according to various embodiments. Referring to FIG. 10C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7.

The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding) or may be configured for metal-to-metal bonding (such as copper-to-copper bonding).

Each ILD layer may be referred to as an ILD layer 30. Each of the ILD layers 30 may include a dielectric material such as undoped silicate glass, a doped silicate glass, organosilicate glass, amorphous fluorinated carbon, porous variants thereof, or combinations thereof. Other suitable dielectric materials are within the contemplated scope of disclosure. The ILD layers 30 may be deposited using any suitable deposition process, such a chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Each of the interconnect-level metal interconnect structures may be referred to as an interconnect structure 40. Each contiguous combination of a metal via structure and an overlying metal line located within a same interconnect-level structure (L2-L7) may be formed sequentially as two distinct structures by employing two single damascene processes or may be simultaneously formed as a unitary structure employing a dual damascene process. Each of the interconnect structure 40 may include a respective metallic liner (such as a layer of TiN, TaN, WN, TiC, TaC, and WC having a thickness in a range from 2 nanometers (nm) to 20 nm) and a respective metallic fill material (such as W, Cu, Al, Co, Ru, Mo, Ta, Ti, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30 or may be incorporated into one or more of the ILD layers 30.

While various embodiments may be described in which the one or more PCM switches 95 may be formed as a component of a third interconnect-level structure L3 (e.g., within the L3 interconnect-level dielectric), embodiments are expressly contemplated herein in which the one or more PCM switches 95 may be formed as components of any other interconnect-level structure (e.g., L1-L7). Further, while this example is described using an embodiment in which a set of eight interconnect-level structures are formed, embodiments are expressly contemplated herein in which a different number of interconnect-level structures is used.

In addition, embodiments are expressly contemplated herein in which two or more PCM switches 95 may be provided within multiple interconnect-level structures in the switching region 50. While an embodiment is disclosed in which one or more PCM switches 95 may be formed in a single interconnect-level dielectric layer (e.g., at L3), embodiments are expressly contemplated herein in which one or more additional PCM switches 95 may be formed over two vertically adjoining interconnect-level dielectric layers, as described in greater detail below with reference to FIG. 10D.

Figure 10D:
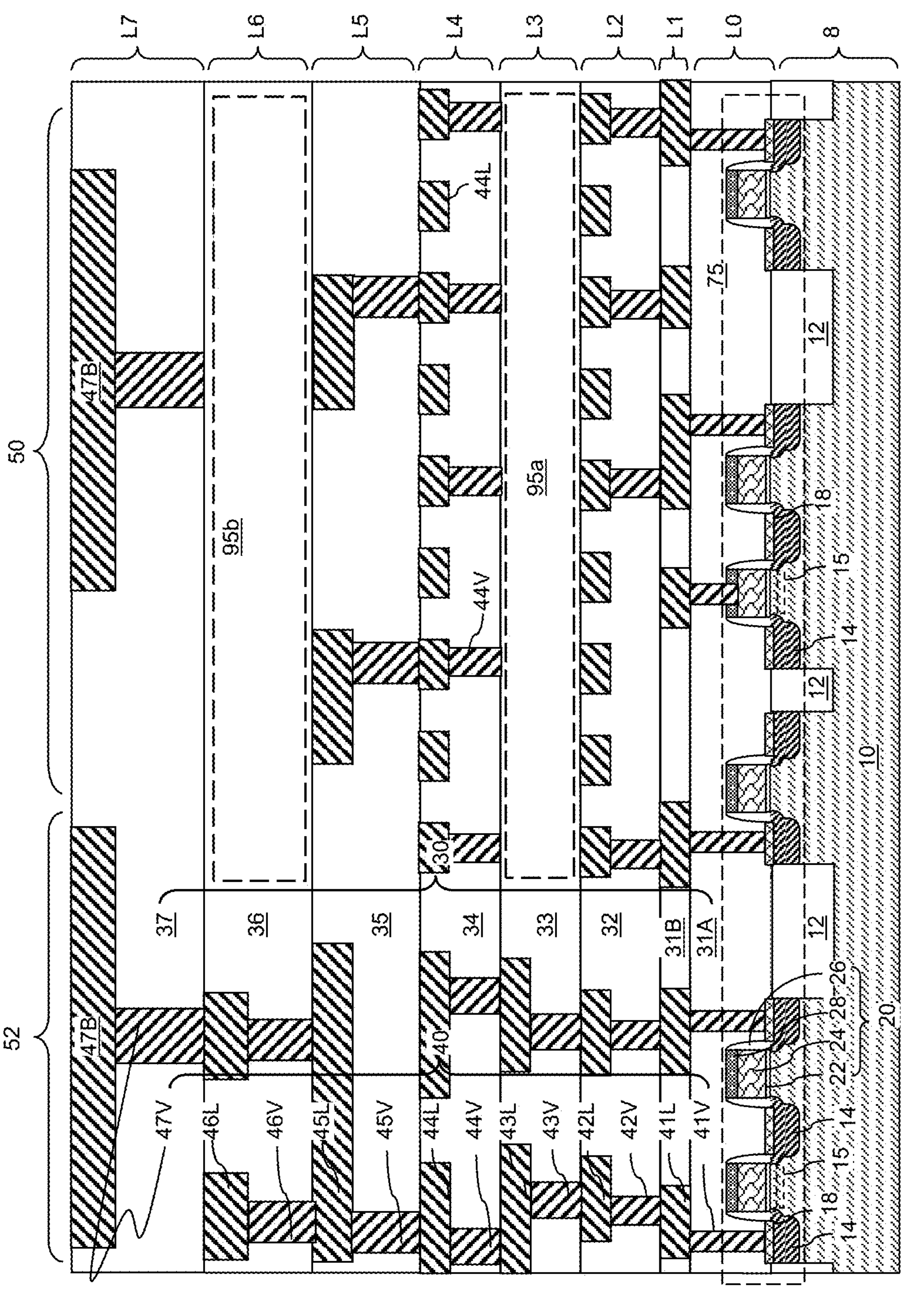
FIG. 10D is a vertical cross-sectional view of a further structure in which two phase-change material switches have been formed within two respective vertically adjoining interconnect-level dielectric layers, according to various embodiments.

FIG. 10D is a vertical cross-sectional view of a further structure in which two PCM switches (95*a*, 95*b*) have been formed over two respective vertically adjoining interconnect-level dielectric layers, according to various embodiments. In this example, a first one or more PCM switches 95*a* may be formed in the switching region 50 over the second interconnect-level structure L2 (e.g., within the L3 interconnect-level dielectric). The structure of FIG. 10D further includes one or more PCM switches 95*b* formed in the switching region 50 over the fifth interconnect-level structure L5 (e.g., within the L6 interconnect-level dielectric).

Figures 11A, 11B:
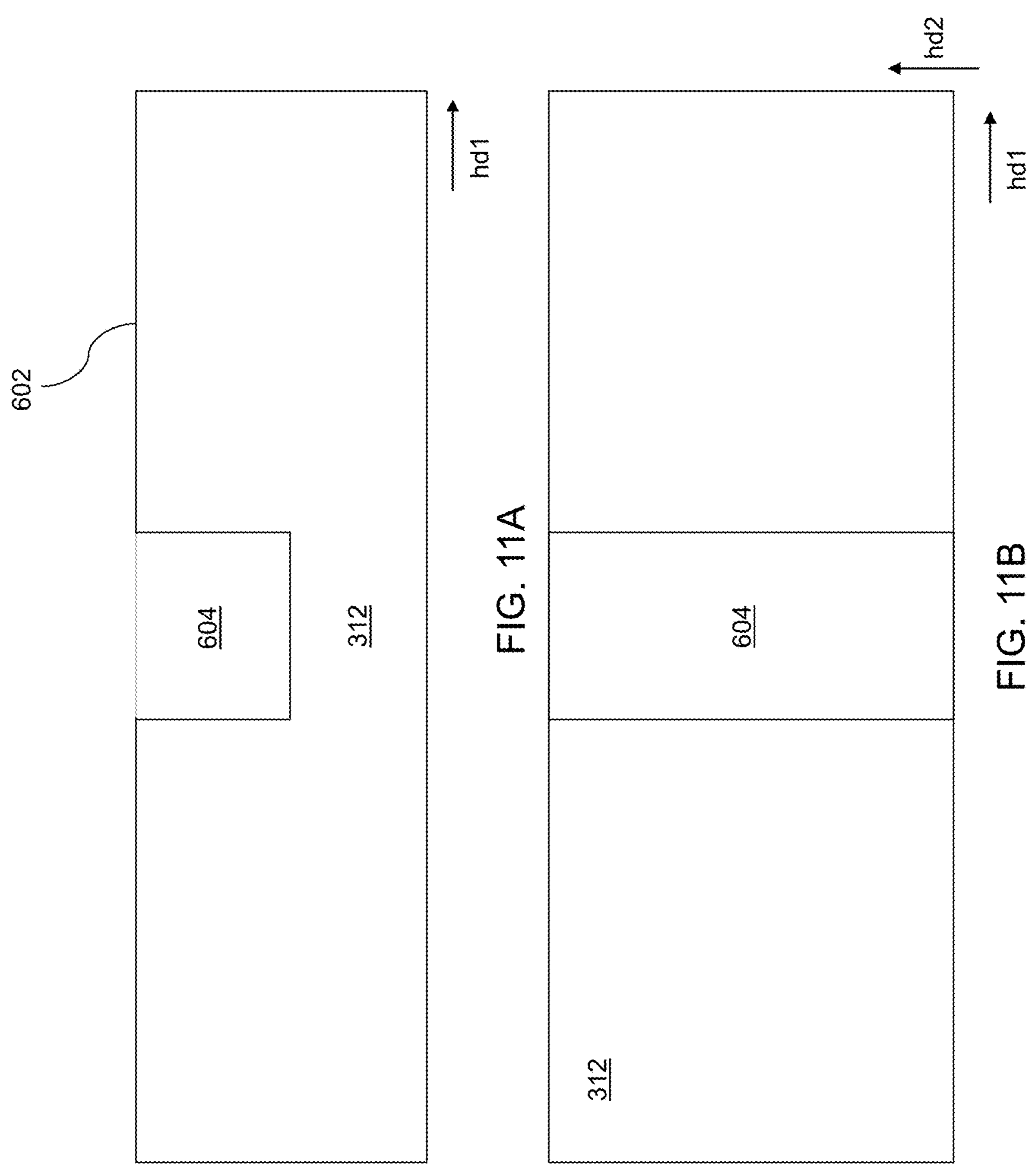
FIG. 11A is a vertical cross-section view of an intermediate structure during a process of forming a PCM switch illustrating a trench formed in a first switch dielectric material layer, according to various embodiments.
FIG. 11B is a top view of the exemplary structure of FIG. 11A.

FIG. 11A is a vertical cross-section view of an exemplary intermediate structure during a process of forming a PCM switch illustrating a trench 604 formed in the first switch dielectric material layer 312, according to various embodiments. FIG. 11B is a top view of the exemplary intermediate structure of FIG. 11A. A patterned photoresist or hard mask (not shown) may be formed over a top surface of the first switch dielectric material layer 312. An anisotropic etch process, such as a reactive ion etch process, may then be performed to etch a portion of the dielectric material layer 312 exposed through an opening in the patterned photoresist or hard mask. As shown in FIGS. 11A and 11B, the trench 604 may have a rectangular cross-sectional shape in a plane extending along second horizontal direction hd2, including a horizontal bottom surface and vertically-extending sidewalls. However, it will be understood that the trench 604 may have a different cross-sectional shape, such as a trapezoidal cross-section shape, and the sidewalls of the trench may include angled or curved surfaces. Following the etching process, the patterned photoresist or hard mask may be removed using a suitable process, such as via ashing or dissolution using a solvent.

Figures 12A, 12B:
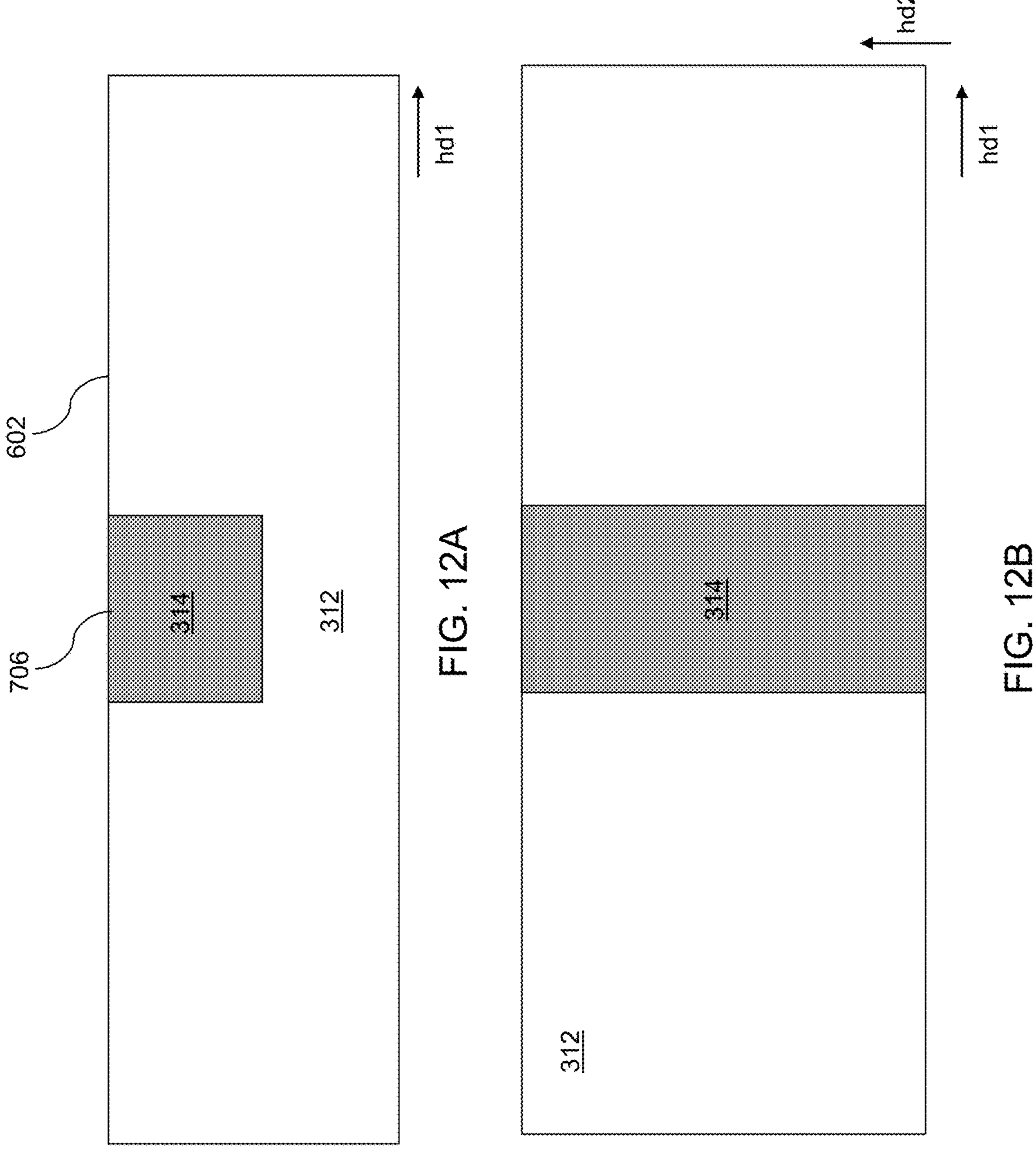
FIG. 12A is a vertical cross-section view of a further intermediate structure during a process of forming a PCM switch illustrating a heater pad embedded within the first switch dielectric material layer, according to various embodiments.
FIG. 12B is a top view of the intermediate structure of FIG. 12A.

FIG. 12A is a vertical cross-section view of an exemplary intermediate structure during a process of forming a PCM switch illustrating a heater pad 314 embedded within the first switch dielectric material layer 312, according to various embodiments. FIG. 12B is a top view of the exemplary intermediate structure of FIG. 12A. The exemplary intermediate structure of FIGS. 12A and 12B may be formed from the exemplary intermediate structure of FIGS. 11A and 11B by forming the heater pad 314 that may fill the trench 604 in the first switch dielectric material layer 312. In this regard, a continuous heater material layer (not shown) may be formed over the upper surface 602 of the first switch dielectric material layer 312 and within the trench 604 of FIGS. 11A and 11B, according to various embodiments. The continuous heater material layer may include a refractory metal, such as tungsten, a conductive metallic nitride material, such as tungsten nitride or titanium nitride, and/or a nickel silicide. Other suitable materials for the continuous heater material layer are within the contemplated scope of disclosure. The continuous heater material layer may be deposited using a suitable deposition process, such as physical vapor deposition (PVD), sputtering, chemical vapor deposition (CVD), atomic layer deposition (ALD), plasma-enhanced chemical vapor deposition (PECVD), electrochemical deposition, or combinations thereof.

A planarization process, such as a chemical mechanical planarization (CMP) process may then be performed to remove the continuous heater material layer from over the upper surface 602 of the first switch dielectric material layer 312 so that the upper surface 706 of the heater pad 314 and the upper surface 602 of the first switch dielectric material layer 312 are substantially co-planar. The first switch dielectric material layer 312 may surround the heater pad 314 over the bottom surface and lateral side surfaces of the heater pad 314, as shown in FIG. 12A. After planarization, the heater pad 314 may have a thickness from 30 nm to 200 nm.

Figure 13:
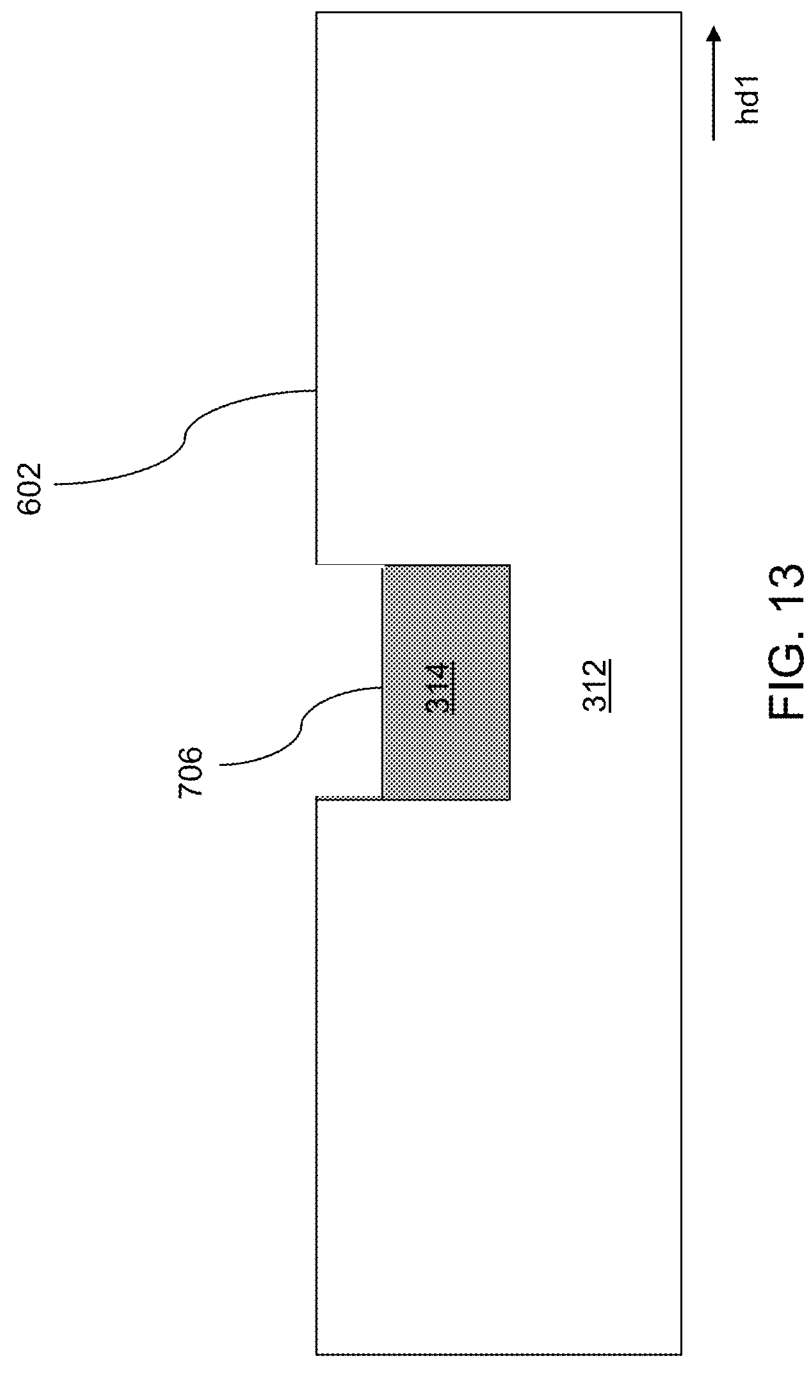
FIG. 13 is a vertical cross-section view of a further intermediate structure during a process of forming a PCM switch illustrating the upper surface of the heater pad vertically recessed with respect to the upper surface of the first switch dielectric material layer, according to various embodiments.

FIG. 13 is a vertical cross-section view of an exemplary intermediate structure during a process of forming a PCM switch illustrating the upper surface 706 of the heater pad 314 vertically recessed with respect to the upper surface 602 of the first switch dielectric material layer 312, according to various embodiments. Referring to FIG. 13, an etching process may be performed that may selectively etch the material of the heater pad 314 relative to the material of the first switch dielectric material layer 312. For example, a masking material (not shown) may be deposited over the first switch dielectric material layer 312 such that the heater pad 314 may be etched without etching the first switch dielectric material layer 312. Following the etching process, the upper surface 706 of the heater pad 314 may be vertically recessed with respect to the upper surface 602 of the first switch dielectric material layer 312. In various embodiments, the upper surface 706 of the heater pad 314 may be vertically recessed with respect to the upper surface 602 of the first switch dielectric material layer 312 by at least about 20 nm, such as 20 nm to 100 nm, including from 30 nm to 60 nm, although lesser and greater recess distances may also be used.

Figures 14A, 14B:
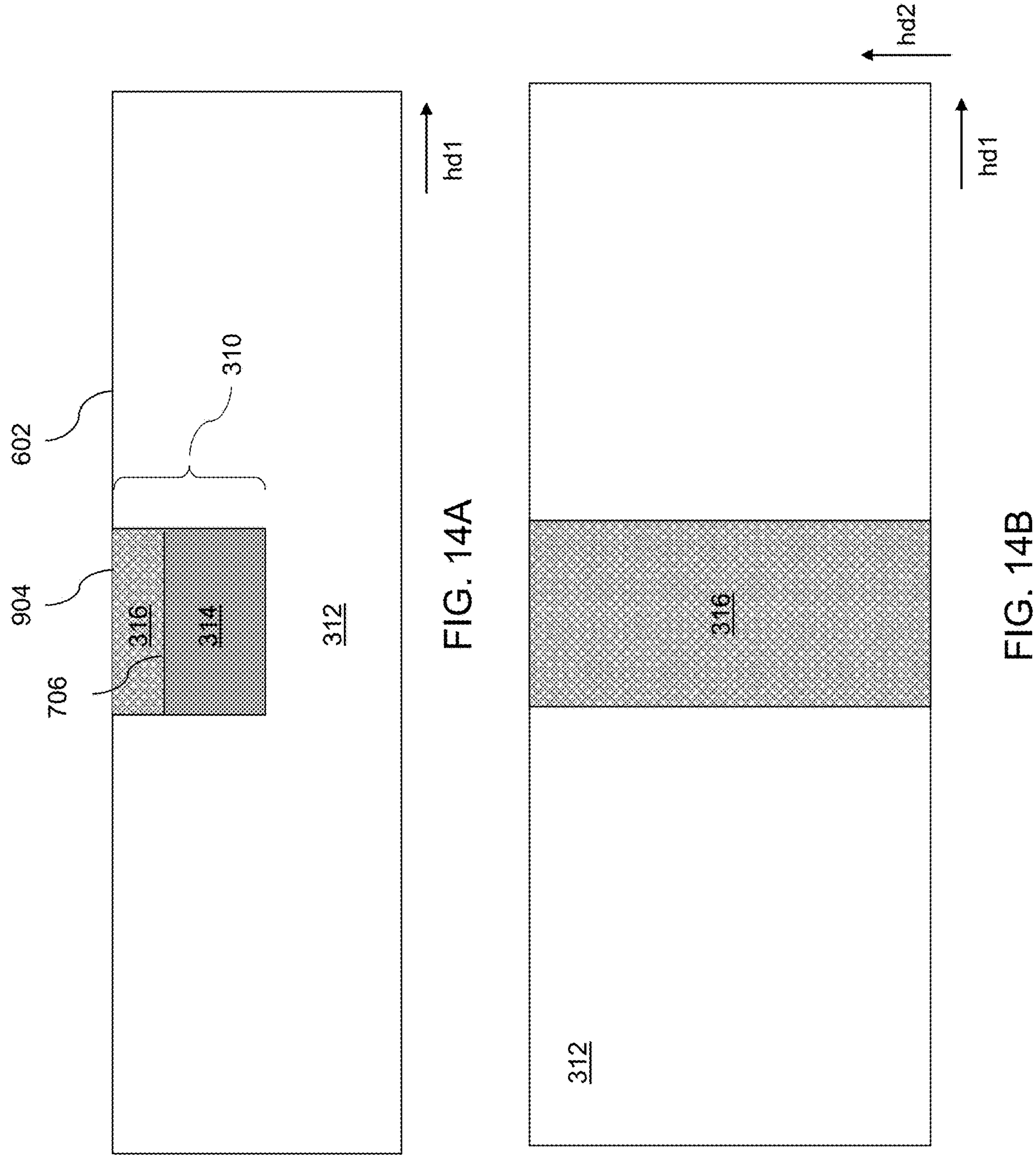
FIG. 14A is a vertical cross-section view of a further intermediate structure during a process of forming a PCM switch illustrating a dielectric capping layer over the heater pad, according to various embodiments.
FIG. 14B is a top view of the intermediate structure of FIG. 14A.

FIG. 14A is a vertical cross-section view of an exemplary intermediate structure during a process of forming a PCM switch illustrating a dielectric capping layer 316 over the heater pad 314, according to various embodiments. FIG. 14B is a top view of the exemplary intermediate structure of FIG. 14A. In this regard, a continuous dielectric capping layer (not shown) may be deposited over the upper surface 602 of the first switch dielectric material layer 312 and over the vertically-recessed upper surface 706 of the heater pad 314. A planarization process, such as a chemical mechanical planarization (CMP) process may be used to remove portions of the continuous dielectric capping layer from over the upper surface 602 of the first switch dielectric material layer 312 to generate the discrete dielectric capping layer 316. After the planarization process, the dielectric capping layer 316 may have a thickness from 10 nm to 100 nm.

The dielectric capping layer 316 may include a material having relatively high thermal conductivity and good electrical isolation characteristics, such as silicon nitride, silicon carbide, silicon carbide nitride, aluminum nitride, etc. Other suitable materials for the continuous dielectric material layer are within the contemplated scope of disclosure. The continuous dielectric capping layer may be deposited using a suitable deposition process as described above.

As shown in FIGS. 14A and 14B, for example, the dielectric capping layer 316 may have a strip-shape and may extend in a second horizontal direction hd2 over the upper surface 706 of the heater pad 314. The first switch dielectric material layer 312 may surround the dielectric capping layer 316 along lateral side surfaces of the first switch dielectric material layer 312. The upper surface 904 of the dielectric capping layer 316 may be coplanar with the upper surface 602 of the first switch dielectric material layer 312.

Further, as shown in FIGS. 14A and 14B, the dielectric capping layer 316 may be laterally confined along a first horizontal direction hd1 such that side surfaces of the dielectric capping layer 316 and side surfaces of the underlying heater pad 314 may form a first and second continuous surface extending along a second horizontal direction hd2. The first continuous surface and the second continuous surface may each contact the first switch dielectric material layer 312. In the embodiment shown in FIGS. 14A and 14B, the first continuous surface and the second continuous surface are each vertical surfaces, although it will be understood that the first continuous surface and the second continuous surface may be angled or curved surfaces that conform to the shape of the trench 604 (see FIGS. 11A and 11B) previously formed in the first switch dielectric material layer 312.

Figure 15:
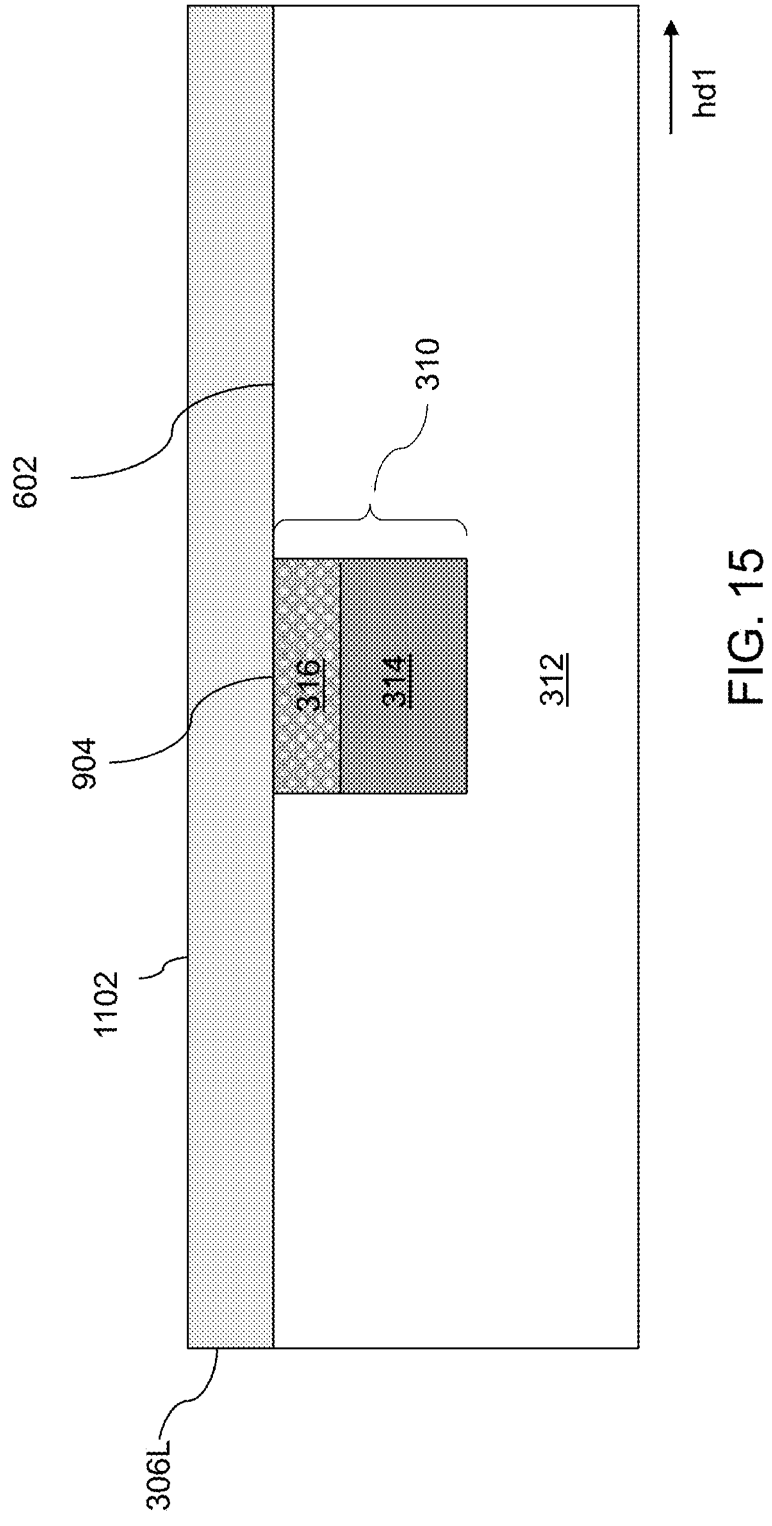
FIG. 15 is a vertical cross-section view of a further intermediate structure during a process of forming a PCM switch showing a continuous phase change material (PCM) layer formed over the upper surface of the first switch dielectric material layer and over the upper surface of the second dielectric material layer, according to various embodiments.

FIG. 15 is a vertical cross-section view of an exemplary intermediate structure during a process of forming a PCM switch showing a continuous phase change material (PCM) layer 306L formed over the upper surface 602 of the first switch dielectric material layer 312 and over the upper surface 904 of the dielectric capping layer 316, according to various embodiments. The continuous PCM layer 306L may be deposited over the upper surface of the first switch dielectric material layer 312 and over the upper surface 904 of the dielectric capping layer 316 using a suitable deposition process as described above. The continuous PCM layer 306L may include a suitable phase change material having at least two distinct phases providing different resistivity, such as a high resistivity amorphous phase and a low resistivity crystalline phase.

Suitable phase change materials for the continuous PCM layer 306L may include, without limitation, germanium telluride compounds, antimony telluride compounds, germanium antimony telluride (GST) compounds such as Ge2Sb2Te5 or GeSb2Te4, germanium antimony compounds, indium germanium telluride compounds, aluminum selenium telluride compounds, indium selenium telluride compounds, and/or aluminum indium selenium telluride compounds. In some embodiments, the phase change material may be doped using a suitable dopant, such as indium or antimony, or the phase change material may be undoped. Other suitable materials for the continuous PCM layer 306L are within the contemplated scope of disclosure. In various embodiments, the PCM layer 306L may have a thickness from 30 nm to 150 nm.

Figures 16A, 16B:
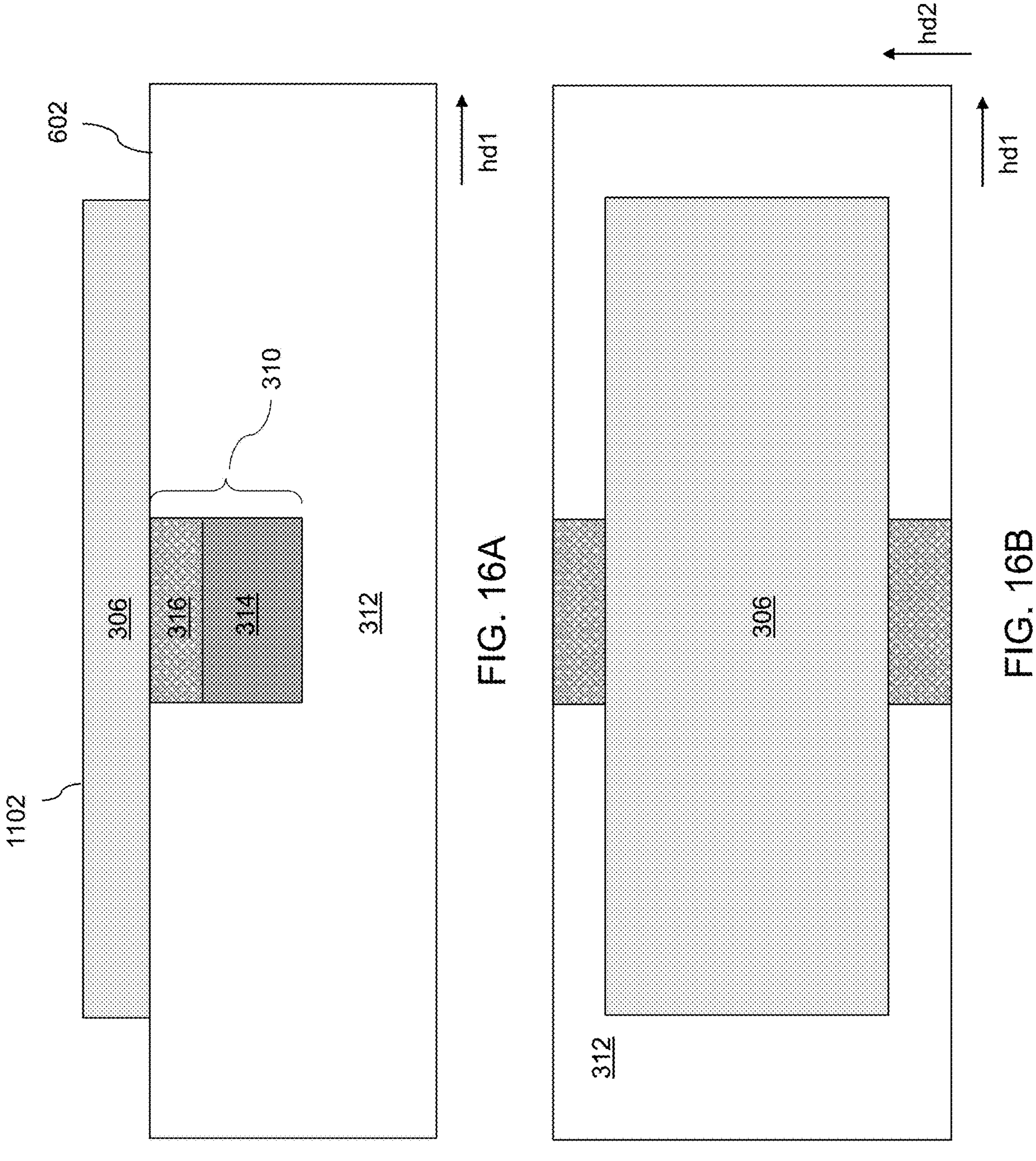
FIG. 16A is a vertical cross-section view of a further intermediate structure during a process of forming a PCM switch illustrating a discrete PCM layer over the upper surface of the first switch dielectric material layer and the upper surface of the dielectric capping layer, according to various embodiments.
FIG. 16B is a top view of the intermediate structure of FIG. 16A.

FIG. 16A is a vertical cross-section view of an exemplary intermediate structure during a process of forming a PCM switch illustrating a discrete phase change material element 306 over the upper surface 602 of the first switch dielectric material layer 312 and the upper surface 904 of the dielectric capping layer 316, according to various embodiments. FIG. 16B is a top view of the exemplary intermediate structure of FIG. 16A. The phase change material element 306 may be formed by performing an etching process, such as an anisotropic etching process, to remove portions of the continuous PCM layer 306L of FIG. 15. In this regard, a patterned mask (not shown) may be formed by depositing a layer of photoresist over the upper surface 1102 of the continuous PCM layer 306L, and lithographically patterning the photoresist to provide the patterned mask.

The patterned mask may cover a portion of the continuous PCM layer 306L overlying the dielectric capping layer 316 and the heater pad 314. The portion of the patterned mask overlying the dielectric capping layer 316 and the heater pad 314 may have a greater lateral dimension along a first horizontal direction hd1 than the dielectric capping layer 316 and the heater pad 314 along a first horizontal direction hd1 and may have a lesser lateral dimension than the dielectric capping layer 316 and the heater pad 314 along a second horizontal direction hd2 that is perpendicular to the first horizontal direction hd1.

The etching process may expose the upper surface 602 of the first switch dielectric material layer 312 and the upper surface 904 of the dielectric capping layer 316 surrounding the phase change material element 306. In various embodiments, the phase change material element 306 may have a greater lateral dimension along the first horizontal direction hd1 than the dielectric capping layer 316 and the heater pad 314 and may have a lesser lateral dimension than the dielectric capping layer 316 and the heater pad 314 along the second horizontal direction hd2 (e.g., see FIGS. 16A and 16B). Following the etching process, the patterned mask may be removed using a suitable process, such as via ashing or dissolution using a solvent.

Figures 17A, 17B:
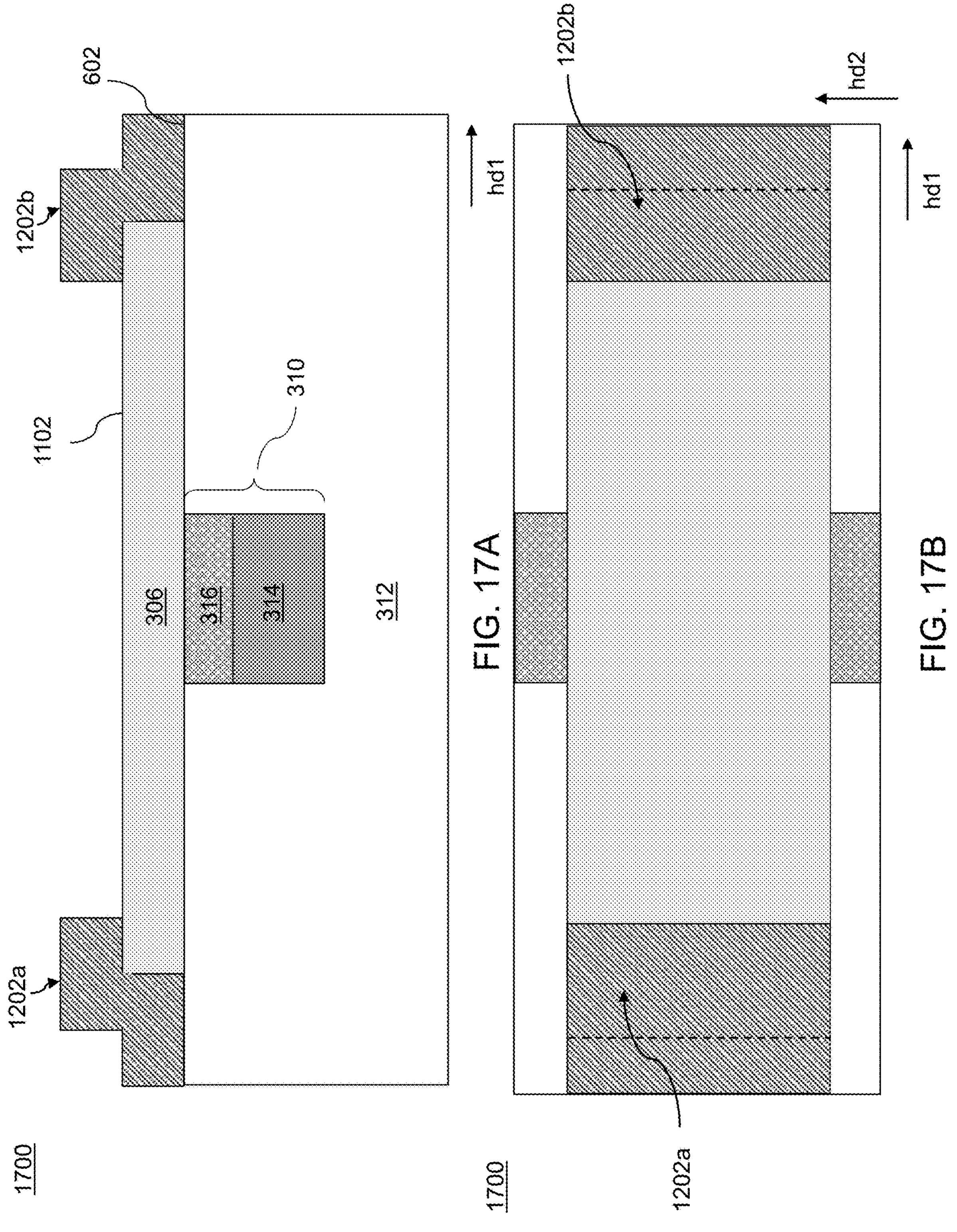
FIG. 17A is a vertical cross-section view of a PCM switch including first and second electrodes and over the upper surface of the first switch dielectric material layer and the upper surface and side surfaces of the PCM layer.
FIG. 17B is a top view of the PCM switch of FIG. 17A.

FIG. 17A is a vertical cross-section view of a PCM switch 2200 including a first electrode 1202*a* and a second electrode 1202*b* formed over the upper surface 602 of the first switch dielectric material layer 312 and the upper surface 1102 and side surfaces of the phase change material element 306. FIG. 17B is a top view of the PCM switch 2200 of FIG. 17A. The PCM switch 2200 may be formed by deposition of a continuous electrode layer (not shown) followed by etching the continuous electrode layer to form the first electrode 1202*a* and a second electrode 1202*b*. In various embodiments, the first electrode 1202*a* and the second electrode 1202*b* may be electrically connected to the first RF conductor 304*a* and the second RF conductor, respectively (e.g., see FIGS. 3A and 4A).

The continuous electrode layer (not shown) may be formed by depositing an electrically conductive material over the exposed upper surfaces of the first switch dielectric material layer 312 and the dielectric capping layer 316 and over the upper surface and side surfaces of the phase change material element 306. The continuous electrode layer may include a metallic material having relatively low electrical resistivity, such as tungsten, tungsten nitride, nickel silicide, and/or aluminum. Other suitable materials for the continuous electrode layer are within the contemplated scope of disclosure. The continuous electrode layer may be deposited using a suitable deposition process as described above.

A patterned mask (not shown) may then be formed over the continuous electrode layer by depositing a layer of photoresist over the continuous electrode layer, and lithographically patterning the photoresist to provide the patterned mask. The patterned mask may expose a region of the continuous electrode layer that overlies the heater pad 314 and the dielectric capping layer 316 and may cover portions of the continuous electrode layer that overlie peripheral regions of the phase change material element 306 on opposite sides of the phase change material element 306.

An etching process, such as an anisotropic etching process, may then be performed to remove portions of the continuous electrode layer that are exposed through the patterned mask and to generate discrete the first electrode 1202*a* and the second electrode 1202*b* over the upper surface 602 of the first switch dielectric material layer 312 and the upper surface 1102 and side surfaces of the phase change material element 306. The etching process may expose a portion of the upper surface 1102 of the phase change material element 306 between the first electrode 1202*a* and the second electrode 1202*b*. According to various embodiments, the first electrode 1202*a* and the second electrode 1202*b* may have a thickness from 30 nm to 200 nm.

Figure 18:
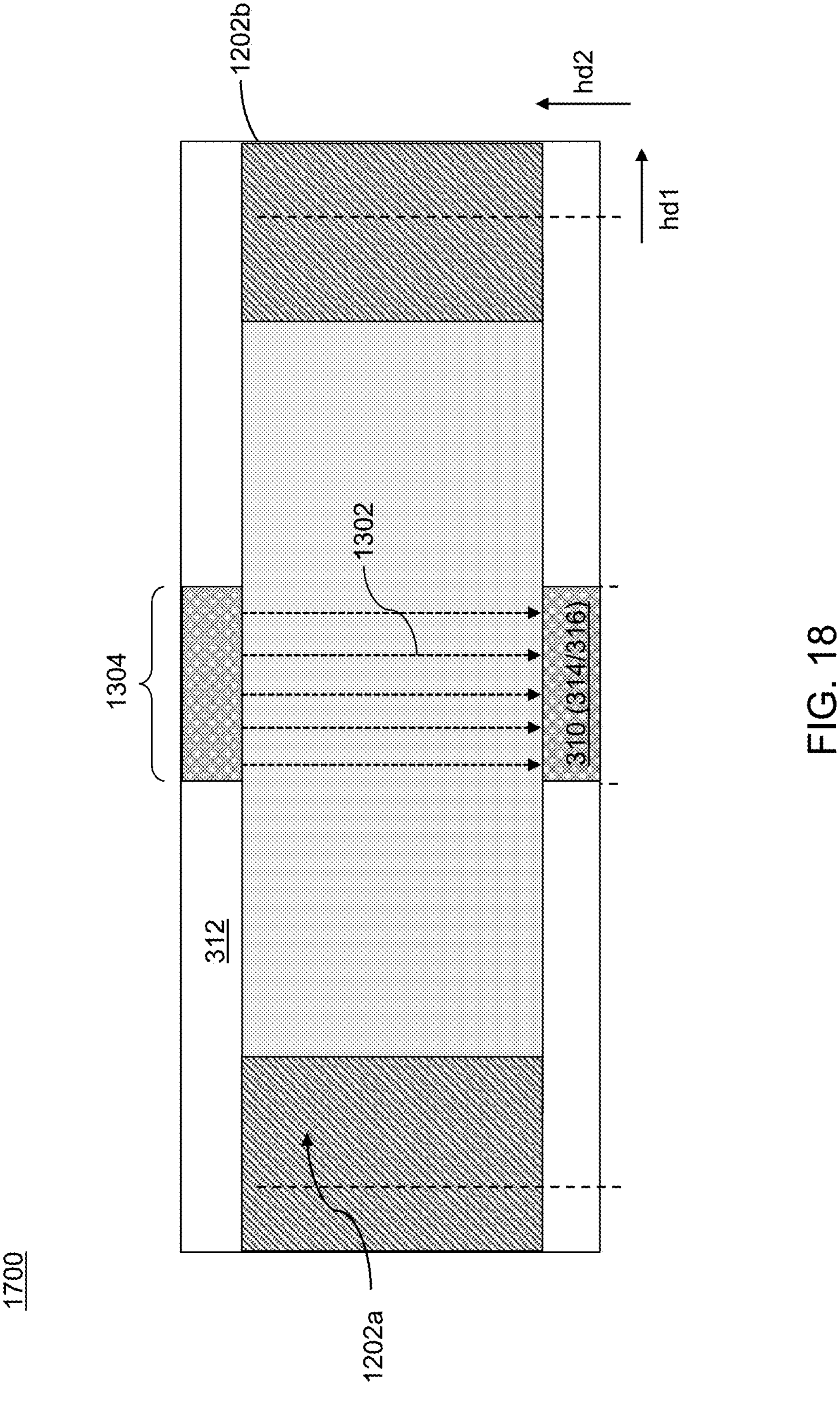
FIG. 18 is a top view of a PCM switch schematically illustrating a process of switching the PCM switch between different resistivity states, according to various embodiments.

FIG. 18 is a top view of the PCM switch 2200 schematically illustrating a process of switching the PCM switch 2200 between different resistivity states, according to various embodiments. Referring to FIG. 18, a bias voltage may be selectively applied across the heater pad 314 through electrical connections between the heating element 310 and the first heater pad 308*a* and the second heater pad 308*b* (e.g., see FIG. 3A). The application of the bias voltage across the heater pad 314 may induce a current to flow through the heater pad 314 and beneath the phase change material element 306, as schematically indicated by arrows 1302 in FIG. 18. The current flow through the heater pad 314 causes the heating pad to heat up via resistive heating. A portion of the thermal energy generated in the heater pad 314 may be transferred through the dielectric capping layer 316 to heat the phase change material element 306.

By controlling the characteristics of the current pulse flowing through the heater pad 314, the thermal profile within a portion 1304 of the phase change material element 306 overlying the heater pad 314 (which may also be referred to as the "active region" 1304 of the phase change material element 306) may be controlled. For example, a current pulse having a relatively short pulse width and rapid pulse falling time may quickly heat the active region 1304 of the phase change material element 306 above its melting temperature ($T_{melt}$), causing the active region 1304 of the phase change material element 306 to transition from a low-resistivity state to a high-resistivity state, while the rapid falling time of the current pulse may cause the active region 1304 of the phase change material element 306 to rapidly quench and avoid recrystallization as it cools. Thus, the active region 1304 of the phase change material element 306 may retain its high resistivity state indefinitely following the application of the current pulse.

In contrast, a current pulse having a relatively longer pulse width and longer falling time may heat the active region 1304 of the phase change material element 306 to a temperature above its crystallization temperature ($T_{crys}$), but below its melting temperature ($T_{melt}$), causing the active region 1304 of the phase change material element 306 to undergo crystal nucleation, while the long falling time of the current pulse may promote crystal growth in the active region 1304 of the phase change material element 306 as it gradually cools, thereby causing the active region 1304 of the phase change material element 306 to transition from a high-resistivity state to a low-resistivity state. The active region 1304 of the phase change material element 306 may retain this low resistivity state indefinitely until the application of a subsequent current pulse that is configured to transition the active region 1304 to a high-resistivity state.

In some embodiments, the first heater pad 308*a* and the second heater pad 308*b* that are connected to the heater pad 314 may be electrically coupled to control circuitry configured to selectively control the application of current pulses through the heater pad 314 and thereby control (i.e., program) the resistance state of the active region 1304 of the phase change material element 306. For example, one or both of first heater pad 308*a* and the second heater pad 308*b* may be coupled to one or more transistors 603*a*-603*c* by metal interconnect structures 40 as shown in FIG. 10D.

Figure 19:
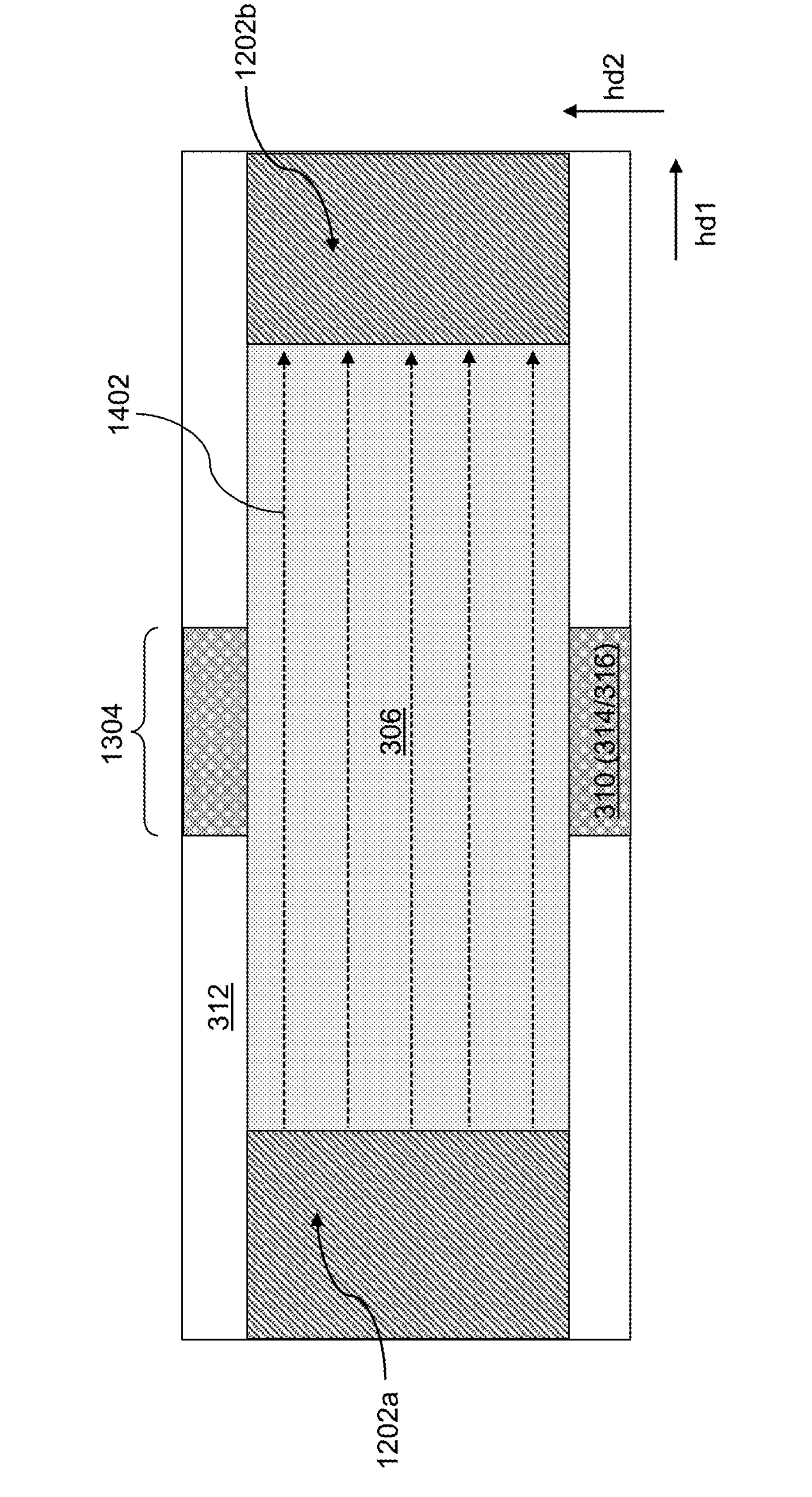
FIG. 19 is a top view of a PCM switch schematically illustrating a signal pathway across the PCM switch according to an embodiment of the present invention.

FIG. 19 is a top view of a PCM switch 2200 schematically illustrating a signal pathway across the PCM switch 2200 according to various embodiments. In this regard, an input signal, such as a radiofrequency (RF) signal, may be transmitted to the first electrode 1202*a* from the first RF conductor 304*a* (e.g., see FIGS. 3A and 4A). In instances in which the active region 1304 of the phase change material element 306 is in a low-resistivity state, the PCM switch 2200 is "On," (i.e., the PCM switch is closed) and the signal may be transmitted across the phase change material element 306 to the second electrode 1202*b* and to the second RF conductor 304*b* (e.g., see FIGS. 3A and 4A), as schematically indicated by arrows 1402. In instances in which the active region 1304 of the PCM layer 306 is in a high-resistivity state, the PCM switch 2200 is "Off" (i.e., the PCM switch is open) and the signal transmission to the second electrode 1202*b* and to the second RF conductor 304*b* may be blocked.

Figure 20:
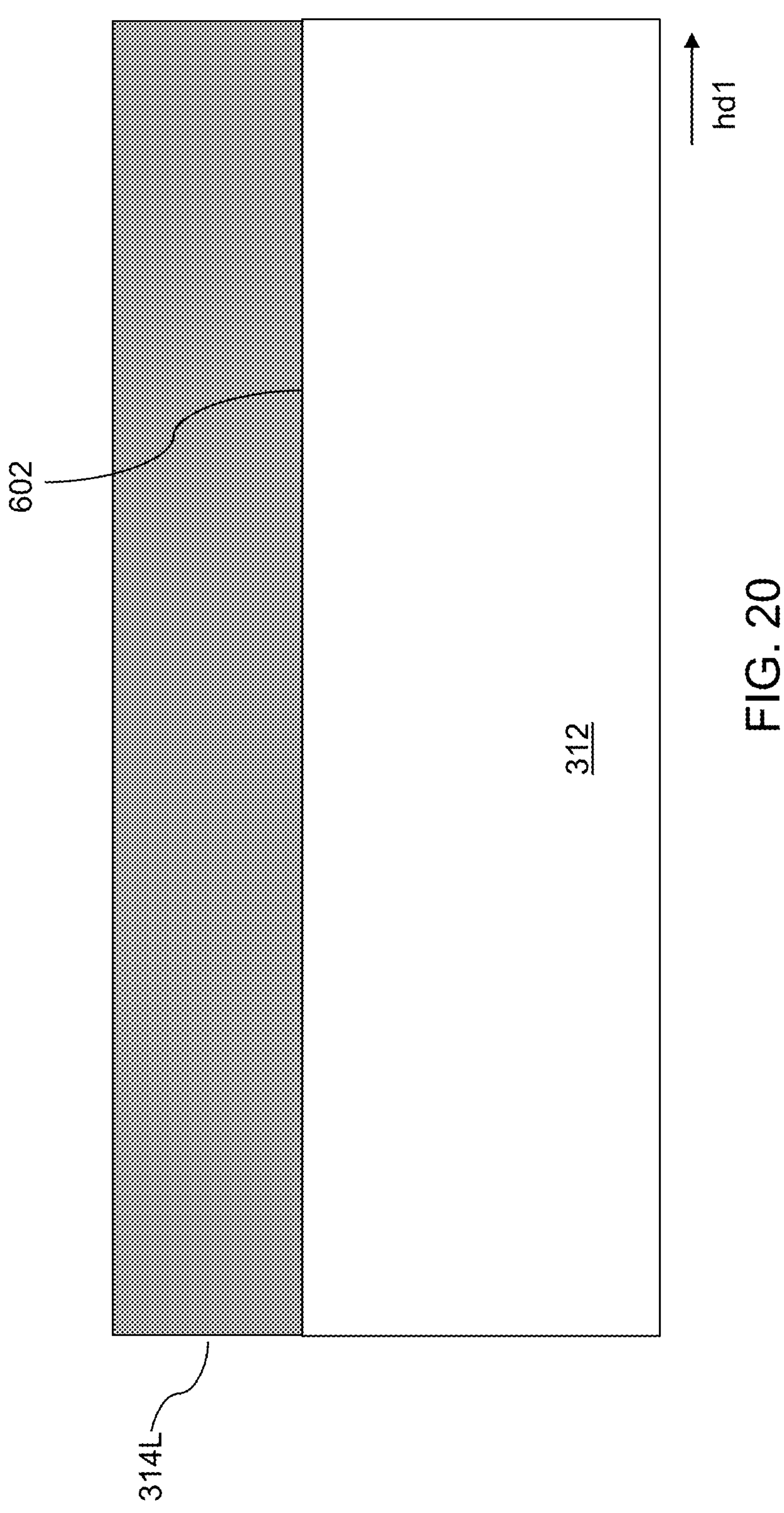
FIG. 20 is a vertical cross-section view of an intermediate structure during a process of forming a PCM switch illustrating a continuous heater material layer deposited over the upper surface of a lower dielectric material layer, according to various embodiments.
Figure 21:
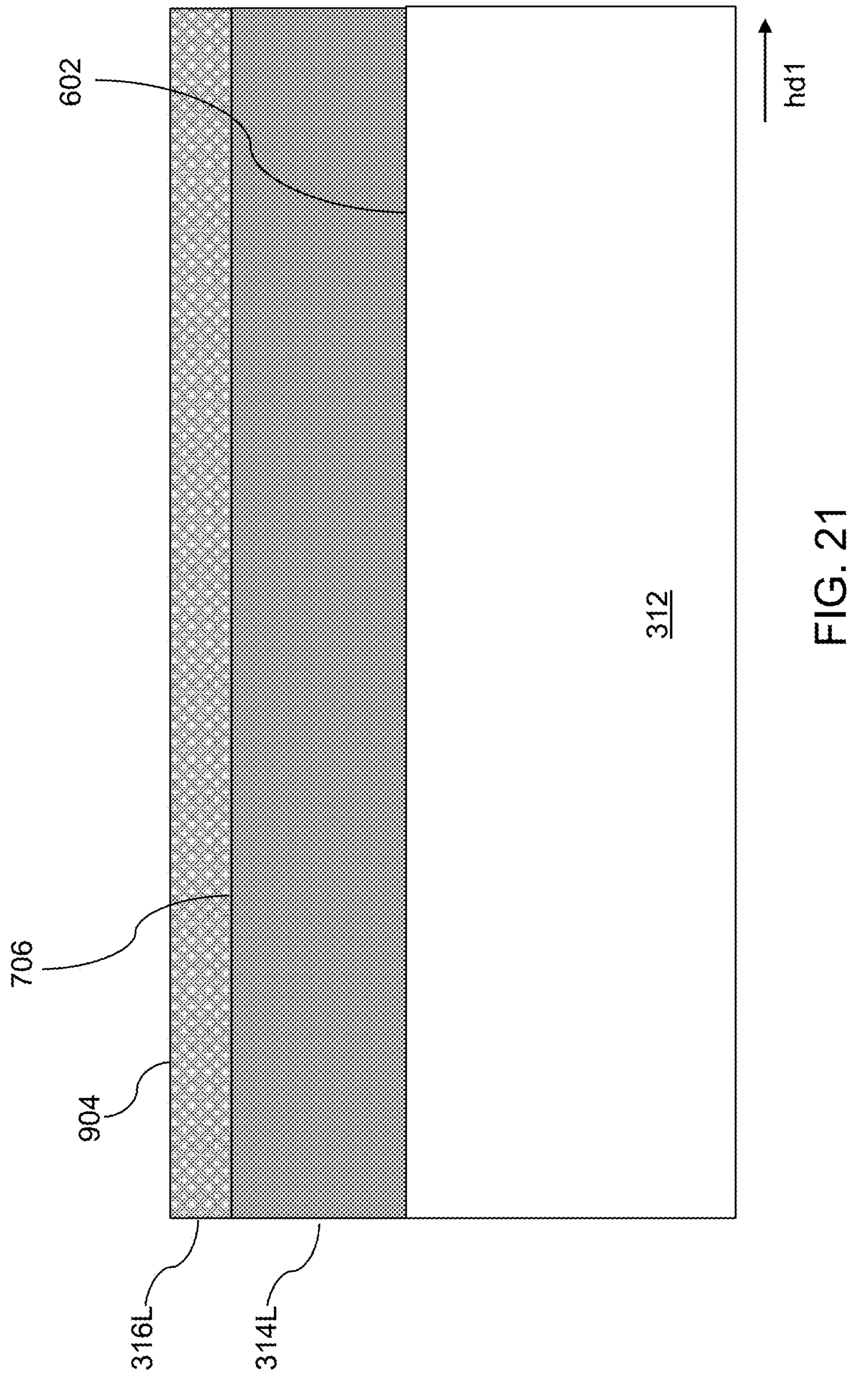
FIG. 21 is a vertical cross-section view of a further intermediate structure during a process of forming a PCM switch illustrating a continuous dielectric capping layer deposited over the upper surface of the continuous heater material layer, according to various embodiments.

FIGS. 20-24 are sequential vertical cross-section views of an exemplary intermediate structure during a process of forming an embodiment PCM switch illustrating an alternative process for forming a heater pad 314 and a laterally-confined dielectric capping layer 316 over the heater pad 314, according to various embodiments. Referring to FIG. 20, a continuous heater material layer 314L may be deposited over the upper surface 602 of the first switch dielectric material layer 312. Unlike in the exemplary intermediate structure shown in FIGS. 11A and 11B, the continuous heater material layer 314L may be deposited over a planar upper surface 602 of the first switch dielectric material layer 312 that does not include a trench in the location of a PCM switch to be subsequently formed. Referring to FIG. 21, a continuous dielectric capping layer 316L may be deposited over the upper surface 706 of the continuous heater material layer 314L.

Figure 22:
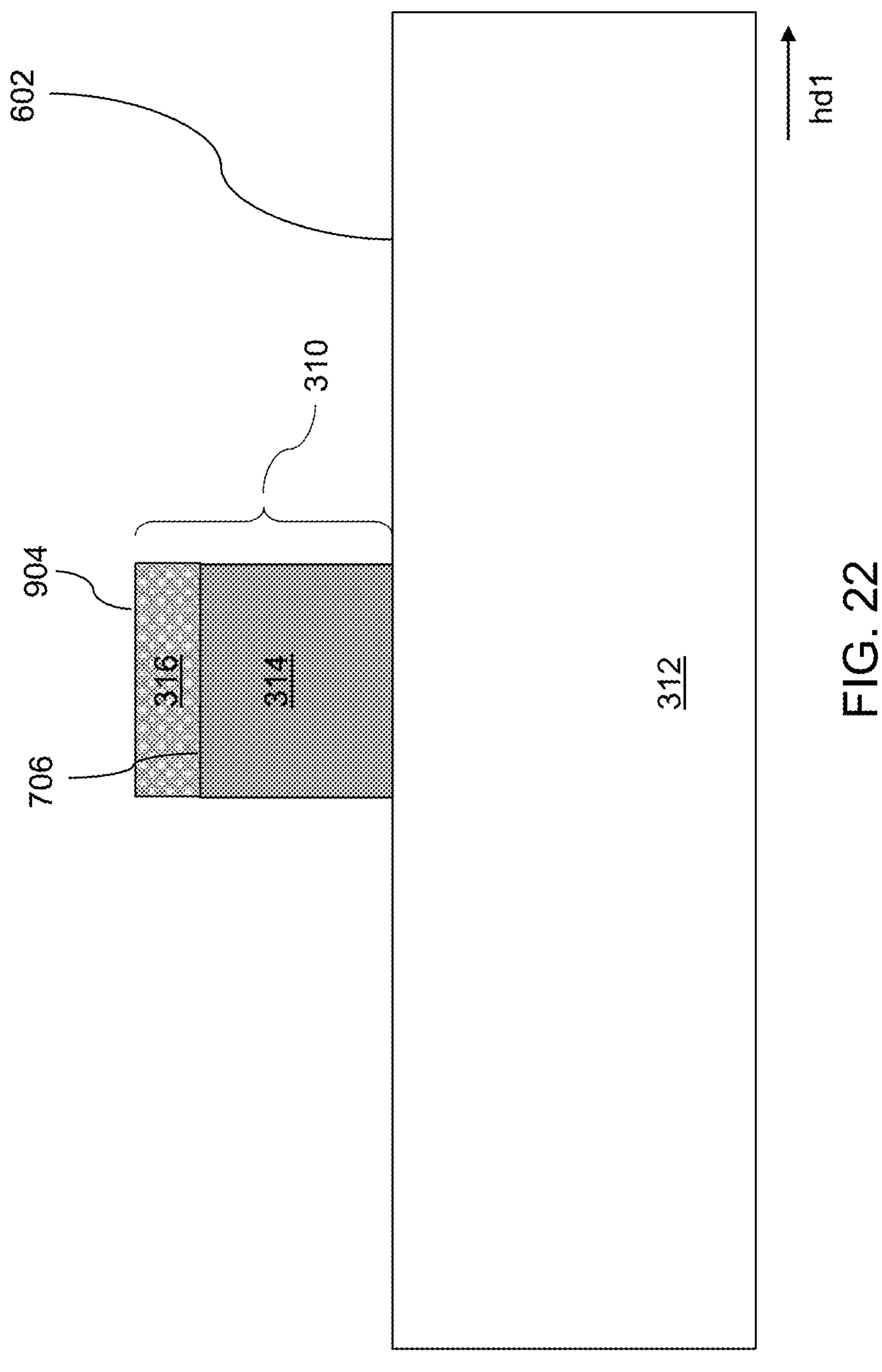
FIG. 22 is a vertical cross-section view of a further intermediate structure during a process of forming a PCM switch illustrating a heater pad formed over the upper surface of the lower dielectric material layer, and a dielectric capping layer over the upper surface of the of the heater pad, according to various embodiments.

FIG. 22 is a vertical cross-section view of an exemplary intermediate structure during a process of forming a PCM switch illustrating a heater pad 314 formed over the upper surface 602 of the first switch dielectric material layer 312, and a dielectric capping layer 316 over the upper surface of the 706 of the heater pad 314, according to various embodiments. In this regard, an etching process may be performed on the exemplary intermediate structure of FIG. 21 to generate the heater pad 314 and the dielectric capping layer 316 over the upper surface of the 706 of the heater pad 314, thereby forming the heating element 310. In this regard, a patterned mask (not shown) may be formed by depositing a layer of photoresist over the upper surface 904 of the continuous dielectric capping layer 316L (e.g., see FIG. 21), and lithographically patterning the photoresist to provide the patterned mask. The patterned mask may cover a portion of the continuous dielectric capping layer 316L corresponding to the location of a heater pad and discrete dielectric capping layer to be subsequently formed. An anisotropic etching process may be performed to etch unmasked portions of the continuous dielectric capping layer 316L and the continuous heater material layer 314L to provide a discrete heater pad 314 over the upper surface 602 of the first switch dielectric material layer 312, and a discrete dielectric capping layer 316 over the upper surface of the 706 of the heater pad 314.

The dielectric capping layer 316 and the heater pad 314 and may be similar to the embodiment shown in FIG. 14A in that side surface of the dielectric capping layer 316 and side surface of the underlying heater pad 314 may form a first continuous surface, and side surface of the dielectric capping layer 316 and side surface of the underlying heater pad 314 may form a second continuous surface. Following the etching process, the patterned mask may be removed using a suitable process, such as via ashing or dissolution using a solvent.

Figure 23:
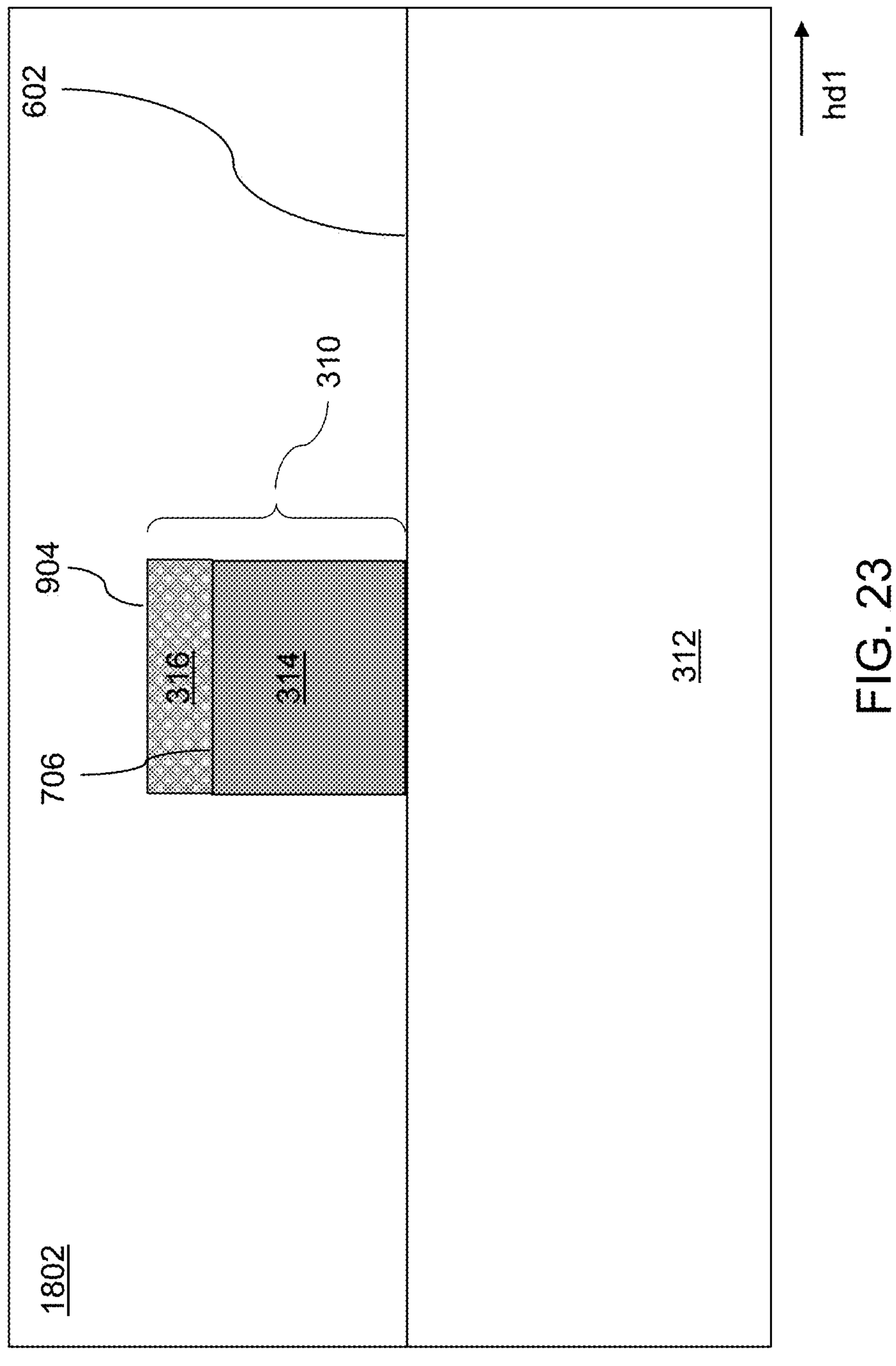
FIG. 23 is a vertical cross-section view of a further intermediate structure during a process of forming a PCM switch illustrating an upper dielectric material layer formed over the upper surface of the lower dielectric material layer, over the side surfaces of the heater pad, and over the upper surface and side surfaces of the dielectric capping layer, according to various embodiments.

FIG. 23 is a vertical cross-section view of an exemplary intermediate structure during a process of forming a PCM switch illustrating an upper dielectric material layer 1802 formed over the upper surface 602 of the first switch dielectric material layer 312, over the side surfaces of the heater pad 314, and over the upper surface 904 and side surfaces and of the dielectric capping layer 316, according to various embodiments. Referring to FIG. 23, the upper dielectric material layer 1802 may include a suitable dielectric material and may be deposited using a suitable deposition process as described above. In some embodiments, the upper dielectric material layer 1802 may have the same composition as the first switch dielectric material layer 312. Alternatively, the upper dielectric material layer 1802 may have a different composition than the first switch dielectric material layer 312.

Figure 24:
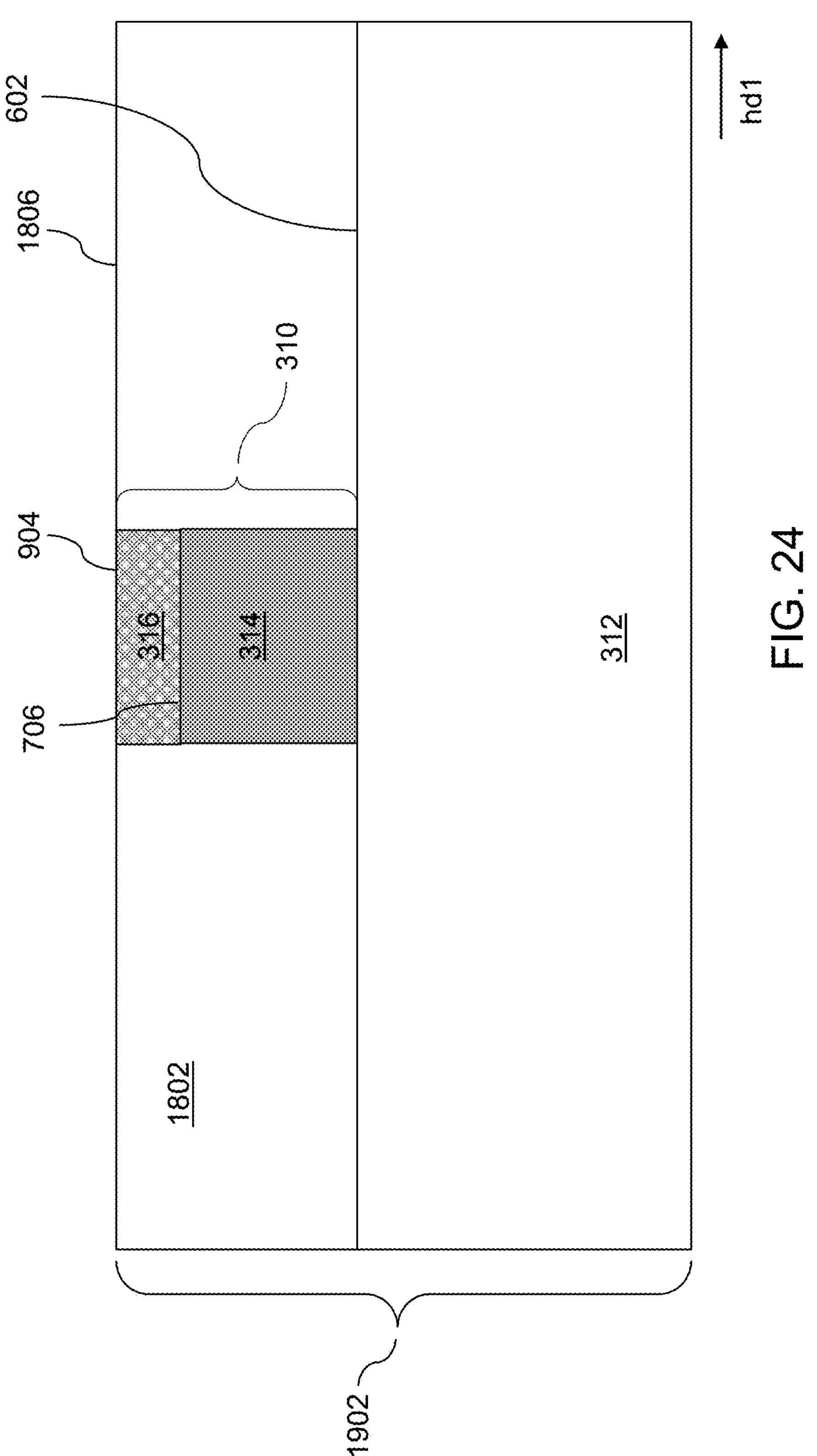
FIG. 24 is a vertical cross-section view of a further intermediate structure during a process of forming a PCM switch following a planarization process that removes a portion of the upper dielectric material layer from over the upper surface of the dielectric capping layer, according to various embodiments.

FIG. 24 is a vertical cross-section view of an exemplary intermediate structure during a process of forming a PCM switch following a planarization process that removes a portion of the upper dielectric material layer 1802 from over the upper surface 904 of the dielectric capping layer 316, according to various embodiments. Referring to FIG. 24, a planarization process, such as a chemical mechanical planarization (CMP) may be used to remove a portion of the upper dielectric material layer 1802 from over the upper surface 904 of the dielectric capping layer 316. Following the planarization process, an upper surface 1806 of the upper dielectric material layer 1802 may be co-planar with the upper surface 904 of the dielectric capping layer 316. The first switch dielectric material layer 312 and the upper dielectric material layer 1802 may together form a second switch dielectric material layer 1902 such as shown in FIG. 24, where the first switch dielectric material layer 312 may contact the lower surface of the heater pad 314 and the upper dielectric material layer 1802 may laterally surround the heater pad 314 and the dielectric capping layer 316. The processing steps described above with reference to FIGS. 15-17B may then be performed to form a PMC switch 2200 in accordance with an embodiment of the present disclosure.

Figure 25:
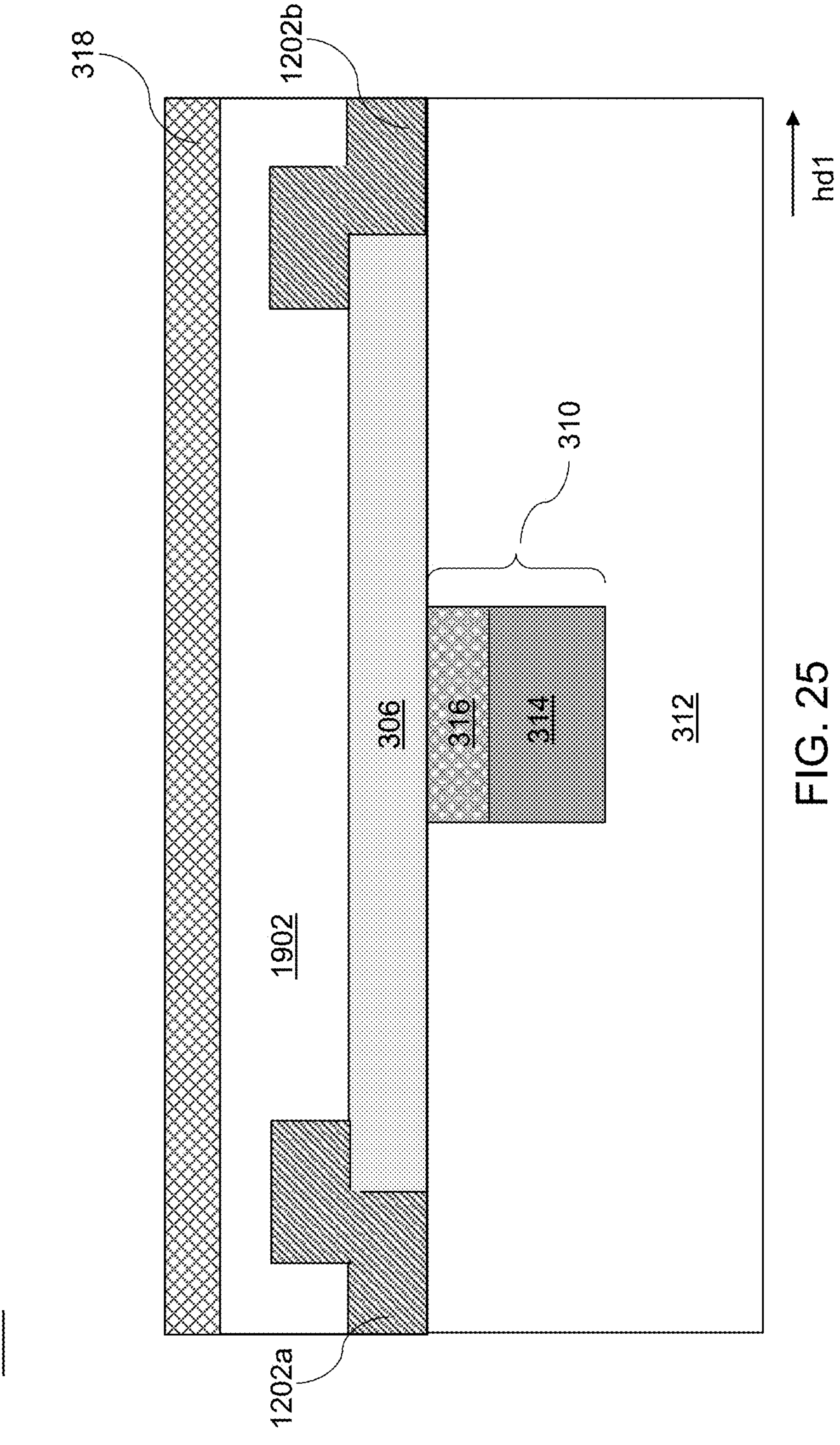
FIG. 25 is a vertical cross-sectional view of a PCM switch including a spreading layer, according to various embodiments.

FIG. 25 is a vertical cross-sectional view of a PCM switch 2500 including a heat spreader 318, according to various embodiments. The PCM switch 2500 may be similar to the PCM switch 400*a* described above with reference to FIG. 4B. The PCM switch 2500 of FIG. 25 may be formed by depositing a second switch dielectric material layer 1902 over the PCM switch 2200 of FIGS. 17A and 17B. In this regard, processing operations described above with reference to FIGS. 15 to 17B may be performed to form the phase change material element 306, the first electrode 1202*a*, and second electrode 1202*b* over a starting structure (e.g., see FIGS. 14A, 14B, and 24). After deposition of the second switch dielectric material layer 1902, a planarization process (e.g., CMP) may then be performed to generate a planar top surface to the second switch dielectric material layer 1902. The heat spreader 318 may then be formed by deposition of a heat-conducting material over the second switch dielectric material layer 1902. For example, the heat conducting material may be a metal or a compound semiconductor (e.g., SiC) having a high thermal conductivity (e.g., >100 W/mK). The heat spreader 318 may be configured to remove heat from the PCM element during a cool-down phase after a switching event (e.g., switching from insulating to conducting or from conducting to insulating), as described above.

Figure 26:
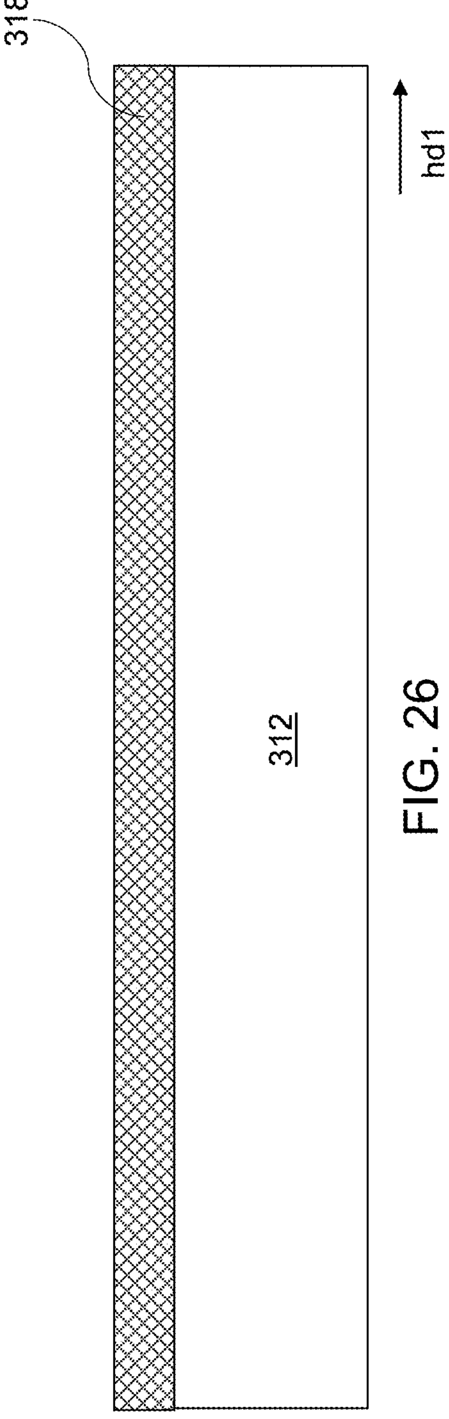
FIG. 26 is a vertical cross-sectional view of an intermediate structure that may be used in the formation of a PCM switch including a spreading layer, according to various embodiments.
Figure 27:
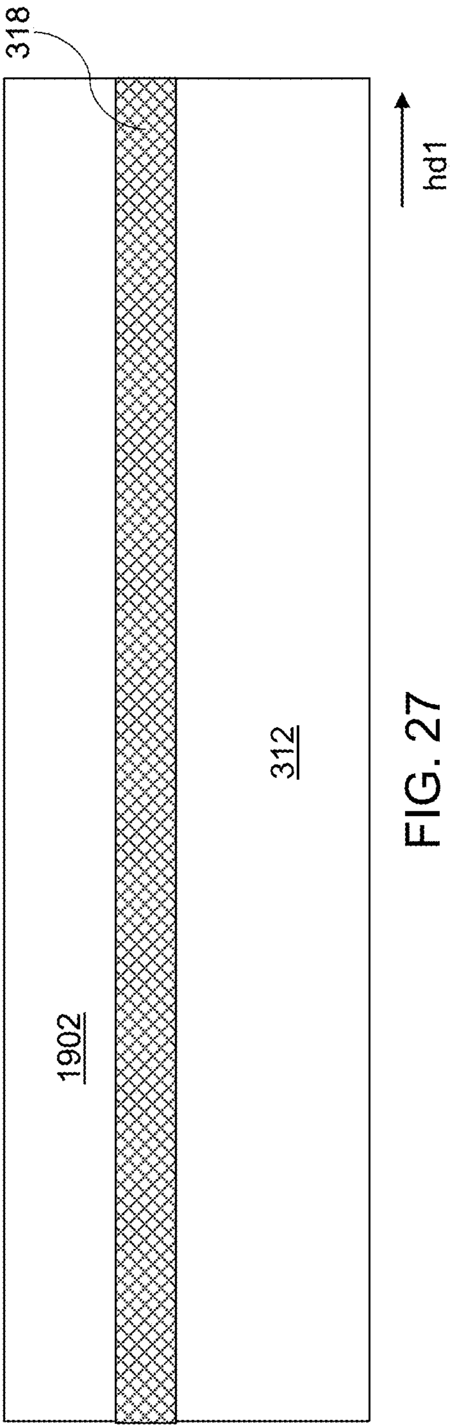
FIG. 27 is a vertical cross-sectional view of a further intermediate structure that may be used in the formation of a PCM switch including a spreading layer, according to various embodiments.
Figure 28:
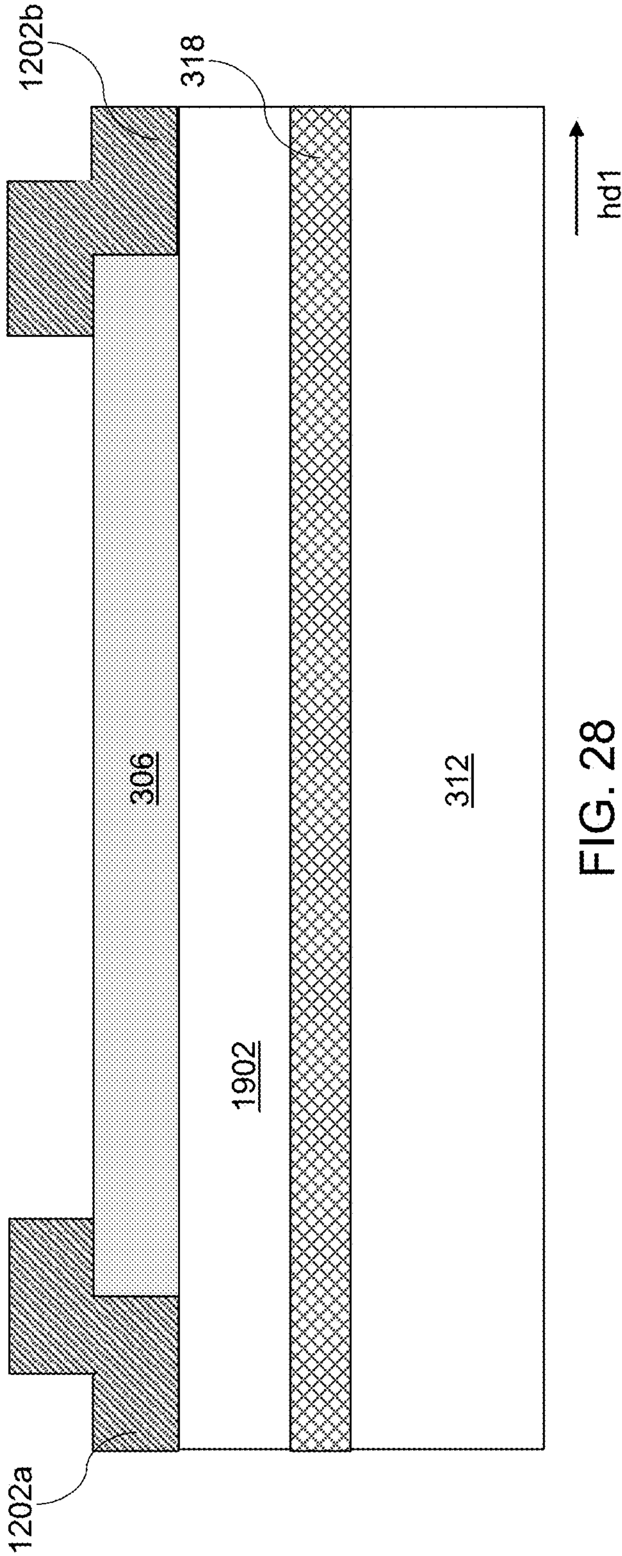
FIG. 28 is a vertical cross-sectional view of a further intermediate structure that may be used in the formation of a PCM switch including a spreading layer, according to various embodiments.
Figure 29:
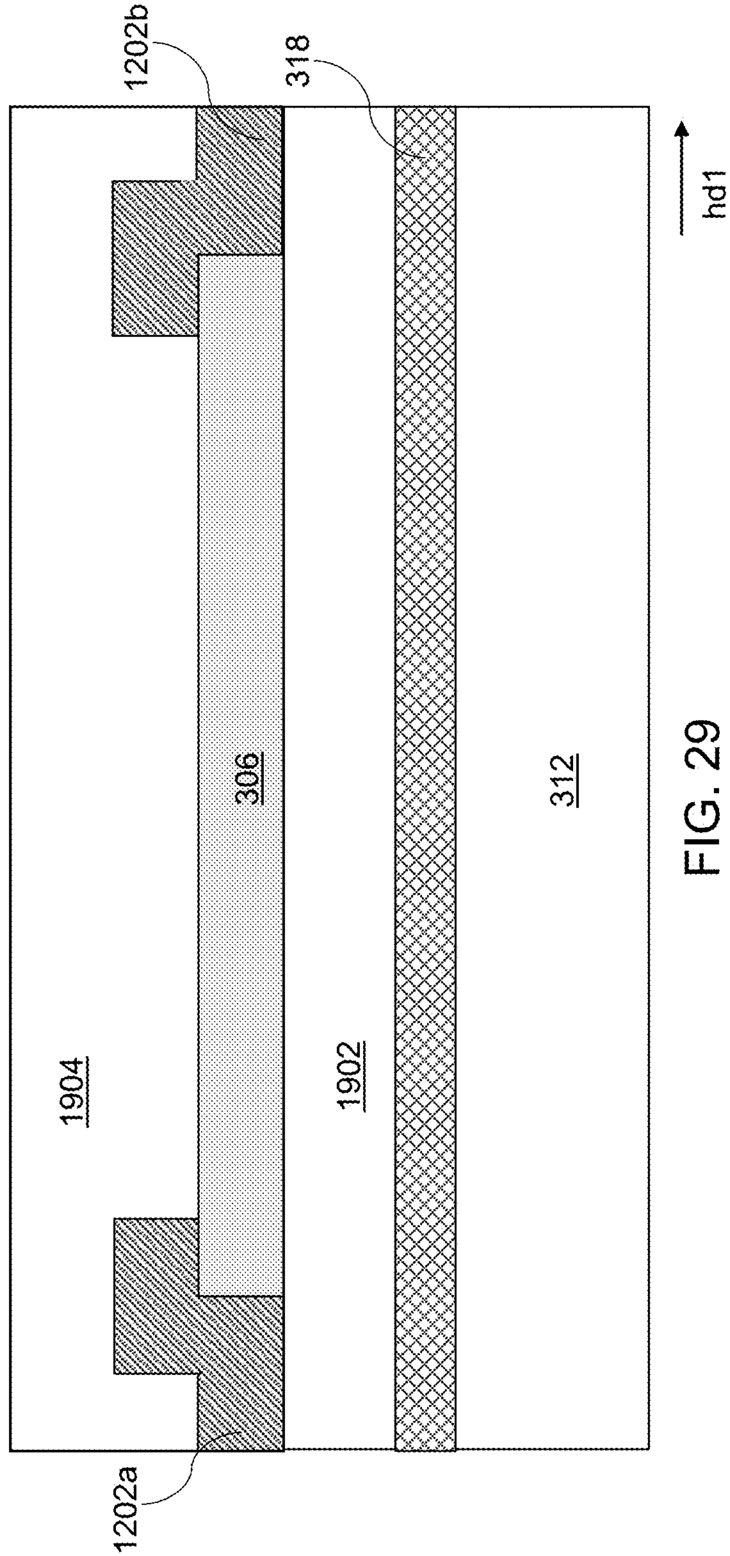
FIG. 29 is a vertical cross-sectional view of a further intermediate structure that may be used in the formation of a PCM switch including a spreading layer, according to various embodiments.
Figure 30:
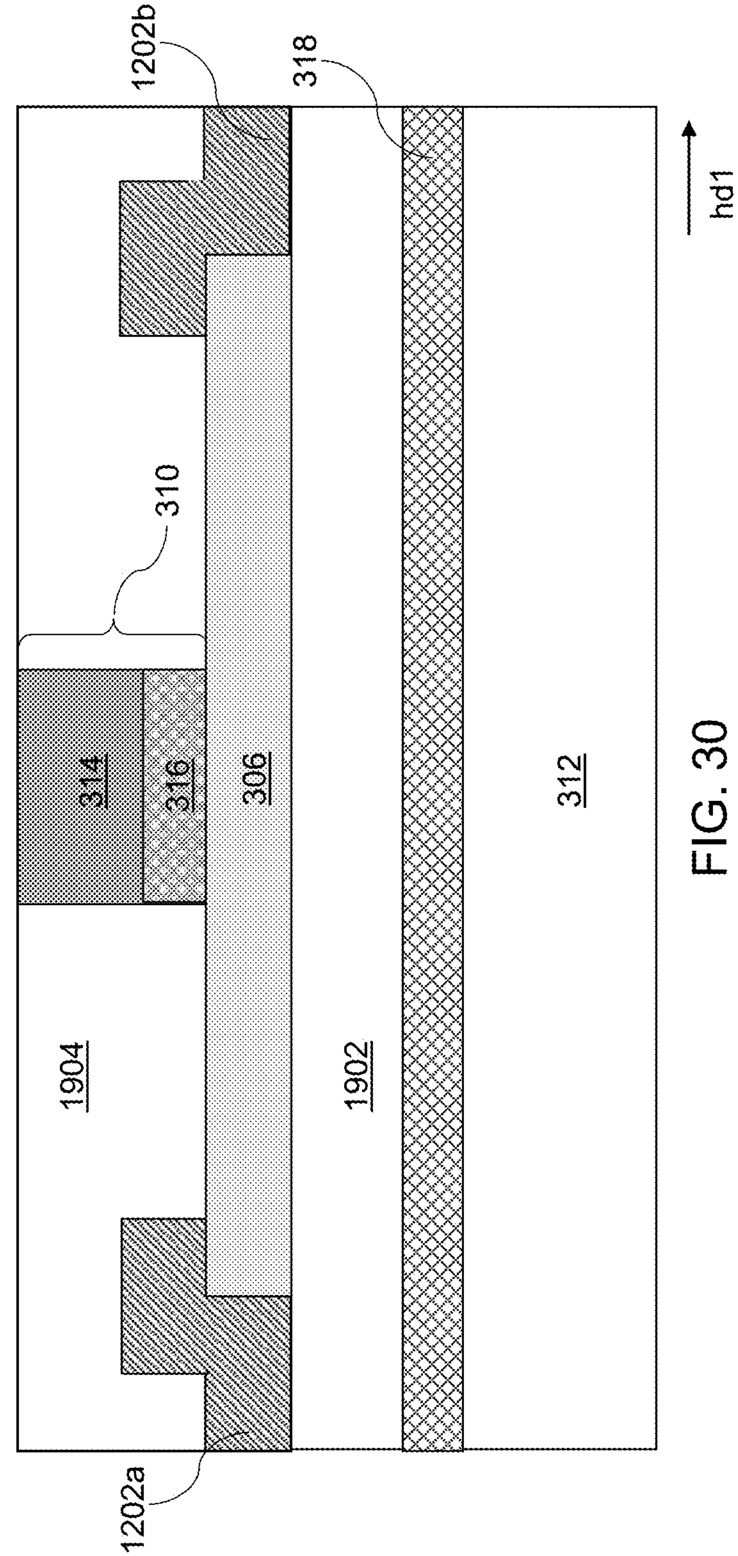
FIG. 30 is a vertical cross-sectional view of a PCM switch including a spreading layer including a spreading layer, according to various embodiments.

FIGS. 26 to 29 are vertical cross-sectional views of intermediate structures 2600 to 2900, respectively, which may be used in the formation of a further PCM switch 3000 including a heat spreader 318, as shown in FIG. 30, according to various embodiments. The PCM switch 2600 may be formed by reversing some of the processing steps that lead to the PCM switch 3000. In this regard, the heat spreader 318 may be first formed over the first switch dielectric material layer 312 as shown in FIG. 26. A second switch dielectric material layer 1902 may then be formed over the heat spreader 318 and a planarization process may be performed to generate a planar top surface of the second switch dielectric material layer 1902, as shown in FIG. 27.

As shown in FIG. 28, the phase change material element 306, the first electrode 1202*a*, and the second electrode 1202*b* may then be formed over the second switch dielectric material layer 1902 using processes similar to those described above with reference to FIGS. 15 to 17B. Referring to FIG. 29, a third switch dielectric material layer 1904 may then be deposited over the phase change material element 306, the first electrode 1202*a*, and the second electrode 1202*b*, and a planarization process may be performed to provide a planar surface over the top of the third switch dielectric material layer 1904. Referring to FIG. 30, the heater pad 314 and the capping layer 316, forming the heating element 310, may then be formed over the PCM element using processes similar to those described above with reference to FIGS. 11A to 14B. The resulting structure is the further embodiment PCM switch 3000, as shown in FIG. 30. The PCM switch 3000 is similar to the PCM switch 3000 described above with reference to FIG. 3B.

Figure 31:
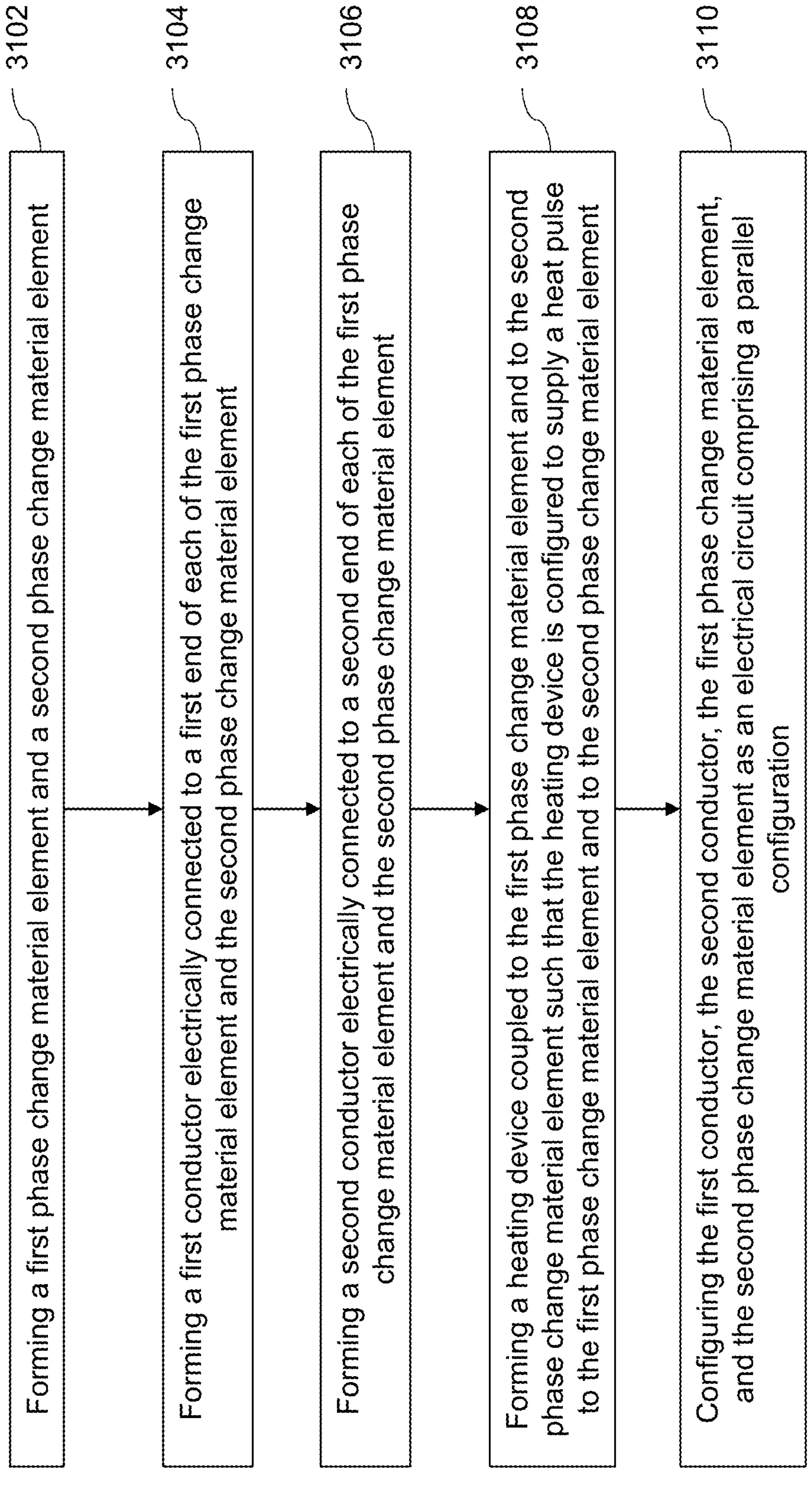
FIG. 31 is a flowchart illustrating operations of a method of forming a phase change material switch, according to various embodiments.

FIG. 31 is a flowchart illustrating operations of a method 3100 of forming a phase change material (PCM) switch (600, 800), according to various embodiments. In operation 3102, the method 3100 may include forming a first phase change material element 306*a* and a second phase change material element 306*b*. In operation 3104, the method 3100 may include forming a first conductor (e.g., first RF conductor 304*a*) electrically connected to a first end (a1, b1) of each of the first phase change material element 306*a* and the second phase change material element 306*b*. In operation 3106, the method 3100 may include forming a second conductor (e.g., second RF conductor 304*b*) electrically connected to a second end (a2, b2) of each of the first phase change material element 306*a* and the second phase change material element 306*b*. In operation 3108, the method 3100 may include forming a heating device (310*a*, 310*b*, 308*a*, 308*b*, 308*c*, 308*d*) coupled to the first phase change material element 306*a* and to the second phase change material element 306*b*. In some embodiments, the heating device (310*a*, 310*b*, 308*a*, 308*b*, 308*c*, 308*d*) may be configured to supply a heat pulse to the first phase change material element 306*a* and to the second phase change material element 306*b*. In operation 3110, the method 3100 may include configuring the first conductor 304*a*, the second conductor 304*b*, the first phase change material element 306*a*, and the second phase change material element 306*b* as an electrical circuit having a parallel configuration (e.g., see FIGS. 6B to 6D).

According to the method 3100, forming the first phase change material element 306*a* and the second phase change material element 306*b* may further include forming each of the first phase change material element 306*a* and the second phase change material element 306*b* to have a first resistance $R_{pcm}$ such that the electrical circuit having the parallel configuration has a second resistance $R_{ON}$ that is less than the first resistance (e.g., $R_{ON}=R_{pcm}/2$). The method 3100 may further include forming a third phase change material element 306*c*, electrically connecting the first conductor 304*a* to a first end c1 of the third phase change material element 306*c*, electrically connecting the second conductor 304*b* to a second end c2 of the third phase change material element 306*c*, and configuring the first conductor 304*a*, the second conductor 304*b*, the first phase change material element 306*a*, the second phase change material element 306*b*, and the third phase change material element 306*c* to form the electrical circuit having the parallel configuration (e.g., see FIGS. 8A to 8D).

The method 3100 may further include forming the third phase change material element 306*c* to have the first resistance $R_{pcm}$ such that the electrical circuit including the parallel configuration includes a third resistance $R_{ON}=R_{pcm}/3$ (e.g., see FIG. 8D) that is less than the first resistance $R_{pcm}$ and the second resistance $R_{ON}=R_{pcm}/2$ (e.g., see FIG. 6D). According to the method 3100, forming the heating device (310*a*, 310*b*, 308*a*, 308*b*, 308*c*, 308*d*) may further include forming a first heating element 310*a* in contact with the first phase change material element 306*a* and forming a second heating element 310*b* in contact with the second phase change material element 306*b*. The method 3100 may further include forming a first transistor 603*a* that is electrically connected to the first heating element 310*a*, forming a second transistor 603*b* that is electrically connected to the second heating element 310*b*, and configuring the first transistor 603*a* and the second transistor 603*b* to supply respective first and second electrical current pulses (708*a*, 708*b*) to the first heating element 310*a* and the second heating element 310*b*. In some embodiments, the first heating element 310*a* and the second heating element 310*b* respectively may provide a first heat pulse (G1 in 708*a* or 708*b*) to the first phase change material element 306*a* and a second heat pulse (G2 in 708*a* or 708*b*) to the second phase change material element 306*b*.

The method 3100 may further include forming two or more additional phase change material elements (e.g., see FIG. 9A), and electrically connecting the two or more additional phase change material elements to the first conductor 304*a* and the second conductor 304*b* such that the first conductor 304*a*, the second conductor 304*b*, the first phase change material element 306*a*, the second phase change material element 306*b*, and the two or more additional phase change material elements (e.g., see FIG. 9A) are configured as the electrical circuit including the parallel configuration.

Figure 32:
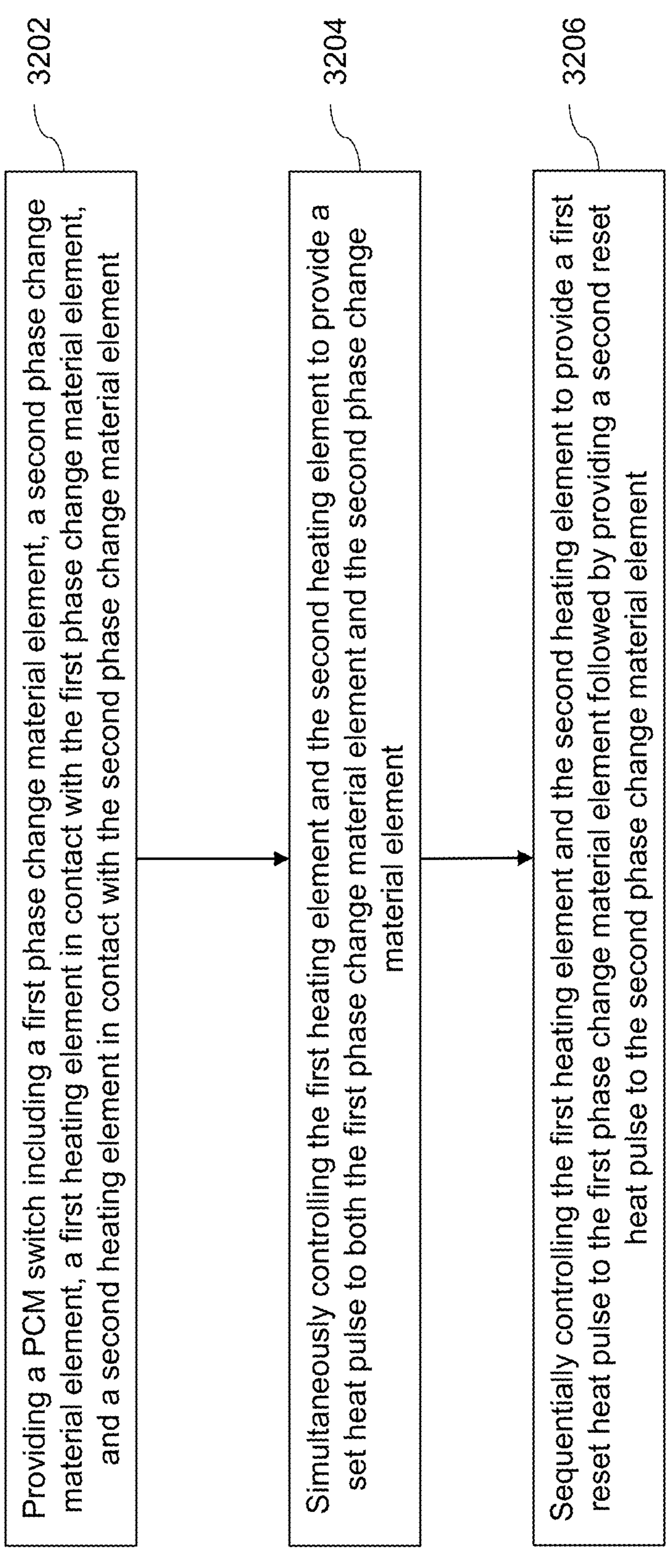
FIG. 32 is a flowchart illustrating operations of a method 3200 of controlling a phase change material switch, according to various embodiments.

FIG. 32 is a flowchart illustrating operations of a method 3200 of controlling a phase change material (PCM) switch (600, 800), according to various embodiments. In operation 3202, the method 3200 may include providing a PCM switch (600, 800) including a first phase change material element 306*a*, a second phase change material element 306*b*, a first heating element 310*a* in contact with the first phase change material element 306*a*, and a second heating element 310*b* in contact with the second phase change material element 306*b*. In operation 3204, the method 3200 may include simultaneously controlling the first heating element 310*a* and the second heating element 310*b* to provide a set heat pulse (see upper curve 708*b* in FIG. 7B) to both the first phase change material element 306*a* and the second phase change material element 306*b* to change each of the first phase change material element 306*a* and the second phase change material element 306*b* from a high resistivity state to a low resistivity state. In operation 3206, the method 3200 may include sequentially controlling the first heating element 310*a* and the second heating element 310*b* to provide a first reset heat pulse (G1 in lower curve 708*a* of FIG. 7B) to the first phase change material element 306*a* followed by providing a second reset heat pulse (G2 in curve 708*a* of FIG. 7B) to the second phase change material element 306*b* to change the each of the first phase change material element 306*a* and the second phase change material element 306*b* from the low resistivity state to the high resistivity state.

According to the method 3200, controlling the first heating element 310*a* and the second heating element 310*b* may further include providing a first electrical signal (708*a*, 708*b*) to a first gate G1 electrode of a first transistor 603*a* that is electrically connected to the first heating element 310*a* to provide a first electrical current $I_1$ to the first heating element 310*a*, and providing a second electrical signal (708*a*, 708*b*) to a second gate G2 electrode of a second transistor 603*b* that is electrically connected to the second heating element 310*b* to provide a second electrical current $I_2$ to the second heating element 310*b*.

According to the method 3200, providing the set heat pulse may further include simultaneously providing the first electrical current $I_1$ to the first heating element 310*a* and providing the second electrical current $I_2$ to the second heating element 310*b* for a first time duration that is less than 1.0 microsecond; and heating, based on the set heat pulse, each of the first phase change material element 306*a* and the second phase change material element 306*b* to a first temperature above a crystallization temperature but below a melting temperature. According to the method 3200, providing the first reset heat pulse may further include providing the first electrical current $I_1$ to the first heating element 310*a* for a second time duration that is less than 0.1 microsecond; and heating, based on the first reset heat pulse, the first phase change material element 306*a* to a second temperature above the melting temperature. According to the method 3200, providing the second reset heat pulse may further include: after providing the first electrical current $I_1$ to the first heating element 310*a*, providing the second electrical current $I_2$ to the second heating element 310*b* for a third time duration that is less than 0.1 microsecond; and heating, based on the second reset heat pulse, the second phase change material element 306*b* to the second temperature.

Referring to all drawings and according to various embodiments of the present disclosure, a phase change material (PCM) switch (600, 800) is provided. The PCM switch (600, 800) may include a first phase change material element 306*a*, a second phase change material element 306*b*, a first conductor (e.g., first RF conductor 304*a*) electrically connected to a first end (a1, b1) of each of the first phase change material element 306*a* and the second phase change material element 306*b* such that the first conductor 304*a* is configured as a first terminal of an electrical circuit including a parallel configuration (e.g., see FIGS. 6B, 6C, 8B, and 8C), a second conductor (e.g., second RF conductor 304*b*) electrically connected to a second end (a2, b2) of each of the first phase change material element 306*a* and the second phase change material element 306*b* such that the second conductor 304*b* is configured as a second terminal of the electrical circuit including the parallel configuration, and a heating device (310*a*, 310*b*, 308*a*, 308*b*, 308*c*, 308*d*) coupled to the first phase change material element 306*a* and to the second phase change material element 306*b*. In some embodiments, the heating device (310*a*, 310*b*, 308*a*, 308*b*, 308*c*, 308*d*) may be configured to supply a heat pulse (708*a*, 708*b*) to the first phase change material element 306*a* and to the second phase change material element 306*b*.

In one embodiment, the first phase change material element 306*a* and the second phase change material element 306*b* may each include a first resistance $R_{pcm}$ and the electrical circuit including the parallel configuration (e.g., see FIGS. 6B, 6C, 8B, 8C) may include a second resistance $R_{ON}$ that is less than the first resistance $R_{pcm}$. In one embodiment, the second resistance $R_{ON}=R_{pcm}/2$ may be approximately half the first resistance $R_{pcm}$ (e.g., see FIG. 6D). The PCM switch (600, 800) may further include a third phase change material element 306*c*. In one embodiment, the first conductor 304*a* may be electrically connected to a first end c1 of the third phase change material element 306*c* and the second conductor 304*b* may be electrically connected to a second end c2 of the third phase change material element 306*c* such that the first conductor 304*a*, the second conductor 304*b*, the first phase change material element 306*a*, the second phase change material element 306*b*, and the third phase change material element 306*c* are configured as the electrical circuit including the parallel configuration (e.g., see FIGS. 8B and 8C). In one embodiment, the third phase change material element 306*c* may have the first resistance $R_{pcm}$ and the electrical circuit including the parallel configuration may include a third resistance $R_{ON}$ that is less than the first resistance $R_{pcm}$ and the second resistance $R_{ON}=R_{pcm}/2$. For example, the third resistance may be approximately one third of the first resistance $R_{ON}=R_{pcm}/3$.

In one embodiment, the heating device (310*a*, 310*b*, 308*a*, 308*b*, 308*c*, 308*d*) may further include a first heating element 310*a* in contact with the first phase change material element 306*a* and a second heating element 310*b* in contact with the second phase change material element 306*b*. The PCM switch (600, 800) may further include a first transistor 603*a* electrically connected to the first heating element 310*a* and a second transistor 603*b* electrically connected to the second heating element 310*b*. In one embodiment, each of the first transistor 603*a* and the second transistor 603*b* may be configured to supply respective first and second electrical current pulses (708*a*, 708*b*) to the first heating element 310*a* and the second heating element 310*b* such that the first heating element 310*a* and the second heating element 310*b* respectively provide a first heat pulse to the first phase change material element 306*a* and a second heat pulse to the second phase change material element 306*b*.

In one embodiment, the PCM switch (600, 800) may further include two or more additional phase change material elements (see FIG. 9A) electrically connected to the first conductor 304*a* and the second conductor 304*b* such that the first conductor 304*a*, the second conductor 304*b*, the first phase change material element 306*a*, the second phase change material element 306*b*, and the two or more additional phase change material elements (see FIG. 9A) are configured as the electrical circuit including the parallel configuration (e.g., see FIG. 9B). In one embodiment, the heating device (310*a*, 310*b*, 308*a*, 308*b*, 308*c*, 308*d*) may further include two or more additional heating elements respectively (see FIG. 9C) connected to the two or more additional phase change material elements (see FIG. 9*a*). In an embodiment, the two or more additional heating elements may be configured to provide respective heat pulses to the two or more additional phase change material elements.

Various disclosed embodiments may provide advantages by providing PCM switches that may include two or more phase change material elements formed in a parallel circuit configuration. The parallel configuration provides a reduced resistance that gives rise to a reduced insertion loss and increased figure of merit relative to PCM switches having only a single phase change material element. Embodiment PCM switches may further include a heating device that may include separate heating elements for respective separate phase change material elements. The separate heating elements may be individually and independently switched. In certain switching operations, it may be advantageous to perform sequential switching operations to reduce a peak switching power provided by the heating device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a phase change material (PCM) switch, comprising:

forming a first phase change material element;

forming a second phase change material element;

forming a first conductor electrically connected to a first end of each of the first phase change material element and the second phase change material element;

forming a second conductor electrically connected to a second end of each of the first phase change material element and the second phase change material element;

forming a heating device coupled to the first phase change material element and to the second phase change material element, wherein forming the heating device comprises forming a first heating element electrically connected to a first heater pad and a second heater pad; and configuring the first conductor, the second conductor, the first phase change material element, and the second phase change material element as an electrical circuit comprising a parallel configuration.

2. The method of claim 1, wherein forming the first phase change material element and the second phase change material element further comprises:

forming each of the first phase change material element and the second phase change material element to have a first resistance such that the electrical circuit comprising the parallel configuration has a second resistance that is less than the first resistance.

3. The method of claim 2, further comprising:

forming a third phase change material element;

electrically connecting the first conductor to a first end of the third phase change material element;

electrically connecting the second conductor to a second end of the third phase change material element; and configuring the first conductor, the second conductor, the first phase change material element, the second phase change material element, and the third phase change material element to form the electrical circuit comprising the parallel configuration.

4. The method of claim 3, further comprising:

forming the third phase change material element to have the first resistance such that the electrical circuit comprising the parallel configuration comprises a third resistance that is less than the first resistance and the second resistance.

5. The method of claim 1, wherein forming the heating device further comprises:

forming the first heating element in contact with the first phase change material element; and forming a second heating element in contact with the second phase change material element.

6. The method of claim 5, further comprising:

forming a first transistor that is electrically connected to the first heating element;

forming a second transistor that is electrically connected to the second heating element; and configuring the first transistor and the second transistor to supply respective first and second electrical current pulses to the first heating element and the second heating element.

7. The method of claim 1, further comprising:

forming two or more additional phase change material elements; and electrically connecting the two or more additional phase change material elements to the first conductor and the second conductor such that the first conductor, the second conductor, the first phase change material element, the second phase change material element, and the two or more additional phase change material elements are configured as the electrical circuit comprising the parallel configuration.

8. A method of forming a phase change material (PCM) switch, comprising:

forming a first phase change material element and a second phase change material element over a substrate;

forming a first conductor electrically connected to a first end of the first phase change material element and to a first end of the second phase change material element;

forming a second conductor electrically connected to a second end of the first phase change material element and to a second end of the second phase change material element, wherein the first conductor, the second conductor, the first phase change material element, and the second phase change material element form an electrical circuit in a parallel configuration;

forming a first heating element in thermal contact with the first phase change material element; and forming a second heating element, separate from the first heating element, in thermal contact with the second phase change material element, wherein the first heating element and second heating element are separately and independently controllable.

9. The method of claim 8, further comprising:

forming a first transistor electrically connected to the first heating element; and forming a second transistor electrically connected to the second heating element.

10. The method of claim 8, wherein forming the first heating element comprises forming a first resistive heater pad and a first thermally conductive dielectric capping layer between the first resistive heater pad and the first phase change material element, and forming the second heating element comprises forming a second resistive heater pad and a second thermally conductive dielectric capping layer between the second resistive heater pad and the second phase change material element.

11. The method of claim 10, wherein the first and second thermally conductive dielectric capping layers are laterally confined such that sidewalls of each capping layer are substantially aligned with sidewalls of its respective resistive heater pad.

12. The method of claim 8, further comprising forming a heat spreader layer in thermal contact with at least one of the first phase change material element or the second phase change material element.

13. The method of claim 8, further comprising forming the first and second phase change material elements to have substantially equal resistances in a crystalline state, such that a combined on-state resistance of the parallel configuration is approximately half the resistance of one of the phase change material elements.

14. A method of forming a phase change material (PCM) switch, comprising:

forming a heating element over a substrate;

forming a first switch dielectric material layer over the heating element;

forming a phase change material element over the first switch dielectric material layer;

forming a first electrode and a second electrode over the phase change material element, wherein the first electrode contacts a first end of the phase change material element and the second electrode contacts a second end of the phase change material element; and forming a heat spreader over the phase change material element on an opposite side of the phase change material element from the heating element.

15. The method of claim 14, further comprising forming a dielectric capping layer between the heating element and the phase change material element.

16. The method of claim 15, wherein the dielectric capping layer comprises an electrical insulator having a thermal conductivity greater than 100 W/mK.

17. The method of claim 14, wherein the heat spreader comprises copper or silicon carbide.

18. The method of claim 14, wherein the heat spreader is electrically isolated from the heating element and the phase change material element.

19. The method of claim 14, further comprising forming a second switch dielectric material layer over the phase change material element, wherein the heat spreader is formed over the second switch dielectric material layer.

20. The method of claim 14, wherein the heating element has a localized spatial extent relative to the phase change material element such that heat is applied to the phase change material element in a localized distribution.

* * * * *